(12) United States Patent
Aldroubi et al.

(10) Patent No.: US 7,496,619 B2
(45) Date of Patent: Feb. 24, 2009

(54) SYSTEM AND METHODS OF NONUNIFORM DATA SAMPLING AND DATA RECONSTRUCTION IN SHIFT INVARIANT AND WAVELET SPACES

(75) Inventors: Akram Aldroubi, Nashville, TN (US); Karlheinz Gröchenig, Nashville, TN (US); Hans G. Feichtinger, Mistelbach (AT)

(73) Assignee: Vanderbilt University, Nashville, TN (US)

( * ) Notice: Subject to any disclaimer, the term of this patent is extended or adjusted under 35 U.S.C. 154(b) by 1295 days.

(21) Appl. No.: 10/458,475

(22) Filed: Jun. 10, 2003

(65) Prior Publication Data

US 2004/0044715 A1  Mar. 4, 2004

Related U.S. Application Data

(60) Provisional application No. 60/389,852, filed on Jun. 18, 2002.

(51) Int. Cl.
*G06F 7/38* (2006.01)
(52) U.S. Cl. ..................................... 708/446
(58) Field of Classification Search .................. 708/446
See application file for complete search history.

(56) References Cited

U.S. PATENT DOCUMENTS 6,052,427 A * 4/2000 Pan ............................. 378/4
6,188,964 B1   2/2001 Reister et al. ................. 702/17
6,477,553 B1 * 11/2002 Druck ......................... 708/313
7,076,091 B2 * 7/2006 Rosenfeld .................... 382/131

OTHER PUBLICATIONS

A. Aldroubi, *Non-Uniform Weighted Average Sampling and Exact Reconstruction in Shift-Invariant Spaces*, preprint, 2001.
A. Aldroubi, *Portaits of frames*, Proc. Amer. Math. Soc., 123 (1995), pp. 1661-1668.
A. Aldroubi and H. Feightinger. *Exact iterative reconstruction algorithm for multivariate irregularly sampled functions in spine-like spaces*: The $L_\sim$ theory, Proc. Amer. Math. Soc., 126 (1998), pp. 2677-2686.

(Continued)

*Primary Examiner*—Tan V Mai
(74) *Attorney, Agent, or Firm*—Morris Manning Martin LLP; Tim Tingkang Xia, Esq.

(57) ABSTRACT

A system and methods for converting data for an object of interest, which is characterized by a function $f$, between a digital form and an analog form. In one embodiment, the method includes the steps of locally selecting a plurality of data sample points in the order of N, N being an integer, wherein the data sample points are in a first form of data type, performing a transformation in a shift invariant space to the locally selected data sample points to obtain a new data set that is in a second form of data type different from the first form of data type, and reconstructing the object of interest $f$ from the new data set. In one embodiment, the first form of data type is one of the the digital form and the analog form, and the second form of data type is one of the digital form and the analog form that is different from the first form of data type. In other words, the first form of data type can be in digital form, and the corresponding second form of data type is in analog form, and vice versa.

114 Claims, 12 Drawing Sheets

OTHER PUBLICATIONS

A. Aldroubi and K. Gröchenig, *Beurling-Landau-type theorems for non-uniform sampling in shift-invariant spaces*, J. Fourier Anal. Appl., 6 (2001), pp. 91-101.

A. Aldroubi. Q. Sun and W.S. Tang, *Non-uniform average sampling and reconstruction in multiply generated shift-invariant spaces*, J. Fourier Anal. Appl., 7 (2001), pp. 1-19.

A. Aldroubi and M. Unser, *Families of multiresolution and wavelet spaces with optimal properties*, Numer. Funct. Anal. Optim., 14 (1993), pp. 417-446.

A. Aldroubi and M. Unser, *Sampling procedure in function spaces and asymptotic equivalence with Shannon's sampling theory*, Numer. Funct. Anal. Optim., 15 (1994), pp. 1-21.

A. Aldroubi. M. Unser and M. Eden, *Cardinal spline filters: Stability and convergence to the ideal sinc interpolator*, Signal Processing, 28 (1992), pp. 127-138.

A. Aldroubi and K. Grochenig, *Beurling-Landau-type theorems for non-uniform sampling in shift invariant spline spaces*, J. Fourier Anal. Appl. 6(2000), pp. 93-103.

R. Balan, *Equivalence relations and distances between Hilbert frames*, Proc. Amer. Math. Soc., 127 (1999), pp. 2353-2366.

E. Bellers and G. De Haan, *New algorithms for motion estimation on interlaced video*, in Proc. SPIE-Visual Communication and Image Processing, 3309 (1998), pp. 111-121.

J.J. Benedetto and P.J.S.G. Ferrerira, *Modern Sampling Theory*, Birkhäuster, Boston, 2000, pp. 1-28.

J.J. Benedetto, C. Heil. and D.F. Walnut, *Gabor systems and the Balian-Law theorem*, in Gabor Analysis and Algorithms, H.G Feichtinger and T. Strohmer, eds., Birkhäuser, Boston, 1998, pp. 85-122.

J.J. Benedetto and S. Li, *The theory of multiresolution frames and applications to filter banks*, Appl. Comput. Harmon. Anal., 5 (1998), pp. 389-427.

J.J. Benedetto and H.-C. Wu, *Non-uniform sampling and spiral MRI reconstruction*, in Proc. SPIE—Wavelet Applications in Signal and Image Processing VIII, 4119 (2000), pp. 130-141.

A. Beurling and P. Malliavin, *On the closure of characters and the zeros of entire functions*, Acta Math., 118 (1967), pp. 79-93.

T. Blu and M. Unser, *Quantitative Fourier analysis of approximation techniques: Part 1—interpolators and projectors*, IEEE Trans. Signal Process., 47 (1999), pp. 2783-2795.

M.D. Buhmann, *Radial basis functions*, Acta numerica, (2000) Cambridge Univ. Press, Cambridge, pp. 1-38.

P.G. Casazza and O. Christensen, *Frames containing a Riesx basis and preservation of this property under pertubations*, SIAM J. Math. Anal., 29 (1998), pp. 266-278.

P. Casazza, D. Han and D. Larson, *Frames for Banach spaces*, In the Functional and Harmonic Analysis of Wavelets and Frames, Contemp. Math. 247, AMS, Providence, RI, 1999, pp. 149-182.

W. Chen, S. Itoh and J. Shiki, *Irregular sampling theorems for wavelet subspaces*, IEEE Trans. Inform. Theory, 44 (1998), pp. 1131-1142.

O. Christensen, *Moment problems for frames and applications to irregular sampling and Gabor frames*, Appl. Comput. Harmon. Anal., 3 (1996), pp. 82-86.

P. Craven and Grace Wahba, *Smoothing noisy data with spline functions. Estimating the correct degree of smoothing by the method of generalized cross-validation*, Numer. Math. 31, (1978/79), pp. 377-403.

C. De Boor, R. DeVore and A. Ron, *The structure of finitely generated shift-invariant spaces $L_2(R^d)$*, J. Funct. Anal., 119 (1994), pp. 37-78.

C. De Boor, R. DeVore, *Partition of unity and approximation*, Proc. Amer. Math. Soc., 93 (1985), pp. 705-709.

R.A. DeVore, B. Jawerth and B.J. Lucier, *Image compression through wavelet transform coding*, IEEE Trans. Inform. Theory, 38 (1992), pp. 719-746.

S. Demko, W.F. Moss and P.W. Smith, *Decay rates for inverses of band matrices*, Math. Comp. 43 (1984), pp. 491-499.

I. Djokovic and P.P. Vaidyanathan, *Generalized sampling theorems in multiresolution subspaces*, IEEE Trans. Signal Process., 45 (1997), pp. 583-599.

Y. Domar, *Harmonic analysis based on certain commutative Banach algebras*, Acta Math., 96 (1956), pp. 1-66.

C.C. Donovan, J.S. Geronimo and D.P. Hardin, *Intertwining multiresolution analyses and the construction of piecewise-polynomial wavelets*, SIAM J. Math. Anal., 27 (1996), pp. 1791-1815.

R.J. Duffin and A.C. Schaeffer, *A class of nonharmonic Fourier series*, Trans. Amer. Math. Soc., 72 (1952), pp. 341-366.

H.G. Feichtinger, *Banach convolution algebras of Wiener type*, in Functions, Series, Operators, vols. I, II (Budapest, 1980), North-Holland, Amsterdam, 1983, pp. 509-524.

H.G. Feichtinger, *Generalized amalgams, with applications to Fourier transform*, Canad. J. Math., 42 (1990), pp. 395-409.

H.G. Feichtinger, *New results on regular and irregular sampling based on Wiener amalgams*, in Proc. Conf. Function Spaces, K. Jarosz, ed., Lecture Notes in Math. 136, Springer-Verlag, New York, 1991, pp. 107-121.

H.G. Feichtinger, *Wiener amalgams over Euclidean spaces and some of their applications*, in Proc. Conf. Function Spaces. K. Jarosz, ed., Lecture Notes in Math. 136, Springer-Verlag, New York, 1991, pp. 123-137.

H.G. Feichtinger and K. Gröchenig, *Banach spaces related to integrable group representations and their atomic decompostions*, I, J. Funct. Anal., 86 (1989), pp. 307-340.

H.G. Frichtinger and K. Gröchenig, *Iterative reconstruction of multivariate band-limited functions from irregular sampling values*, Siam J. Math. Anal., 23 (1992), pp. 244-261.

H.G. Feichtinger and K. Gröchenig, *Theory and practice of irregular sampling*, in Wavelets-Mathematics and Applications. J.J. Benedetto and W. Frazier, eds., CRC, Boca Raton, FL, 1993, pp. 305-363.

H.G. Feichtinger and K. Gröchenig, and T. Strohmer, *Efficient numerical methods in non-uniform sampling theory*, Numer. Math., 69(1995), pp. 423-440.

S.S. Goh and I.G.H. Ong, *Reconstruction of bandlimited signals from irregular samples*, Signal Process., 46(1995), pp. 315-329.

T.N.T. Goodman, S.L. Lee and W.S. Tang, *Wavelet wandering subspaces*, Trans. Amer. Math. Soc., 338 (1993), pp. 639-654.

K. Gröchenig, *Reconstruction algorithms in irregular sampling*, Math. Comp., 59 (1992), pp. 181-194.

K. Gröchenig, *Acceleration of the frame algorithm*, IEEE Trans. Signal Process., Special Issue on Wavelets and Signal Processing, 41 (1993), pp. 3331-3340.

K. Gröchenig and H. Razafinjatovo, *On Landau's necessary density conditions for sampling and interpolation of band-limited functions*, J. London Math. Soc., 54 (1996), pp. 557-565.

K. Gröchenig and T. Strohmer, *Numerical and theoretical aspects of non-uniform sampling of band-limited images*, in Theory and Practice of Nonuniform Sampling, F. Marvasti, ed., Kluwer/Plenum, New York. 2001, in press.

C.E. Heil and D.F. Walnut, *Continuous and discrete wavelet transforms*, SIAM Rev., 31 (1989), pp. 628-666.

J.R. Higgins, *Five short stories about the cardinal series*, Bull. Amer. Math. Soc., 12 (1985), pp. 45-89.

H.S. Hou and H.C. Andrews, *Cubic splines for image interpolation and digital filtering*, IEEE Trans. Acoust. Speech Signal Process., 26 (1978), pp. 508-517.

A.J.E.M. Janssen, *The Zak transform and sampling theorems for wavelet subspaces*, IEEE Trans. Signal Process., 41 (1993), pp. 3360-3364.

A. Jerri, *The Shannon sampling theorem-its various extensions and applications: A tutorial review*, Proc. IEEE, 65 (1977), pp. 1565-1596.

R.-Q. Jia, *Shift-invariant spaces and linear operator equations*, Israel Math. J., 103 (1998), pp. 259-288.

R.-Q. Jia, *Stability of the shifts of a finite number of functions*, J. Approx. Theory, 95 (1998), pp. 194-202.

R.-Q. Jia and C.A. Micchelli, *On linear independence for integer translates of a finite number of functions*, Proc. Edinburgh Math. Soc., 36 (1992), pp. 69-85.

P. Jorgensen, *A geometric approach to the cascade approximation operator for wavelets*, Integral Equations Operator Theory, 35 (1999), pp. 125-171.

H. Landau, *A sparse regular sequence of exponentials closed on large sets*, Bull. Amer. Math. Soc., 70(1964), pp. 566-569.

H. Landau, *Necessary density conditions for sampling and interpolation of certain entire functions*, Acta Math., 117(1967), pp. 37-52.

S. Li, *Iterative Irregular Sampling and Useful Irregular Sampling Conditions*, preprint, no dated.

Y. Liu, *Irregular sampling for spline wavelet subspaces*, IEEE Trans. Inform. Theory, 42 (1996), pp. 623-627.

Y. Lyubarskil and W.R. Madych, *The recovery of irregularly sampled band limited functions via tempered splines*, J. Funct. Anal., 125 (1994), pp. 201-222.

Y. Lyubarskil and K. Seip, *Convergence and summability of Gabor expansions at the Nyqyuist density*, J. Fourier Anal. Appl., 5 (1999), pp. 127-157.

S. Mallat, *Multiresolution approximations and wavelet orthonormal bases of $L^2(R)$*, Trans. Amer. Math. Soc., 315 (1989), pp. 69-97.

S. Mallat, *A theory for multiresolution signal decomposition: The wavelet representation*, IEEE Trans. PAMI, II (1989), pp. 674-693.

J.P. Oakley, M. J. Cunningham and G. Little, *A Fourier-domain formula for the least squares projection of a function onto a repetitive basis in N-dimensional space*, IEEE Trans. Acoust. Speech Signal Process., 38 (1990), pp. 114-120.

J.L. Ostuni, A.K.S. Santhaand, V.S. Mattay, D.R. Weinberger, R.L. Levin and J.A. Frank, *Analysis of interpolation effects in the reslicing of functional MR-Images*, J. Computer Assisted Tomography, 21 (1997), pp. 803-810.

D. Potts and C. Steidl, *New Fourier reconstruction algorithms for computerized tomography*, in Proc. Wavelet Applications in Signal and Image Processing VIII, 4199 (2000), pp. 13-23.

M. Rauth and T. Strohmer, *Smooth approximation of potential fields from noisy scattered data*, Geophysics, 63 (1998), pp. 85-94.

K. Seip, *An irregular sampling theorem for functions bandlimited in a generalized sense*, SIAM J. Appl. Math., 47 (1987), pp. 1112-1116.

K. Seip, *On the connection between exponential bases and certain related sequences in $L^2(-n,n)$*, J. Funct. Anal., 130 (1995), pp. 131-160.

I.W. Selesnick, *Multiwavelet Bases with Extra Approximation Properties*, IEEE Trans. Signal Process., 46 (1999), pp. 2898-2908.

C.E. Shannon, *Communications in the presence of noise*, Proc. IRE, 37 (1949), pp. 10-21.

G. Strang, *Wavelets and dilation equations: A brief introduction*, SIAM Rev., 31 (1989), pp. 614-627.

T. Strohmer, *Numerical analysis of the non-uniform sampling problem*, J. Comput. Appl. Math., 122 (2000), pp. 297-316.

W. Sun and X. Zhou, *On the stability of multivariate trigonometric systems*, J. Math. Anal. Appl., 235 (1999), pp. 159-167.

P. Thévenaz, T. Blu, and M. Unser, *Image interpolation and resampling*, in Handbook of Medical Image Processing, Processing and Analysis, I.N. Bankman, ed., Academic Press, San Diego, CA. 2000, pp. 393-420.

C. Thomas, *A comparison of motion-compensated interlace-to-progressive conversion methods*, Image Communication, 12 (1998), pp. 209-229.

M. Unser and A. Aldroubi, *A general sampling theory for non-ideal acquisition devices*, IEEE Trans. Signal Process., 42(1994), pp. 2915-2925.

M. Unser and J. Zerubia, *A generalized sampling theory without bandlimiting constraints*, Trans. Circuits and Systems-II: Analog and Digital Signal Processing, 45 (1998), pp. 959-969.

R. Vio, T. Strohmer, and W. Wamsteker. *On the reconstruction of irregularly sampled time series*. Publ. Astronom. Soc. Pac., 112 (2000), pp. 74-90.

G.G. Walter, *A sampling theorem for wavelet subspaces*, IEEE Trans. Inform. Theory, 38 (1992), pp. 881-884.

X.G. Xia, J.S. Ceronimo, D.P. Hardin and B.W. Sutter, *Design of prefilters for discrete multiwavelet transforms*, IEEE Trans. Signal Process., 44 (1996), pp. 25-35.

X.G. Xia and Z.Z. Zhang, *On sampling theorem, wavelets, and wavelet transforms*, IEEE Trans. Signal Process., 41(1993), pp. 3524-3535.

K. Yao, *Applications of reproducing kernel Hilbert spaces-bandlimited signal models*, Inform. and Control, 11 (1967), pp. 429-444.

X. Zhou and W. Sun, *On the sampling theorem for wavelet subspaces*, J. Fourier Anal. Appl., 5 (1999), pp. 347-354.

A. Aldroubi and K. Gröchenig, Nonuniform Sampling and Reconstruction in Shift-Invariant Spaces, SIAM Review, 2001, 43(4), 585-620.

A. Aldroubi and Peter Basser, Reconstruction of vector and tensor fields from sampled discrete data, Contemporary Mathematics, 1999, 247, 1-15.

M. Unser, Enlargment or reductin of digital images with minimum loss of information, IEEE Trans. Image Processing, 1995, 4, 247-258.

Capturing digital information may be about to become more accurate, The Economist, Jan. 19, 2002, pp. 68.

Digital tunes, images may benefit from new mathematical theory, The Vanderbilt Register, Jan. 7-13, 2002, pp. 6.

New theory enables super-enhanced digital media (http://www.newsfactor.com/perl/story/15716.html), no dated.

More accurate digital tunes, images may result from new mathematical theory (http://exploration.vanderbilt.edu/news/news_aldroubi.htm), no dated.

K. Gröchenig and H. Schwab, Fast local reconstruction methods for nonuniform sampling in shift invariant spaces, pp. 1-7, no dated.

A. Aldroubi, *Oblique projections in atomic spaces*, Proc. Amer. Math. Soc., 124 (1996), pp. 2051-2060.

A. Aldroubi and M. Unser. *Families of wavelet transforms in connection with Shannon's sampling theory and the Gabor transform, in Wavelets*: A Tutorial in Theory and Applications, C.K. Chul. ed., Academic Press. San Diego, CA, 1992, pp. 509-528.

A. Aldroubi. M. Unser and M. Eden, *Asymptotic properties of least square spline filters and application to multi-scale decomposition of signals*, in Proceedings of the International Conference on Information Theory and Its Applications, Waikiki, Hawaii, 1990, pp. 271-274.

J.J. Benedetto, *Irregular sampling and frames*, in Wavelets: A Tutorial in Theory and Applications. C.K. Chui, ed., Academic Press. San Diego, CA, 1992, pp. 445-507.

J.J. Benedetto, *Frame decompositions, sampling, and uncertainty principle inequalities*, in Wavelets-Mathematics and Applications, J.J. Benedetto and M.W. Frazier, eds., CRC, Boca Raton, FL, 1993, pp. 247-304.

J.J. Benedetto and M.W. Frazier. ED., *Wavelets-Mathematics and Applications*, CRC, Boca Raton, FL, 1993.

J.J. Benedetto and D. Walnut, *Gabor frames of $L^2$ and related spaces*, in Wavelets—Mathematics and Applications, J.J. Benedetto and MW. Frazier, eds., CRC, Boca Raton, FL, 1993, pp. 247-304.

C.A. Bernstein and E.V. Patrick, *Exact deconvolution for multiple convolution operators-an overview, plus performance characterizations for imaging sensors*, in Proceedings in Multidimensional Signal Processing, IEEE, Piscataway, NJ, 1990, pp. 723-734.

A. Beurling, *The Collected Works of Arne Beurling. vol. 1, Complex Analysis*, L. Carleson, P. Malliavin, J. Neuberger, and J. Wermer, eds., Birkhäuser, Boston, 1989.

A. Beurling, *The Collected Works of Arne Beurling. vol. 2, Harmonic Analysis*, L. Carleson, P. Malliavin, J. Neuberger, and J. Wermer, eds., Birkhäuser, Boston, 1989.

P.L. Butzer, *A survey of the Whittaker-Shannon sampling theorem and some of its extensions*, J. Math. Res. Exposition, 3 (1983), pp. 185-212.

C.K. Chui, ed., *Wavelets: A Tutorial in Theory and Applications*, Academic Press, San Diego, CA, 1992.

I. Daubeghies, *Ten Lectures on Wavelets*, SIAM, Philadelphia, 1992.

H.G. Feichtinger, *Gewichtsfunktionen auf lokalkompakten Gruppen*, Sitzber. d. Österr. Akad. Wiss., 188 (1979), pp. 451-471.

H.G. Feichtinger and T. Strohmer. eds., *Gabor Analysis and Algorithms*, Birkhäuser, Boston, 1998.

G.H. Golub and C.F. Van Loan, *Matrix computations*, third ed., Johns Hopkins University Press, Baltimore, MD (1996).

T.N.T. Goodman, S.L. Lee and W.S. Tang, *Wavelet bases for a set of commuting unitary operators*, Adv. Comput. Math.. 1 (1993), pp. 109-126.

K. Gröchenig, *Describing functions: Atomic decompositions versus frames*, Monatsh. Math., 112 (1991), pp. 1-42.

K. Gröchenig, *Invertibility of the Frame Operator and Banach Frames*, preprint, 2001.

J.R. Higgins, *Sampling theory for Paley-Wiener spaces in the Riesz basis settings*, Proc. Roy. Irish Acad. Sect., 2 (1994), pp. 219-235.

M.F. Hutchinson and F.R. de Hoog, *Smoothing noisy data with spline functions*, Numer. Math., 47 (1985), pp. 99-106.

S. Jaffard, *Propriétés des matrices "bien localisées" près de leur diagonale et quelques applications*, Ann. Inst. H. Poincaré Anal. Non Liéaire, 7, (1990), pp. 461-476.

K. Jetter and J. Stöckler, *Topics in scattered data interpolation and non-uniform sampling*, in Surface Fitting and Multiresolution Methods, A. Le Mehautee, C. Rabut, and L. L. Schumaker, eds., Vanderbilt University Press, Nashville, TN, 1997, pp. 191-207.

M.I. Kadeg, *The exact value of the Paley-Wiener constant*, Soviet Math. Dokl., 5 (1964), pp. 559-561.

H.P. Kramer, *A generalized sampling theorem*, J. Math. Phys., 38 (1959), pp. 68-72.

Y. Liu and G.G. Walter, *Irregular sampling in wavelet subs paces*, J. Fourier Anal. Appl., 2 (1996), pp. 181-189.

S. Mallat, *A Wavelet Tour*, Academic Press, New York, 1996.

Y. Meyer, *Ondelettes et Opérateurs*, Hermann, Paris, France, 1990.

M.Z. Nashed and G. G. Walter, *Generalized sampling theorems for functions in reproducing kernel Hilbert spaces*, Math. Control Signals Systems, 4 (1991), pp. 363-390.

R.E.A.C. Paley and N. Wiener, *Fourier transform in the complex domain*, in Amer. Math. Soc. Colloq. Publ., AMS, Providence, RI, 1934.

A. Papoulis, *Generalized sampling expansions*, Circuits Systems, 24 (1977), pp. 652-654.

B.S. Pavlov, *The basis property of a system of exponential.s and the condition of Muckenhoupt*, Dokl. Akad. Nauk SSSR, 247 (1979), pp. 37-49.

H. Reiter, *Classical Harmonic Analysis and Locally Compact Groups*, Oxford Univ. Press, Oxford, UK, 1968.

L.L. Schumaker, *Spline functions: basic theory*, John Wiley & Sons Inc., New York, 1981, Pure and Applied Mathematics, A Wiley-Interscience Publication.

J. Stöckler, *Multivariate Affine Frames*, Shaker Verlag, Aachen, Germany, 1998.

G. Strang, *The finite element method and approximation theory*, in Proc. Sympos. Numerical Solution of Partial Differential Equations, Academic Press, New York, 11(1971), pp. 547-583.

G. Strang and T. Nguyen, *Wavelets and Filter Banks*, Wellesley-Cambridge Press, Wellesley, MA, 1996.

M. Unser and A. Aldroubi, *Polynomial splines and wavelets-a signal processing perspective*, in Wavelets: A Tutorial in Theory and Applications, C.K. Chui, ed., Academic Press, San Diego, CA, 1992, pp. 543-601.

M. Unser and A. Aldroubi, *Cenerasized sampling with application to the wavelet transform*, In Proceedings of the Conference on Information Sciences and Systems, The John Hopkins University Press, Baltimore, MD, 1993.

M. Unser, A. Aldroubi and M. Eden, *A sampling theory for polynomial splines*, in Proceedings of the International Conference on Information Theory and Its Applications, Waikiki, Hawaii, 1990, pp. 279-282.

M. Unser, A. Aldroubi, and M. Eden, *Polynomial spline signal approximations: Filter design and asymptotic equivalence with Shannon's sampling theorem*, IEEE Trans. Image Process., 38(1992), pp. 95-103.

G. Wahba, *Spline models for observational data*, Society for Industrial and Applied Mathematics SIAM, Philadelphia, PA (1990).

D. Walnut, *Nonperiodic sampling of bandlimited functions on union of rectangular*, J. Fourier Anal. Appl., 2 (1996), pp. 436-451.

J.M. Whittaker, *Interpolatory Function Theory*, Cambridge University Press, London, 1935.

R.M. Young, *An Introduction to Nonharmonic Fourier Series*, Academic Press, New York, 1980.

\* cited by examiner

Original digital image          Digital image with missing data 301        303

401   402       403   404

SYSTEM AND METHODS OF NONUNIFORM DATA SAMPLING AND DATA RECONSTRUCTION IN SHIFT INVARIANT AND WAVELET SPACES

CROSS-REFERENCE TO RELATED APPLICATION

This application claims priority to U.S. Provisional Application Ser. No. 60/389,852, which was filed on Jun. 18, 2002, in the United States Patent and Trademark Office, and is hereby incorporated herein by reference in its entirety.

The present invention was made with Government support through a grant awarded by National Science Foundation. The United States Government may have certain rights to this invention pursuant to the grant.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [5] represents the 5th reference cited in the reference list, namely, Aldroubi and Grochenig, *Nonuniform sampling and reconstruction in shift-invariant spaces*, SIAM Rev. 43 (2001), No. 4, 585-620.

FIELD OF THE INVENTION

The present invention generally relates to a system and methods for data representation of an object of interest. More particularly, the present invention relates to a system and methods for data representation of an object of interest through nonuniform data sampling and data reconstruction in shift-invariant and wavelet spaces.

BACKGROUND OF THE INVENTION

Any object of interest in the world can be represented by corresponding information, or data. Information or data can then be processed so that people may have access to it. As known to people skilled in the art and as used in the specification throughout, among other things, the term data generally refers to numerical, graphical or alphabetical information representing one or more objects of interest. Data may be obtained or reduced through empirical observations or from instrument readings. The term data processing generally refers to various operations on data. In particular, among other functions, data processing includes data recording, transmission of data, manipulation of data, data conversion, data reporting, data reconstruction, storage of data, retrieval of data, and usage of data.

One aspect of data processing relates to digital data processing. Modern digital data processing of functions (or signals or images) always uses a discretized version of the original signal $f$ that is obtained by sampling $f$ on a discrete set. The question then arises whether and how $f$ can be recovered from its samples, which often is termed as "sampling problem". Therefore, among other things, one objective of research on the sampling problem is to quantify the conditions under which it is possible to recover particular classes of functions from different sets of discrete samples, and a related objective is to use these analytical results to develop explicit reconstruction schemes for the analysis and processing of digital data. Specifically, the sampling problem often includes two main parts as follows:

(a) First, given a class of functions V on $\mathbb{R}^d$, find conditions on sampling sets $X=\{x_j \in \mathbb{R}^d : j \in J\}$, where J is a countable index set, under which a function $f \in V$ can be reconstructed uniquely and stably from its samples $\{f(x_j): x_j \in X\}$; and (b) Second, find efficient and fast numerical algorithms that recover any function $f \in V$ from its samples on X.

In some applications, it may be justified to assume that the sampling set $X=\{x_j : j \in J\}$ is uniform, i.e., that X forms a regular n-dimensional Cartesian grid, where n is an integer greater than zero. For examples, as shown in FIG. 1, curve 101 representing a function $f$ is sampled on a one-dimensional uniform grid 103. Moreover, as shown in FIG. 2, grid 203 represents a two-dimensional Cartesian grid. These grids can find some uses in real world and can be used to practice the present invention. For example, a digital image is often acquired by sampling light intensities on a uniform grid. Data acquisition requirements and the ability to process and reconstruct the data simply and efficiently often justify this type of uniform data collection.

However, in many realistic situations the data are known only on a nonuniformly spaced sampling set. This nonuniformity is a fact of life and prevents the use of the standard methods from Fourier analysis. Correspondingly, several nonuniform grids, such as a polar sampling grid 213, a spiral sampling grid 223, and a nonuniform grid 233, all schematically shown in FIG. 2, can find some more uses in real world and can be used to practice the present invention. The following examples are typical and indicate that nonuniform sampling problems are more pervasive in science and engineering.

Communication theory and practice: When data from a uniformly sampled signal (function) are lost, the result is generally a sequence of nonuniform samples. This scenario is usually referred to as a missing data problem. Often, missing samples are due to the partial destruction of storage devices, e.g., scratches on a CD. As shown in FIG. 3, a missing data problem is simulated by randomly removing samples from a slice of a three-dimensional magnetic resonance (MR) digital image 301. The simulated image 303 with 50% random missing samples displays a rather incomplete construction of image 301 and loses important details of image 301. Image 303 can be considered as a sampling of image 301, which is the object of interest at this example, on the nonuniform grid 233.

Astronomical measurements: The measurement of star luminosity gives rise to extremely nonuniformly sampled time series. Daylight periods and adverse nighttime weather conditions prevent regular data collection as further discussed in [111].

Medical imaging: Computerized tomography (CT) and magnetic resonance imaging (MRI) frequently use the nonuniform polar sampling grid 213 and spiral sampling grid 223 as further discussed in [21, 90], respectively.

Other applications using nonuniform sampling sets occur in geophysics as further discussed in [92], spectroscopy as further discussed in [101], general signal/image processing as further discussed in [13, 22, 103, 106], and biomedical imaging such as MRI as discussed above in connection with images 301 and 303 and ultrasonic images 401 and 403 as shown in FIG. 4 and as further discussed in [20, 59, 90, 101], respectively. For examples, as shown in FIG. 4, detected edge points 402 of the left ventricle of a heart from a two-dimensional ultrasound image 401 constitute a nonuniform sampling of the left ventricle's contour, while boundary 404 of the left ventricle shown is reconstructed from the detected edge sample points 402. More information about modern techniques for nonuniform sampling and applications can be found in [16].

Efforts have been made accordingly to find better, fast and efficient techniques for nonuniform data sampling and data reconstruction such that one can reconstruct an object of interest from nonuniform data sampling with limit data points, and/or can convert from digital type (i.e., some data points) to analog type (i.e., a corresponding image), or vice versa.

However, among other things, standard methods of signal processing and data sampling encounter several problems as follows:

First, these methods often are not local due to the infinite range of the band limited function model utilized by these methods.

Second, these methods are not multi-dimensional, i.e., they do not work well for signals related to time series, images, 3-D images, spectral images as well as samples of any high dimensional images with dimension larger than 3.

Third, these methods are normally not that fast. In fact, standard methods based on Fast Fourier Transformation ("FFT") are currently fastest methods one can get. Still, in an ideal situation, it has an order of a computational complexity NlogN that is slow when N is large, where N is the order of the samples.

Fourth, these methods may not be easily utilized in association with parallel processing because the non-localization due to the infinite range of the band limited function model utilized by these methods, which further limits the ability of these methods to take advantages of computing power offered by parallel processing.

Therefore, there is a need to develop system and methods for nonuniform sampling and applications of data representing an object to address the aforementioned deficiencies and inadequacies.

SUMMARY OF THE INVENTION

The present invention overcomes the disadvantages of the prior art and relates to new approaches to sampling, converting and processing data. Specifically, the present invention relates to system and methods of sampling and reconstruction of data from a data set that contains information regarding one or more objects of interest. Moreover, the present invention relates to system and methods of converting data between a digital form and an analog form for a data set that contains information regarding one or more objects of interest.

In one aspect, the present invention relates to a method for sampling data for an object of interest, which is characterized by a functions, from a data set $\{f(x_j)\}$ obtained from data sample points $x_j \in [M_0, M_1]$, j being an indexing number, $[M_0, M_1]$ representing an interval where the function $f$ is sampled, comprising the steps of:

a. constructing a first matrix $\mathcal{U} = \mathcal{U}^{M_0, M_1}$, with matrix elements in the form of $\mathcal{U}_{jk} = \phi(x_j - k)$, wherein $\phi$ is a continuous function with compact support of size S, S being an integer, j being an integer from 1 to J, J being an integer $\geq M_1 - M_0 + 2S - 1$, and k being an integer from $M_0 - S + 1$ to $M_1 + S - 1$;

b. obtaining a second matrix $\mathcal{F} = \mathcal{F}^{M_0, M_1} = \mathcal{U}^* \mathcal{U}$, with matrix elements in the form of $$\mathcal{F}_{kl} = \sum_{j=1}^{J} \overline{\phi(x_j - k)} \phi(x_j - l),$$

wherein each of k, l is an integer from $M_0 - S + 1$ to $M_1 + S - 1$;

c. obtaining a first vector $b = \mathcal{U}^* y$ with vector elements in the form of $$b_k = \sum_{j=1}^{J} \overline{\phi(x_j - k)} y_j$$

for $k = M_0 - S + 1, \ldots, M_1 + S - 1$, wherein $y = (y_1, \ldots, y_J)$ is a sampling vector;

d. solving a plurality of equations in the form of $c = \mathcal{F}^{-1} b$ to obtain a second vector $c = (c_k)$, wherein k is an integer from $M_0 - S + 1$ to $M_1 + S - 1$;

e. computing the restriction of the function $f$ to $[M_0, M_1]$ to obtain a new data set, $f(x)$, in the form of $$f(x) = \sum_{k=M_0-S+1}^{M_1+S-1} c_k \phi(x - k) \text{ for } x \in [M_0, M_1]; \text{ and}$$

f. reconstructing the object of interest $f$ from the new data set.

In one embodiment, the step of reconstructing the object of interest $f$ from the new data set comprises the step of obtaining the object of interest $f$ as the least square approximation of the sampling vector y from $$\sum_{j=1}^{J} |y_j - f(x_j)|^2 = \min_{h \in V(\phi)} \sum_{j=1}^{J} |y_j - h(x_j)|^2,$$

wherein $V(\phi)$ represents a shift-invariant space. When y arises as the sampling vector, $y = \{f(x_j)\}$, an exact reconstruction of $f$ is obtained from the new data set.

In another aspect, the present invention relates to a system for sampling data for an object of interest, which is characterized by a function $f$, from a data set $\{f(x_j)\}$ obtained from data sample points $x_j \in [M_0, M_1]$, j being an indexing number, $[M_0, M_1]$ representing an interval where the function $f$ is sampled, comprising a processor, wherein the processor is capable of performing the steps of:

a. constructing a first matrix $\mathcal{F} = \mathcal{F}^{M_0, M_1}$ with matrix elements in the form of $\mathcal{F}_{jk} = \phi(x_j - k)$, wherein $\phi$ is a continuous function with compact support of size S, S being an integer, j being an integer from 1 to J, J being an integer $\geq M_1 - M_0 + 2S - 1$, and k being an integer from $M_0 - S + 1$ to $M_1 + S - 1$;

b. obtaining a second matrix $\mathcal{F} = \mathcal{F}^{M_0, M_1} = \mathcal{U}^* \mathcal{U}$ with matrix elements in the form of $$\mathcal{T}_{kl} = \sum_{j=1}^{J} \overline{\varphi(x_j - k)} \varphi(x_j - l),$$

wherein each of k, l is an integer from $M_0-S+1$ to $M_1+S-1$;

c. obtaining a first vector $b=\mathcal{U}^*y$ with vector elements in the form of $$b_k = \sum_{j=1}^{J} \overline{\varphi(x_j - k)} y_j$$

for $k=M_0-S+1, \ldots, M_1+S-1$, wherein $y=(y_1, \ldots, y_J)$ is a sampling vector;

d. solving a plurality of equations in the form of $c=\mathcal{T}^{-1}b$ to obtain a second vector $c=(c_k)$, wherein k is an integer from $M_0-S+1$ to $M_1+S-1$;

e. computing the restriction of the function $f$ to $[M_0, M_1]$ to obtain a new data set, $f(x)$, in the form of $$f(x) = \sum_{k=M_0-S+1}^{M_1+S-1} c_k \varphi(x-k) \text{ for } x \in [M_0, M_1]; \text{ and}$$

f. reconstructing the object of interest $f$ from the new data set.

In yet another aspect, the present invention relates to a method for converting data for an object of interest, which is characterized by a functions between a digital form and an analog form, comprising the steps of:

a. locally selecting a plurality of data sample points in the order of N, N being an integer, wherein the data sample points are in a first form of data type;

b. performing a transformation in a shift-invariant space to the locally selected data sample points to obtain a new data set that is in a second form of data type different from the first form of data type; and c. reconstructing the object of interest $f$ from the new data set.

In one embodiment, the first form of data type is one of the digital form and the analog form, and the second form of data type is one of the digital form and the analog form that is different from the first form of data type. In other words, the first form of data type can be in digital form, and the corresponding second form of data type is in analog form, and vice versa. Alternatively, the present invention can be practiced to convert data from digital form to digital form, or from analog form to analog form.

Furthermore, the step of locally selecting a plurality of data sample points comprises the step of obtaining a data set $\{f(x_j)\}$ from data sample points $x_j \in [M_0, M_1]$, j being an indexing number up to the order of N, $[M_0, M_1]$ representing an interval where the function $f$ is sampled.

Moreover, the step of performing a transformation in a shift-invariant space comprises the steps of:

a. constructing a first matrix $\mathcal{U} = \mathcal{U}^{M_0,M_2}$ with matrix elements in the form of $\mathcal{U}_{jk} = \varphi(x_j-k)$, wherein $\varphi$ is a continuous function with compact support of size S, S being an integer, j being an integer from 1 to J, J being an integer $\geq M_1-M_0+2S-1$, and k being an integer from $M_0-S+1$ to $M_1+S-1$;

b. obtaining a second matrix $\mathcal{T}=\mathcal{T}^{M_0,M_1}=\mathcal{U}^*\mathcal{U}$ with matrix elements in the form of $$\mathcal{T}_{kl} = \sum_{j=1}^{J} \overline{\varphi(x_j - k)} \varphi(x_j - l),$$

wherein each of k, l is an integer from $M_0-S+1$ to $M_1+S-1$;

c. obtaining a first vector $b=\mathcal{U}^* y$ with vector elements in the form of $$b_k = \sum_{j=1}^{J} \overline{\varphi(x_j - k)} y_j$$

for $k=M_0-S+1, \ldots, M_1+S-1$, wherein $y=(y_1, \ldots, y_J)$ is a sampling vector;

d. solving a plurality of equations in the form of $c=\mathcal{T}b$ to obtain a second vector $c=(c_k)$, wherein k is an integer from $M_0-S+1$ to $M_1+S-1$; and e. computing the restriction of the function $f$ to $[M_0, M_1]$ to obtain the new data set, $f(x)$, in the form of $$f(x) = \sum_{k=M_0-S+1}^{M_1+S-1} c_k \varphi(x-k) \text{ for } x \in [M_0, M_1].$$

Additionally, the step of reconstructing the object of interest $f$ from the new data set comprises the step of obtaining the object of interest $f$ as the least square approximation of the sampling vector y from $$\sum_{j=1}^{J} |y_j - f(x_j)|^2 = \min_{h \in V(\varphi)} \sum_{j=1}^{J} |y_j - h(x_j)|^2,$$

wherein $V(\varphi)$ represents the shift-invariant space.

In a further aspect, the present invention relates to a system for converting data for an object of interest, which is characterized by a functions between a digital form and an analog form, comprising a processor, wherein the processor is capable of performing the steps of:

a. locally selecting a plurality of data sample points in the order of N, N being an integer, wherein the data sample points are in a first form of data type;

b. performing a transformation in a shift-invariant space to the locally selected data sample points to obtain a new data set that is in a second type of data type different from the first form of data type; and c. reconstructing the object of interest $f$ from the new data set.

In one aspect, the present invention relates to a method for recovering information about an object of interest $f$ from a data set $\{f(x_j)\}$ obtained from nonuniform data sample points $x_j \in X$, j being an indexing number, X representing the set of points where the object of interest $f$ has been sampled, comprising the steps of:

a. selecting data $f(x_j)$ from the data set $\{f(x_j)\}$;
b. constructing an approximation operator $Q_X$;
c. applying the approximation operator $Q_X$ to the data $f(x_j)$ to obtain an approximation $Q_X f(x_j)$;
d. constructing a projection operator P;
e. applying the projection operator P to the approximation $Q_X f(x_j)$ to obtain a first approximation $f_1 = P Q_X f(x_j)$;
f. obtaining an error $e = f(x_j) - f_1$;
g. applying the projection operator P to the error e to obtain a first approximation of error $e_1 = P e$;
h. obtaining a second approximation $f_2 = f_1 + e_1$; and
i. returning to step (e) until a sequence $f_n = f_1 + e_1 + e_2 + e_3 + \ldots + e_{n-1}$ is obtained, wherein function $f_n$ converges to the object of interest $f$.

Another aspect of the present invention relates to a system for recovering information about an object of interest $f$ from a data set $\{f(x_j)\}$ obtained from nonuniform data sample points $x_j \in X$, j being an indexing number, X representing the set of points where the object of interest $f$ has been sampled. In one embodiment, the system has an input device for receiving the information in the data set $\{f(x_j)\}$, and a processing unit communicating to the input device and performing the steps of:
a. selecting data $f(x_j)$ from the data set $\{f(x_j)\}$;
b. constructing an approximation operator $Q_X$;
c. applying the approximation operator $Q_X$ to the data $f(x_j)$ to obtain an approximation $Q_X f(x_j)$;
d. constructing a projection operator P;
e. applying the projection operator P to the approximation $Q_X f(x_j)$ to obtain a first approximation $f_1 = P Q_X f(x_j)$;
f. obtaining an error $e = f(x_j) - f_1$;
g. applying the projection operator P to the error e to obtain a first approximation of error $e_1 = P e$;
h. obtaining a second approximations $f_2 = f_1 + e_1$; and
i. returning to step (e) until a sequence $f_n = f_1 + e_1 + e_2 + e_3 + \ldots + e_{n-1}$ is obtained, wherein function $f_n$ converges to the object of interest $f$.

A further aspect of the present invention relates to a method for recovering information about an object of interest $f$ from a data set $\{f(x_j)\}$ obtained from nonuniform data sample points $x_j \in X$, j being an indexing number, X representing the set of points where the object of interest $f$ has been sampled in presence of noise. Practicing the present invention in one embodiment includes the steps of:
a. selecting data $f_j'$ from the data set $\{f_j' = f(x_j) + \eta_j\}$, wherein $\eta_j$ represents a corresponding noise component;
b. constructing an initialization functions as the summation of function $f_j'$: $f' = \Sigma_{j \in J} f_j' \beta_j$, wherein $\beta_j$ represents the jth component of a partition of unity;
c. constructing an approximation operator $Q_X$;
d. applying the approximation operator $Q_X$ to the function $f'$ to obtain an approximation $Q_X f'$;
e. constructing a projection operator P;
f. applying the projection operator P to the approximation $Q_X f'$ to obtain a first approximation $f_1 = P Q_X f'$;
g. obtaining an error $e = f - f_1$;
h. applying the projection operator P to the error e to obtain a first approximation of error $e_1 = P e$;
i. obtaining a second approximation $f_2 = f_1 + e_1$; and
j. returning to step (f) until a sequence $f_n = f_1 + e_1 + e_2 + e_3 + \ldots + e_{n-1}$ is obtained, wherein function $f_n$ converges to a function $f_\infty$ that adequately describes the object of interests Another further aspect of the present invention relates to system for recovering information about an object of interest $f$ from a data set $\{f(x_j)\}$ obtained from nonuniform data sample points $x_j \in X$, j being an indexing number, X representing the set of points where the object of interest $f$ has been sampled in presence of noise. In one embodiment, the system has an input device for receiving the information in the data set $\{f(x_j)\}$, and a processing unit coupled to and communicating to the input device and performing the steps of:
a. selecting data $f_j'$ from the data set $\{f_j' = f(x_j) + \sigma_j\}$, wherein $\eta_j$ represents a corresponding noise component;
b. constructing an initialization function $f'$ as the summation of function $f_j'$: $f' = \Sigma_{j \in J} f_j' \beta_j$, wherein $\beta_j$ represents the jth component of a partition of unity;
c. constructing an approximation operator $Q_X$;
d. applying the approximation operator $Q_X$ to the function $f'$ to obtain an approximation $Q_X f'$;
e. constructing a projection operator P;
f. applying the projection operator P to the approximation $Q_X f'$ to obtain a first approximation $f_1 = P Q_X f'$;
g. obtaining an error $e = f - f_1$;
h. applying the projection operator P to the error e to obtain a first approximation of error $e_1 = P e$;
i. obtaining a second approximation $f_2 = f_1 + e_1$; and
j. returning to step (f) until a sequence $f_n = f_1 + e_1 + e_2 + e_3 + \ldots + e_{n-1}$ is obtained, wherein function $f_n$ converges to a function $f_\infty$ that adequately describes the object of interest f.

In yet another aspect, the present invention relates to a method for recovering information about an object of interest $f$ from a data set $\{f(x_j)\}$ obtained from nonuniform data sample points $x_j \in X$, j being an indexing number, X representing the set of points where the object of interest $f$ has been sampled in presence of noise, comprising the steps of sampling a set of data samples from the data set $\{f(x_j)\}$, iteratively framing the sampled set of data samples until the sampled set of data samples converges to a new set of data samples that has a size significantly smaller than the data set $\{f(x_j)\}$, and reconstructing the object of interest $f$ from the new set of data samples.

In another aspect, the present invention relates to a system for recovering information about an object of interest $f$ from a data set $\{f(x_j)\}$ obtained from nonuniform data sample points $x_j \in X$, j being an indexing number, X representing the set of points where the object of interest $f$ has been sampled in presence of noise, comprising means for sampling a set of data samples from the data set $\{f(x_j)\}$, means for iteratively framing the sampled set of data samples until the sampled set of data samples converges to a new set of data samples that has a size significantly smaller than the data set $\{f(x_j)\}$, means for reconstructing the object of interest $f$ from the new set of data samples. In one embodiment, the sampling means comprises an input device, the framing means comprises a processor, and the reconstructing means comprises an output device.

In yet another aspect, the present invention relates to a method for recovering information about an object of interest $f$ from a data set of averages $\{<f, \psi_{x_j}>\}$ obtained from nonuniform data sample points $x_j \in X$, j being an indexing number, X representing the set of points where the object of interest $f$ has been sampled, comprising the steps of:
a. selecting data $<f, \psi_{x_j}>$ from the data set $\{<f, \psi_{x_j}>\}$;
b. constructing a quasi-reconstruction operator $A_X$ for obtaining a quasi-reconstruction $A_X f$, wherein $A_X f = \Sigma_{j \in J} <f, \psi_{x_j}> \beta_j$, wherein $\beta_j$ represents the jth component of a partition of unity, and $\{\psi_{x_j} : x_j \in X\}$ is a set of functionals that act on $f$;
c. constructing a projection operator P;
d. applying the projection operator P to the quasi-reconstruction $A_X f$ to obtain a first approximation $f_1 = P A_X f$;
e. obtaining an error $e = (f - f_1)$;

f. applying the projection operator P and the quasi-reconstruction operator $A_X$ to the error e to obtain a first approximation of error $e_1 = P A_X e$;

g. obtaining a second approximation $f_2 = f_1 + e_1$; and h. returning to step (e) until a sequence $f_n = f_1 + e_1 + e_2 + e_3 + \ldots + e_{n-1} = P A_X(f - f_{n-1}) + f_{n-1}$ is obtained, wherein function $f_n$ converges to the object of interest $f$.

Another aspect of the present invention relates to a system for recovering information about an object of interest $f$ from a data set of averages $\{<f, \psi_{x_j}>\}$ obtained from nonuniform data sample points $x_j \in X$, j being an indexing number, X representing the set of points where the object of interest $f$ has been sampled. In one embodiment, the system has an input device for receiving the information in the data set $\{<f, \psi_{x_j}>\}$, and a processor coupled to and communicating to the input device and performing the steps of:

a. selecting data $<f, \psi_{x_j}>$ from the data set $\{<f, \psi_{x_j}>\}$;

b. constructing a quasi-reconstruction operator $A_X$ for obtaining a quasi-reconstruction $A_X f$, wherein $A_X f = \Sigma_{j \in J} <f, \psi_{x_j}> \beta_j$, wherein $\beta_j$ represents the jth component of a partition of unity, and $\{\psi_{x_j} : x_j \in X\}$ is a set of functionals that act on $f$;

c. constructing a projection operator P;

d. applying the projection operator P to the quasi-reconstruction $A_X f$ to obtain a first approximation $f_1 = PA_X f$;

e. obtaining an error $e = f - f_1$;

f. applying the projection operator P and the quasi-reconstruction operator $A_X$ to the error e to obtain a first approximation of error $e_1 = P A_X e$;

g. obtaining a second approximation $f_2 = f_1 + e_1$; and h. returning to step (e) until a sequence $f_n = f_1 + e_1 + e_2 + e_3 + \ldots + e_{n-1} = P A_X(f - f_{n-1}) + f_{n-1}$ is obtained, wherein function $f_n$ converges to the object of interest $f$.

A further aspect of the present invention relates to a method for recovering information about an object of interest $f$ from a data set $\{<f, \psi_{x_j}>\}$ obtained from nonuniform data sample points $x_j \in X$, j being an indexing number, X representing the set of points where the object of interest $f$ has been sampled in presence of noise. Practicing the present invention in one embodiment includes the steps of:

a. selecting data $f_j'$ from the data set $\{f_j' = f(x_j) + \eta_j\}$, wherein $\eta_j$ represents a corresponding noise component;

b. constructing an initialization function $f'$ as the summation of function $f_j'$: $f' = \Sigma_{j \in J} f_j' \beta_j$, wherein $\beta_j$ represents the jth component of a partition of unity;

c. constructing a quasi-interpolant operator $Q_X$;

d. applying the quasi-interpolant operator $Q_X$ to the function $f'$ to obtain an approximation $Q_X f'$;

e. constructing a projection operator P;

f. applying the projection operator P to the approximation $Q_X f'$ to obtain a first approximation $f_1 = P Q_X f'$;

g. obtaining an error $e = f - f_1$;

h. constructing a quasi-reconstruction operator $A_X$ for obtaining a quasi-reconstruction $A_X f$, wherein $A_X f = \Sigma_{j \in J} <f, \psi_{x_j}> \beta_j$, and $\{\psi_{x_j} : x_j \in X\}$ is a set of functionals that act on $f$;

i. applying the projection operator P and the quasi-reconstruction operator $A_X$ to the error e to obtain a first approximation of error $e_1 = PA_X e$;

j. obtaining a second approximation $f_2 = f_1 + e_1$; and k. returning to step (g) until a sequence $f_n = f_1 + e_1 + e_2 + e_3 + \ldots + e_{n-1} = f_1 + (I - P A_X) f_{n-1}$ is obtained, wherein I is an unit operator and function $f_n$ converges to a function $f_\infty$ that adequately describes the object of interest $f$.

A further aspect of the present invention relates to system for recovering information about an object of interest $f$ from a data set $\{<f, \psi_{x_j}>\}$ obtained from nonuniform data sample points $x_j \in X$, j being an indexing number, X representing the set of points where the object of interest $f$ has been sampled in presence of noise. In one embodiment, the system has an input device for receiving the information in the data set $\{f(x_j)\}$, and a processor coupled to and communicating to the input device and performing the steps of:

a. selecting data $f_j'$ from the data set $\{f_j' = <f, \psi_{x_j}> + \eta_j\}$, wherein $\eta_j$ represents a corresponding noise component;

b. constructing an initialization function $f'$ as the summation of function $f_j'$: $f' = \Sigma_{j \in J} f_j' \beta_j$, wherein $\beta_j$ represents the jth component of a partition of unity;

c. constructing a quasi-interpolant operator $Q_X$;

d. applying the quasi-interpolant operator $Q_X$ to the functions to obtain an approximation $Q_X f'$;

e. constructing a projection operator P;

f. applying the projection operator P to the approximation $Q_X f'$ to obtain a first approximation $f_1 = P Q_X f'$;

g. obtaining an error $e = f - f_1$;

h. constructing a quasi-reconstruction operator $A_X$ for obtaining a quasi-reconstruction $A_X f$ wherein $A_X f = \Sigma_{j \in J} <f, \psi_{x_j}> \beta_j$, and $\{\psi_{x_j} : x_j \in X\}$ is a set of functionals that act on $f$;

i. applying the projection operator P and the quasi-reconstruction operator $A_X$ to the error e to obtain a first approximation of error $e_1 = PA_X e$;

j. obtaining a second approximation $f_2 = f_1 + e_1$; and k. returning to step (g) until a sequence $f_n = f_1 + e_1 + e_2 + e_3 + \ldots + e_{n-1} = f_1 + (I - P A_X) f_{n-1}$ is obtained, wherein I is an unit operator and function $f_n$ converges to a function $f_\infty$ that adequately describes the object of interest $f$.

In one embodiment, the approximation operator $Q_X$ comprises an interpolation operator, wherein the interpolation operator provides piecewise linear interpolation. Alternatively, the approximation operator $Q_X$ comprises a quasi-interpolation operator, wherein the quasi-interpolation operator provides step-wise approximation. The projection operator P comprises a bounded projection. Alternatively, the projection operator P comprises a universal projection.

The data set, being in the form of $\{f(x_j)\}$, $\{f_j' = f(x_j) + \eta_j\}$, $\{<f, \psi_{x_j}>\}$, or $\{f_j' = <f, \psi_{x_j}> + \eta_j\}$, can comprise a variety of types of data in a first form of analog data type or in a second form of digital data type, or vice versa. Each type of data can comprise a variety of kinds of data in terms of substance. For examples, the data set can comprise a plurality of digital data related to sound including communications between person to person, person to machine, machine to machine including, but not limited to, data collected for commercial purpose, educational purpose, intelligence purpose, national security purpose, etc. The data set can also comprise a plurality of digital data related to at least one image, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, any combination of them, or the like. Moreover, the data set can comprise a plurality of biological data, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues, any combination of them, or the like. Furthermore, the data set can comprise a plurality of data from at least one measurement of the object of the interest, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement, any combination of them, or the like. Additionally, the data set can comprise a plurality of data that are static, a plurality of data related to time dependent signals, any combination of them, or the like.

In one embodiment, the processor comprises a microprocessor. The system further has an input device coupled to and in communication with the processor, wherein the input device comprises at least one device selected from the group of a processor interface, a GUI, a scanner, a CD-ROM, a diskette, a computer coupled to a network, and a networking device. Moreover, the system further has an output device coupled to and in communication with the processor, wherein the output device comprises at least one device selected from the group of a GUI, a printer, a CD-ROM, a diskette, a memory device, a computer coupled to a network, and a networking device.

For the purpose of practicing the present invention, an object of interest can be any subject under the sun in which human being is interested, which includes human being himself or herself and any and all human being activities.

Other advantages and uses for the present invention will be more clearly understood by reference to the remainder of this document.

The present invention overcomes the disadvantages of the prior art and relates to new approaches to sampling, converting and processing data. Specifically, the present invention relates to system and methods of sampling and reconstruction of data from a data set that contains information regarding one or more objects of interest. Moreover, the present invention relates to system and methods of converting data between a digital form and an analog form for a data set that contains information regarding one or more objects of interest.

Many more applications can be found for these and other aspects of the present invention. For examples, among other things and advantages, the methods and related algorithms of the present invention are local, i.e., the reconstruction of the data or signal of an object of interest depends only on the given data in the neighborhood of each sampling point as opposed to the infinite range of the band limited function model of the prior art.

Second, the methods and related algorithms of the present invention are multi-dimensional, which make them suitable for signals, time series, images, 3-D images, spectral images as well as samples of any high dimensional images with dimension larger than n, n being an integer greater than 1.

Third, the methods and related algorithms of the present invention are fast in the order of N with a computational complexity of order N, where N is about the number of samples. In other words, the number of operation needed for reconstruction is about and proportional to the number of samples. By contrast, as set forth above, standard methods based on FFT are of complexity NlogN. Consequently, the methods and related algorithms of the present invention are well adapted for processing large data sets in the fields of, for examples, medical image processing, geophysics, seismology, and oil exploration.

Fourth, localization of the methods and related algorithms of the present invention makes it as a great candidate in combination with data segmentation to facilitate parallel processing, thereby increasing speed of reconstruction.

Fifth, the methods and related algorithms of the present invention can be used to improve data conversion between digital form and analog form in many applications such as improving recovery of faults in a fault tolerant system rather than building heavily redundant systems, improving analysis/correction of outlier data points for reduction of noise, application in medical systems including computer x-ray tomography, magnetic resonance imaging, ultra-sound images, telemedicine such as remote specialist interpretation of medical images and the like, improving registration/synthesis of color separated images in printing processes and systems, enhancement of image or sound files recorded with older or inferior technologies including movies, early TV, early photographs, or the like, improving satellite imaging, applications in geophysics, seismology, oil exploration and the like.

Indeed, the methods and related algorithms of the present invention can be utilized to provide better, efficient, and fast data processing, data conversion, and data reconstruction for any and all fields where data for an object of interest are collected and need to be processed.

These and other aspects of the present invention will become apparent from the following description of the preferred embodiment taken in conjunction with the following drawings, although variations and modifications therein may be affected without departing from the spirit and scope of the novel concepts of the disclosure.

Curve 601 representing function $f$ belonging to the shift-invariant space generated by the Gaussian function $\exp(-x^2/\sigma^2)$, $\sigma \approx 0.81$, and its sample values $\{f(x_j), x_j \in X\}$ marked by + (density $\epsilon \approx 0.8$). (b). Curve 611 representing error $\|f-f_n\|_L^2$ against the number of iterations. (c). Curve 621 representing final error $f-f_n$ after 10 iterations. (d). Curve 631 representing reconstructed function $f_{10}$ (continuous line) and original samples $\{f(x_j), x_j \in X\}$.

Figure 7:
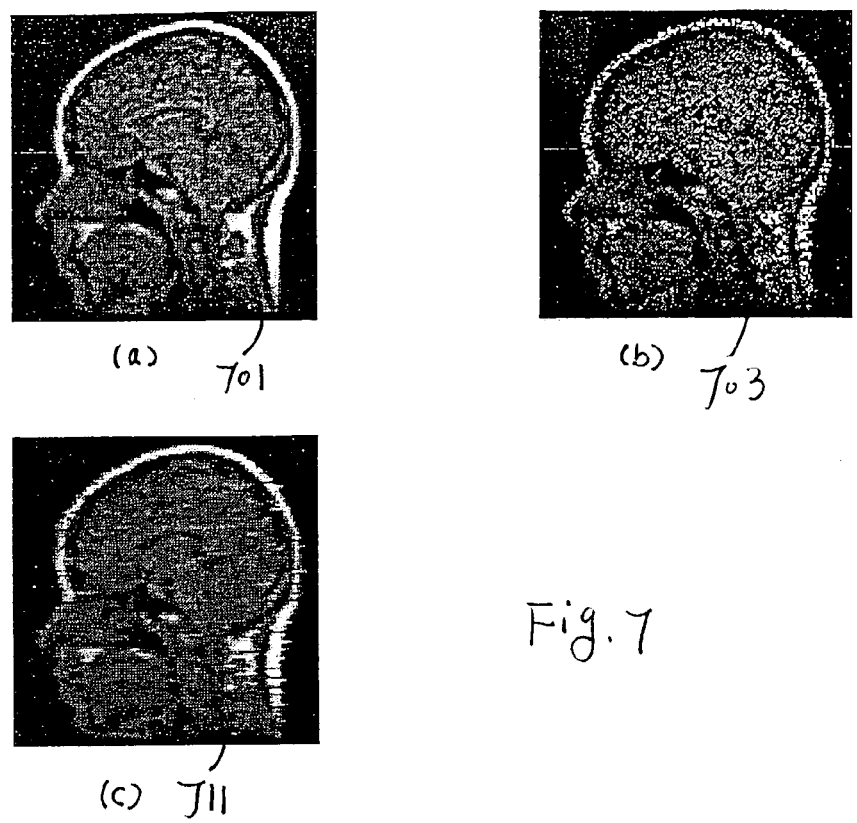

FIG. 7 displays a missing data reconstruction performed according to one embodiment of the present invention. (a). Original digital MRI image 701 with 128×128 samples. (b). MRI image 703 with 50% randomly missing samples. (c). Reconstruction or image 711 using the iterative reconstruction algorithm according to one embodiment of the present invention. The corresponding shift invariant space is generated by $\phi(x, y) = \beta^3(x) \times \beta^3(y)$, where $\beta^3 = \chi_{[0, 1]} * \chi_{[0, 1]} * \chi_{[0, 1]} *$, $\chi_{[0, 1]}$ is the B-spline function of degree 3.

Figure 1:
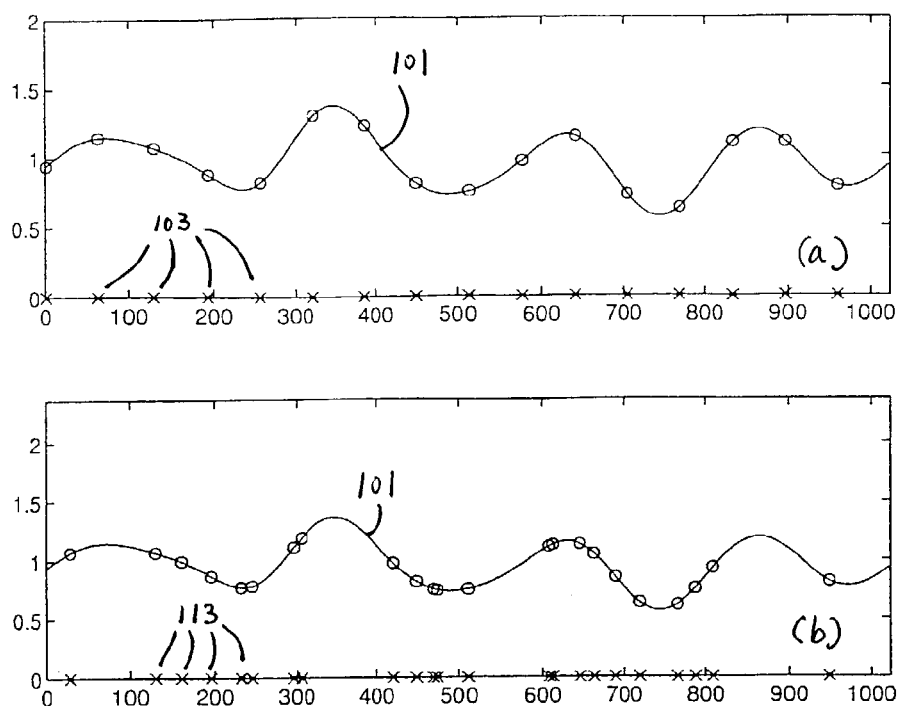
FIG. 1 schematically shows a typical sampling problem that can be solved by practicing the present invention. (a). A function $f$ defined on $\mathbb{R}$, represented by curve 101, is sampled on a uniform grid 103. (b). The same function $f$ is sampled on a nonuniformly spaced grid 113. The sampling locations $x_j$ are marked by the symbol x, and the sampled values $f(x_j)$ by a circle o.
Figure 2:
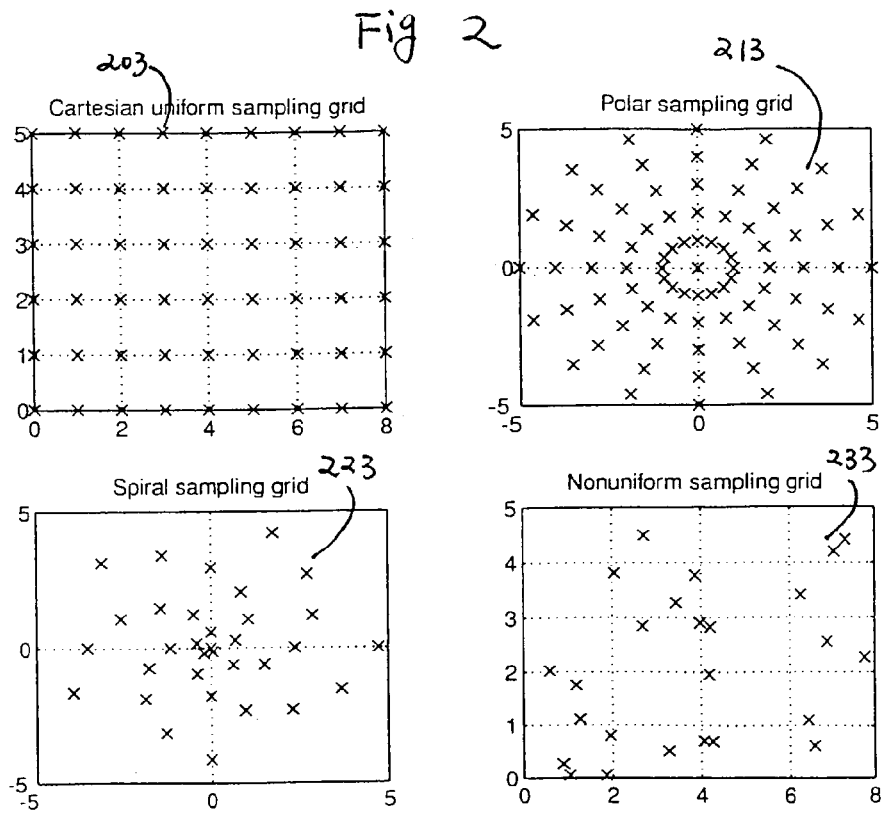
FIG. 2 schematically shows several types of sampling grids that can be utilized to practice the present invention. Top left: A Cartesian sampling grid 203, which is used in signal and image processing whenever possible because its simplicity. Top right: A polar sampling grid 213, which is used, for example, in computerized tomography. In this case, the two-dimensional Fourier transform $\hat{f}$ (not shown) is sampled with the goal of reconstructing $f$. Bottom left: A spiral sampling grid 223, which is used, for example, for fast MRI by direct signal reconstruction from spectral data on spirals. Bottom right: A typical nonuniform sampling grid 233, which can be used, for examples, in spectroscopy, astronomy, geophysics, and other signal and image processing applications.
Figure 3:
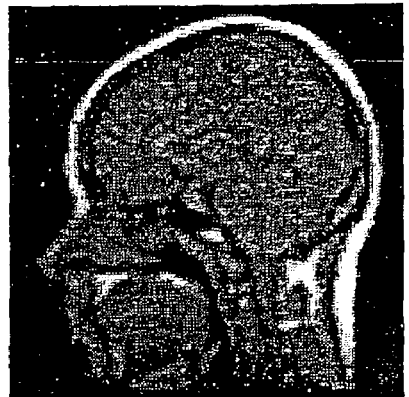
FIG. 3 schematically shows a missing data problem that can be solved by practicing the present invention. Left: Original digital MRI image 301 with 128×128 samples. Right: MRI image 303 with 50% randomly missing samples.
Figure 3:
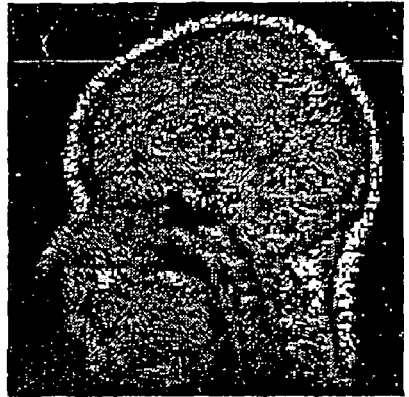
Figure 4:
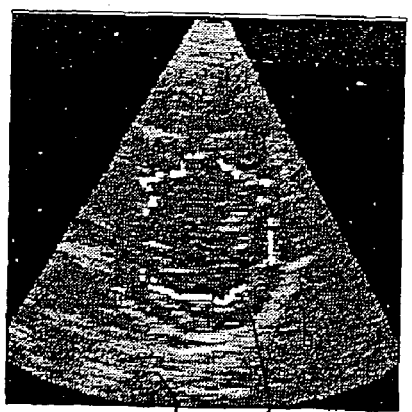
FIG. 4 schematically shows sampling and boundary reconstruction from ultrasonic images that can be obtained by practicing the present invention. Left: Detected edge points 402 of the left ventricle of a heart from a two-dimensional ultrasound image 401 constituting a nonuniform sampling of the left ventricle's contour. Right: Boundary 404 of the left ventricle reconstructed from the detected edge sample points 402.
Figure 4:
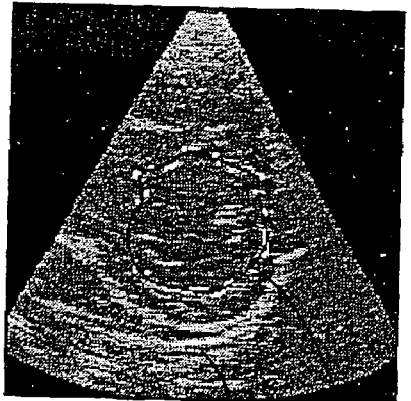
Figure 5:
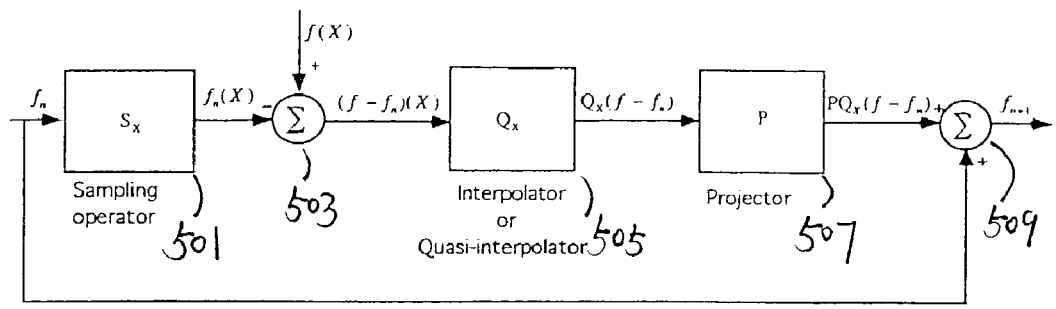
FIG. 5 schematically shows the iterative reconstruction algorithm according to one embodiment of the present invention.
Figure 8:
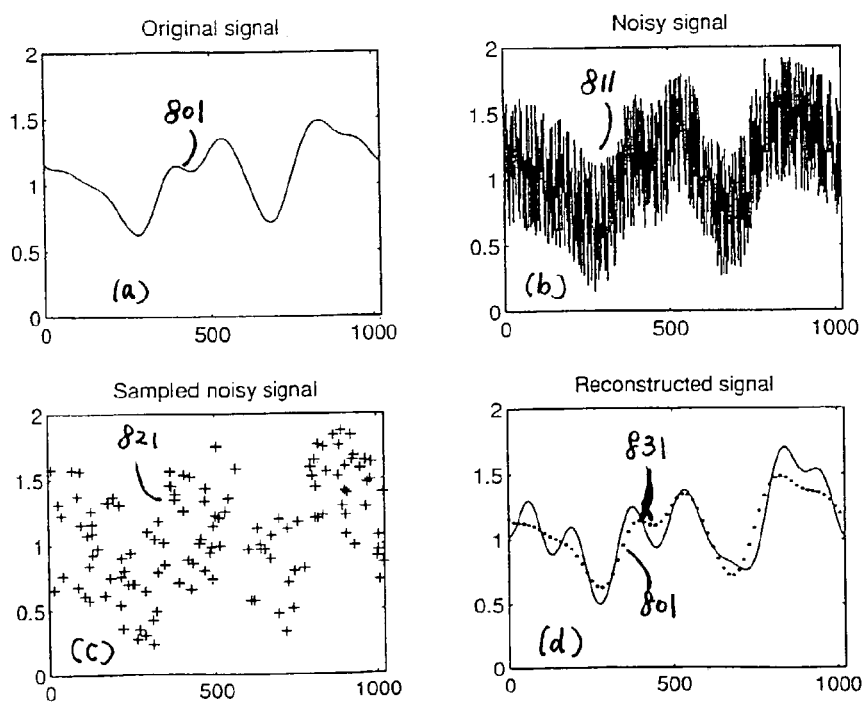

FIG. 8 schematically shows reconstruction of a function $f$ with additive noise using the iteration algorithm as set forth in FIG. 5 according to one embodiment of the present invention. (a). Curve 801 representing function $f$ belonging to the shift-invariant space generated by the Gaussian function $\exp(-x^2/\sigma^2)$, $\sigma=0.81$. (b). Curve 811 representing function $f$ with an additive white noise (SNR$\approx$0 db). (c). Curve 821 representing Noisy signal sampled on a nonuniform grid with maximal gap 0.51. (d). Curve 831 representing reconstructed function $f_{10}$ after 10 iterations (continuous line) and original signal $f$ (dotted line) from curve 801.

Figure 9:
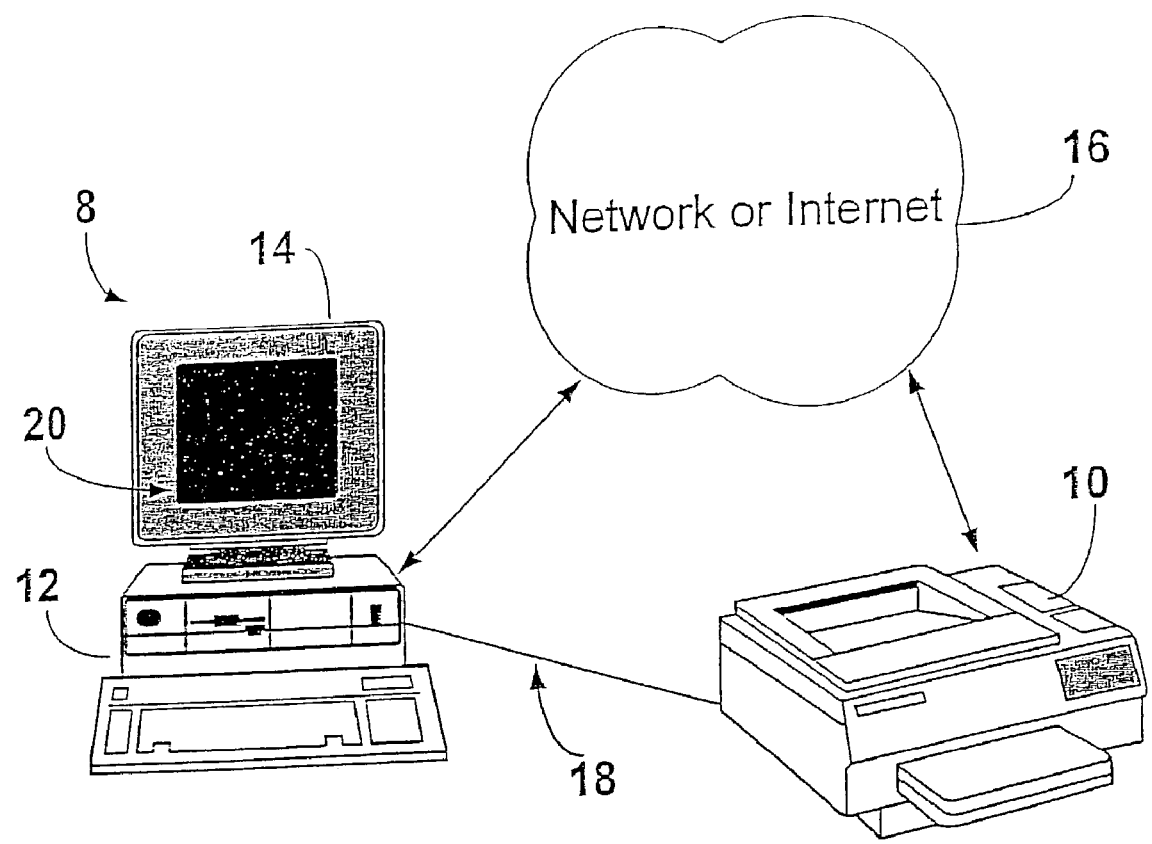

FIG. 9 schematically shows a block-diagram of a system that can be utilized to practice the present invention.

Figure 10:
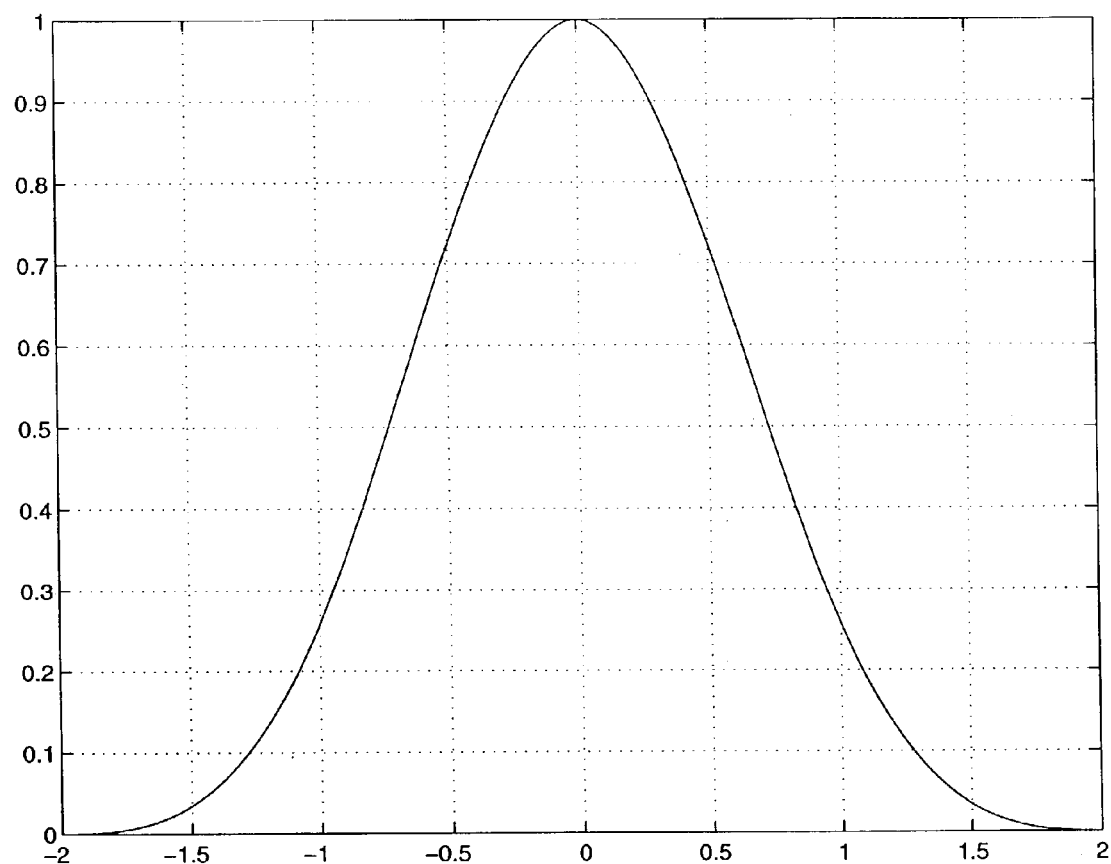

FIG. 10 shows the shift-invariant spline spaces with the B-spline of order 3 with $\phi \subseteq [-2,2]$ and S=2 that can be utilized to practice the present invention.

Figure 11:
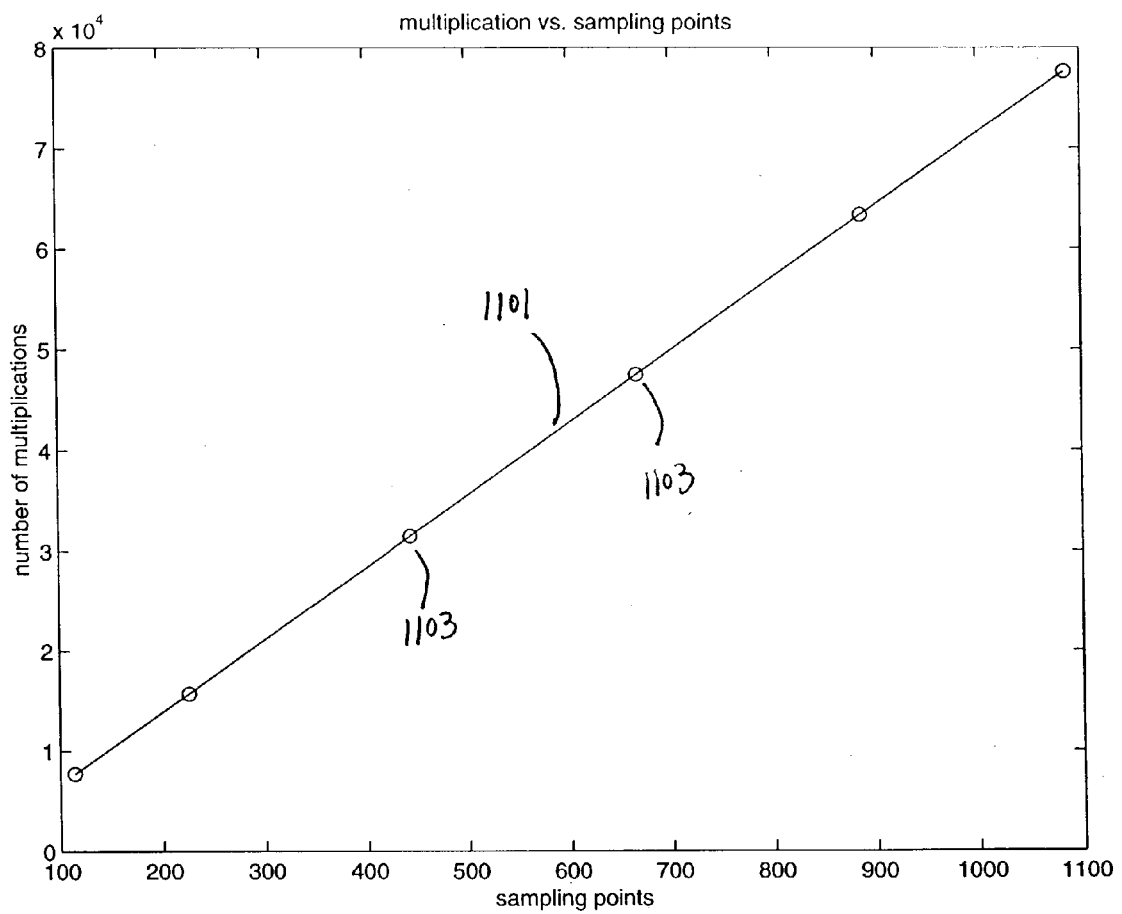

FIG. 11 shows a curve 1101 as a plot of the operation count as a function of the number of sampling points.

Figure 12:
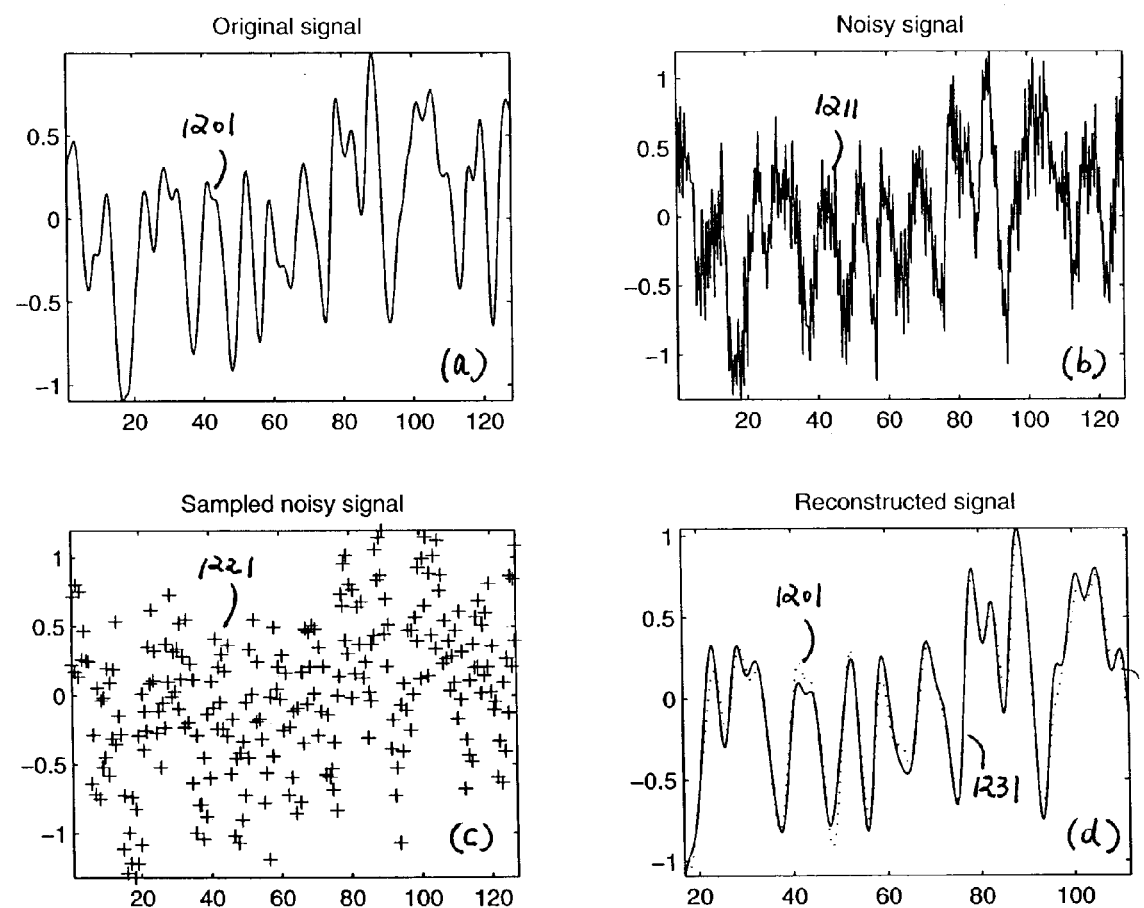

FIG. 12 schematically shows reconstruction of a function $f$ with additive noise according to one embodiment of the present invention with a signal on the interval [0,128]. Since S=2, one needs at least $M_1 - M_0 + 2S - 1 = 131$ samples. The actual sampling set of FIG. 12 has 200 sample points as calculated and satisfies the maximum gap condition $\max_j (x_{j+1} - x_j) \approx 0.67 < 1$. (a). Curve 1201 representing original signal. (b). Curve 1211 representing original signal with noise. (c). Curve 1221 representing noisy signal sampled on a nonuniform grid. (d). Curve 1231 representing reconstructed original signal after 10 iterations (continuous line) in comparison with original signal dotted line from curve 1201.

Figure 13A:
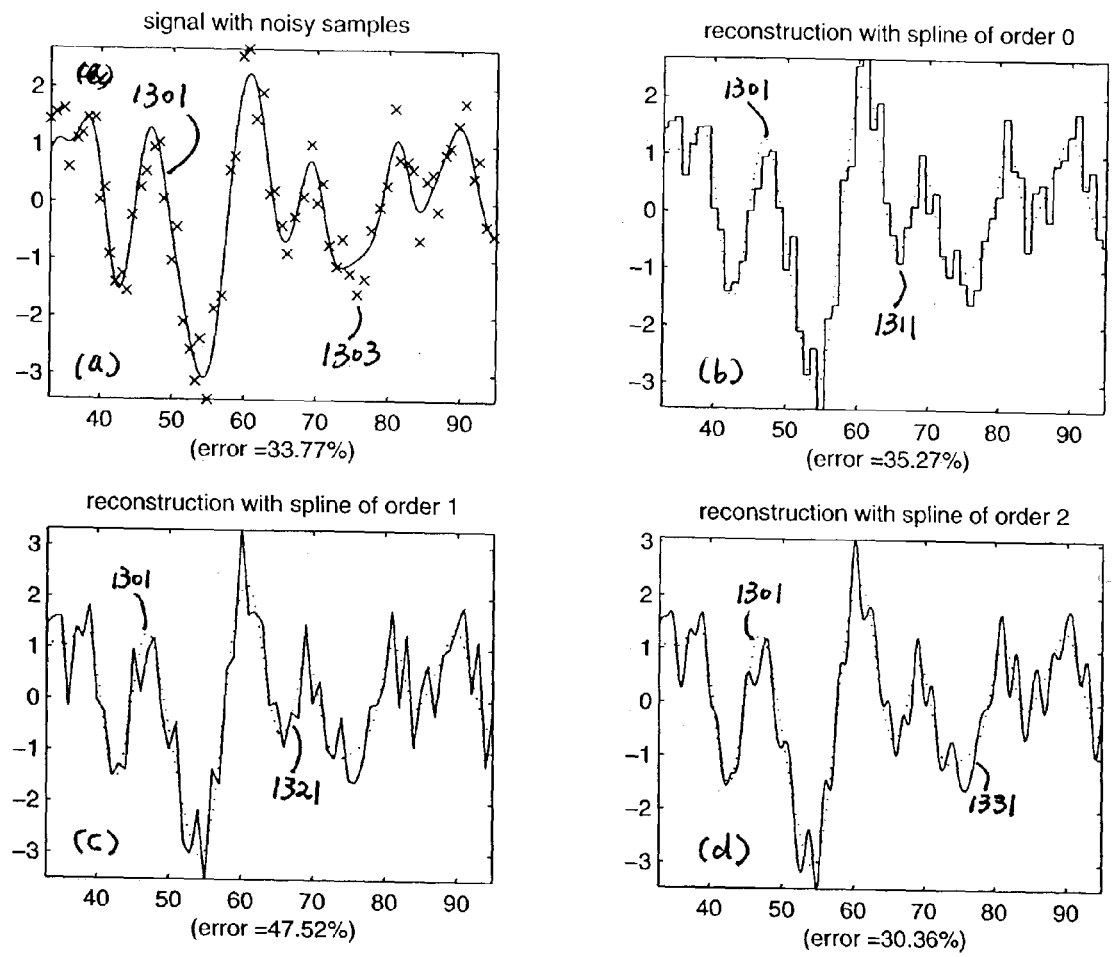

FIG. 13A schematically shows the dependence of the reconstruction on the generator $\phi$, where the generator $\phi$ is a B-spline of order N, i.e. $\phi N = X_{[-1/2, 1/2]} * \ldots * _{[1/2,1/2]}$ (N+1-fold convolution). The data set $(x_j, y_j)_{j=1, \ldots, J}$ is generated by sampling a function $f \in V(\phi_5)$ and then noise is added. The top left picture shows the original signal and the noisy sampled data. Then each subplot depicts the optimal approximation of these data in the spline space $V(\phi_N)$, $N=0, \ldots, 6$, starting with an approximation by a step function $f_{rec} \in V(\phi_0)$ via an approximation by a piecewise linear function $f_{rec} \in V(\phi_1)$ and ending with a smooth approximation $f_{rec} \in V(\phi_6)$. (a). Curve 1301 representing the original signal and curve 1303 representing the corresponding noisy sampled data. (b). Curve 1311 representing the optimal approximation of the data as given in (a) in the spline space $V_{(\phi_N)}$, N=0, starting with an approximation by a step function $f_{rec} \in V(\phi_0)$, i.e., N=0, in comparison with curve 1301 representing original signal with noise. (c). Same as (b) but with N=1. (d). Same as (b) but with N=2.

Figure 13B:
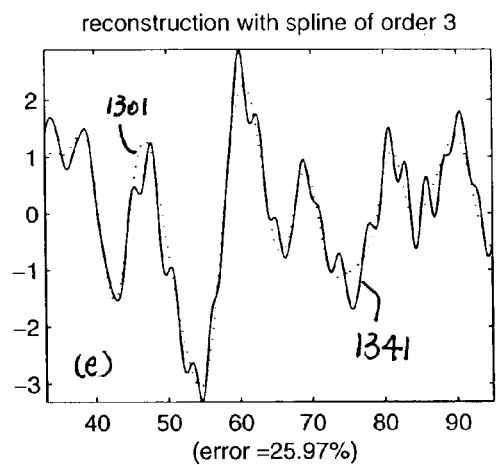
Figure 13B:
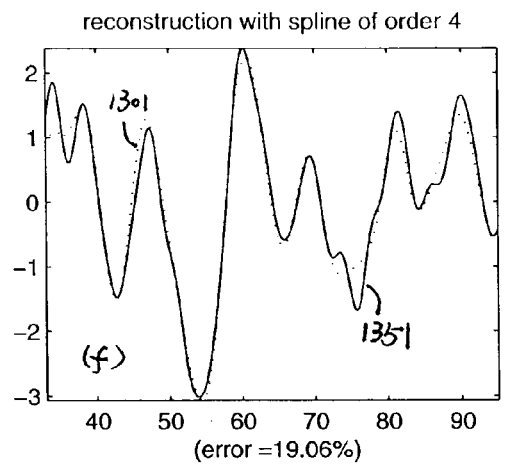
Figure 13B:
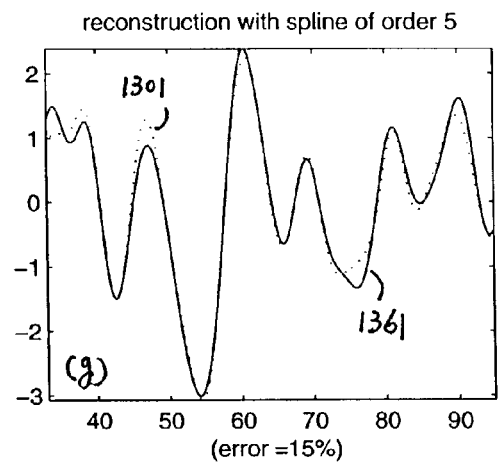
Figure 13B:
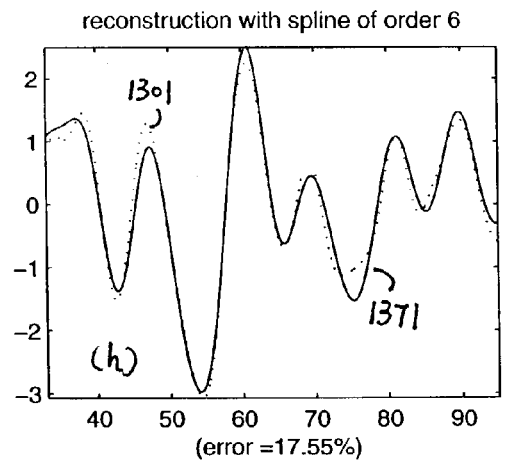

FIG. 13B schematically shows the dependence of the reconstruction on the generator $\phi$, where the generator $\phi$ is a B-spline of order N, i.e. $\phi N = X_{[-1/2,1/2]} * \ldots * _{[1/2,1/2]}$ (N+1-fold convolution) same as FIG. 13A. (e). Same as (b) of FIG. 13A but with N=3. (f). Same as (e) but with N=4. (e). Same as (b) but with N=5. (e). Same as (e) but with N=6.

Figure 14:
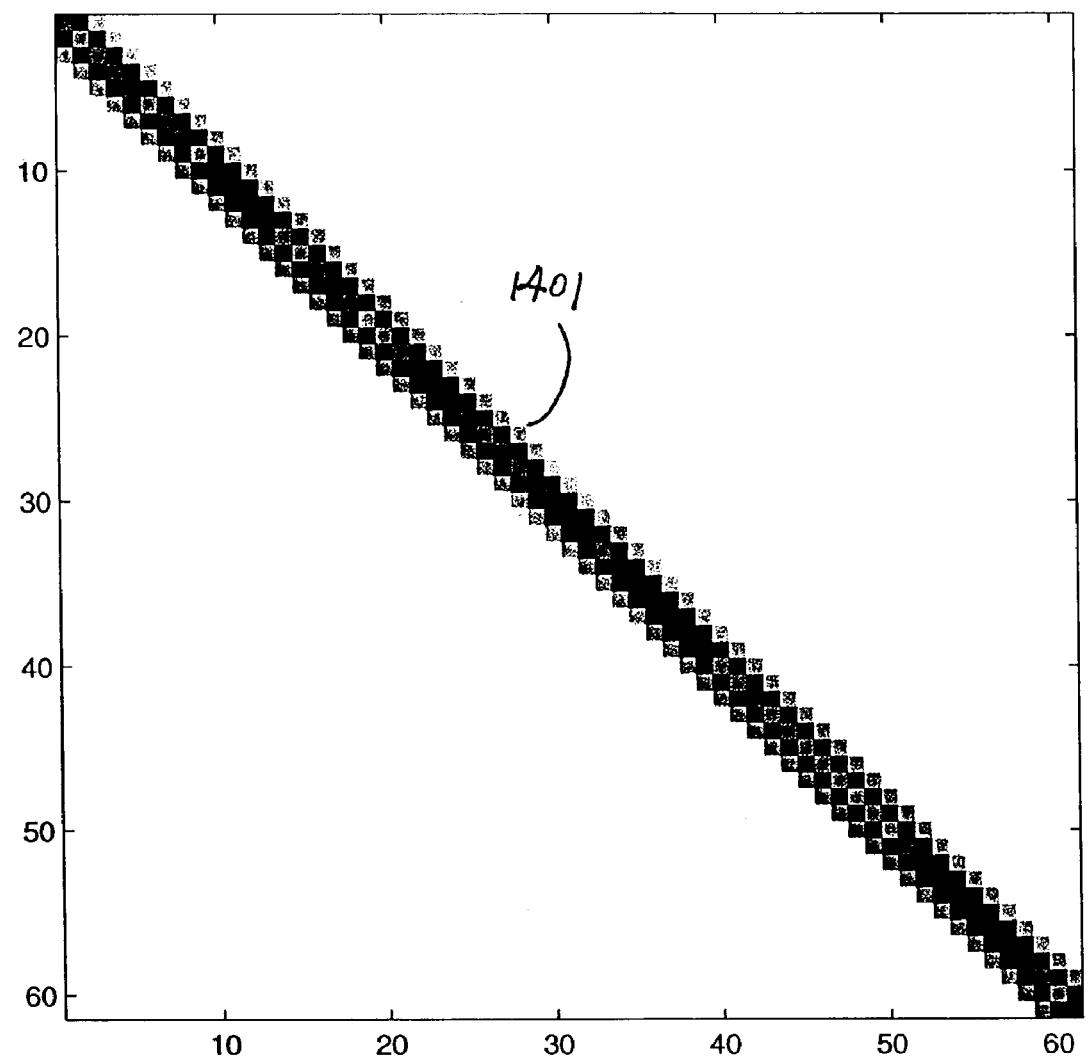

FIG. 14 schematically shows the associated banded matrix $\mathscr{F}$ of the linear system according to one embodiment of the present invention.

Figure 15:
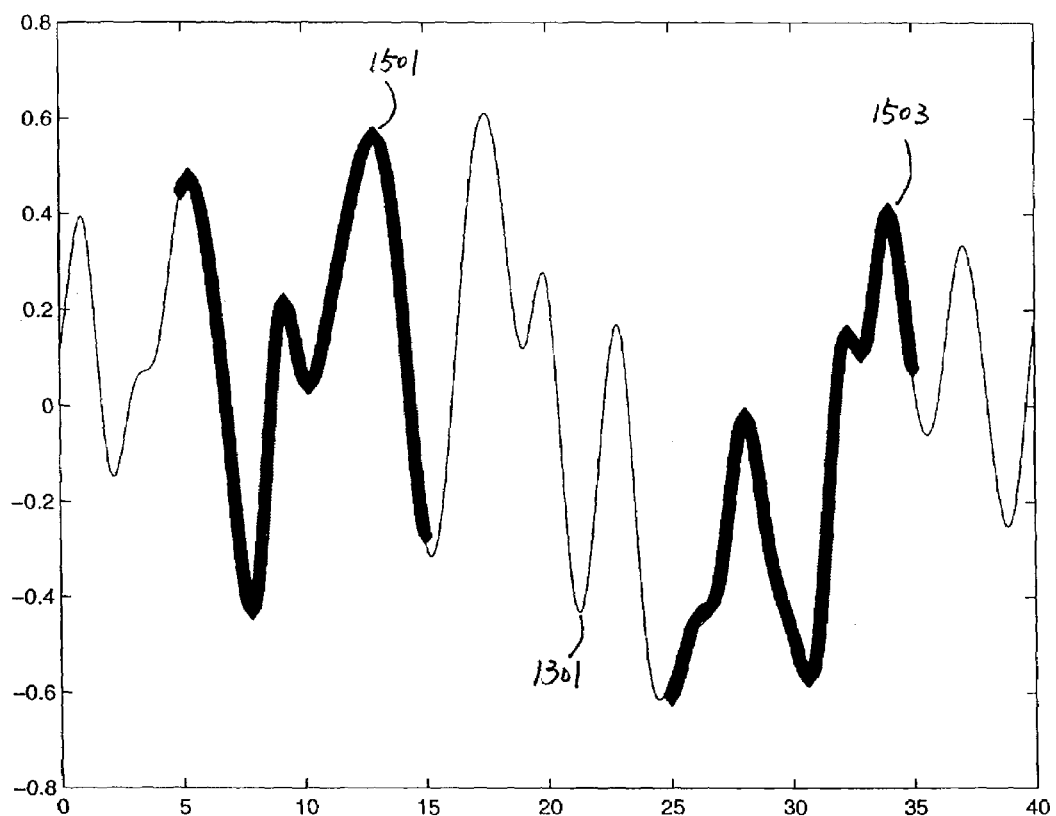

FIG. 15 schematically shows the power of the method of data segmentation according to one embodiment of the present invention.

DETAILED DESCRIPTION OF THE INVENTION

Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner in describing the compositions and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "about" or "approximately" shall generally mean within 20 percent, preferably within 10 percent, and more preferably within 5 percent of a given value or range. Numerical quantities given herein are approximate, meaning that the term "about" or "approximately" can be inferred if not expressly stated.

Several embodiments are now described with reference to the FIGS. 1-15, in which like numbers indicate like parts throughout the FIGS. 1-15.

Overview of the Inventive System

In general, the present invention can be practiced in association with an inventive system 100 as shown in FIG. 9. In one embodiment, the system 100 includes a computer 8 having a host processor 12 with a display 14, such as a monitor, having a graphic-user interface (GUI) 20 displaying data for at least one peripheral device 10. The host processor 12 includes at least one microprocessor. The peripheral device 10 can be an input device to receive data or out put device for output data, shown here as a printer, in operative communication with the host processor 12. The printer 10 and host processor 12 can be in communication through any media, such as a direct wire connection 18 or through a network or the Internet 16. Even wireless communication between the printer 10 and host processor 12 can be used with the present invention as long as data can be exchanged between the printer 10 and host processor 12. The GUI 20 is generated by a GUI code as part of the operating system (O/S) of the host processor 12. As those skilled in the art will appreciate, the data to be processed in the system 100 can be stored in a memory device (not shown), can be imported from a device (not shown) in communication with the system 100, or can be provided in the form of a computer readable medium. Examples of computer readable media include: recordable type media such as floppy disks and CD-ROMs and transmission type media such as digital and analog communication links. Likewise, the result of processed data can be displayed in GUI 20, printed by printer 10, saved in a memory device (not shown), processed in another device, transmitted over network 16 or can be, provided in the form of the computer readable medium. Furthermore, the system 100 can be operated to practice the present invention with other data processing software such as Matlab© and Labview©.

Computer 8 can be a mainframe computer, a workstation, a desktop computer, a portable computer, any combination of them, or the like. Indeed, several computers 8 can be coupled together to form a local network for parallel processing. Or, computers 8 can communicate to each other through network 16 such as Internet for processing data according to one embodiment of the present invention.

The processing unit of each computer may comprise a processor such as host processor 12. The input device may include a microprocessor interface. The input device further may include at least one device selected from the group of a GUI, a scanner, a CD-ROM, a diskette, a computer coupled to a network, a networking device, any combination of them, or the like. Additionally, the system may further include an output device coupled to the processing unit, wherein the output device comprises at least one device selected from the group of a GUI, a printer, a CD-ROM, a diskette, a computer coupled to a network, a networking device, any combination of them, or the like.

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as data are processed, sampled, converted, or the like according to the invention without regard for any particular theory or scheme of action.

EXAMPLES

Example 1

A Unified Framework for Uniform and Nonuniform Data Sampling in Shift Invariant Spaces Approach Overview Modern digital data processing of functions (or signals or images) always uses a discretized version of the original signal $f$ that is obtained by sampling $f$ on a discrete set. The question then arises whether and how $f$ can be recovered from its samples.

In one aspect, the present invention relates to a method for recovering information about an object of interest $f$ from a data set $\{f(x_j)\}$ obtained from uniform or nonuniform data sample points $x_j \in X$, j being an indexing number, X representing the set of points where the object of interest $f$ has been sampled, wherein X may be perturbed by a noise, comprising the steps of sampling a set of data samples from the data set $\{f(x_j)\}$, iteratively framing the sampled set of data samples until the sampled set of data samples converges to a new set of data samples that has a size significantly smaller than the data set $\{f(x_j)\}$, and reconstructing the object of interest $f$ from the new set of data samples.

1. Relevant Concepts

Sampling in Paley-Wiener Spaces: Bandlimited Functions

Since infinitely many functions can have the same sampled values on $X=\{x_j\}_{j \in J} \subset \mathbb{R}^d$, the sampling problem becomes meaningful only after imposing some a priori conditions on $f$.

The standard assumption is that the function $f$ on $\mathbb{R}^d$ belongs to the space of bandlimited functions $B_\Omega$; i.e., the Fourier transform $$\hat{f}(\xi) = \int_{\mathbb{R}^d} f(x) e^{-2\pi i \langle \xi, x \rangle} dx$$

of $f$ is such that $\hat{f}(\xi)=0$ for all $\xi \notin \Omega = [-\omega, \omega]^d$ for some $\omega < \infty$ (see, e.g., [15, 44, 47, 55, 62, 72, 78, 88, 51, 112] and the review papers [27, 61, 65]). The reason for this assumption is a classical result of Whittaker [114] in complex analysis which states that, for dimension d=1, a function $f \in L^2$ $(\mathbb{R}) \cap B_{[-1/2,1/2]}$ can be recovered exactly from its samples $\{f(k): k \in Z\}$ by the interpolation formula $$f(x) = \Sigma_{k \in Z} f(k) sinc(x-k) \tag{1.1}$$

where sinc (x)=sin $\pi x/\pi x$. This series gave rise to the uniform sampling theory of Shannon [96], which is fundamental in engineering and digital signal processing because it gives a framework for converting analog signals into sequences of numbers. These sequences can then be processed digitally and converted back to analog signals via (1.1).

Taking the Fourier transform of (1.1) and using the fact that the Fourier transform of the sinc function is the characteristic function $\chi_{[-1/2,1/2]}$ shows that for any $\xi \in [-½, ½]$ $$\hat{f}(\xi) = \sum_k f(k) e^{2\pi i k \xi} = \sum_k \langle \hat{f}, e^{2\pi i k \cdot} \rangle_{L^2(-1/2,1/2)} e^{2\pi i k \xi}.$$

Thus, reconstruction by means of the formula (1.1) is equivalent to the fact that the set $\{e^{i2\pi k \xi}, k \in Z\}$ forms an orthonormal basis of $L^2$ (−½, ½) called the harmonic Fourier basis. This equivalence between the harmonic Fourier basis and the reconstruction of a uniformly sampled bandlimited function has been extended to treat some special cases of nonuniformly sampled data. In particular, the results by Paley and Wiener [87], Kadec [71], and others on the nonharmonic Fourier bases $\{e^{i2\pi x_k \xi}, k \in Z\}$ can be translated into results about nonuniform sampling and reconstruction of bandlimited functions [15, 62, 89, 94]. For example, Kadec's theorem

[71] states that if $X=\{x\in\mathbb{R}:|x_k-k|\leq L<1/4\}$ for all $k\in Z$, then the set $\{e^{j2\pi x_k\xi}, k\in Z\}$ is a Riesz basis of $L^2(-1/2, 1/2)$; i.e., $\{e^{j2\pi x_k\xi}, k\in Z\}$ is the image of an orthonormal basis of $L^2(-1/2, 1/2)$ under a bounded and invertible operator from $L^2(-1/2, 1/2)$ onto $L^2(-1/2, 1/2)$. Using Fourier transform methods, this result implies that any bandlimited function $f\in L^2\cap B_{[-1/2, 1/2]}$ can be completely recovered from its samples $\{f(x_k), k\in Z\}$, as long as the sampling set is of the form $X$ $\{x_k\in\mathbb{R}:|x_k-k|<1/4\}_{k\in Z}$.

The sampling set $X=\{x_k\in\mathbb{R}:|x_k-k|<1/4\}_{k\in Z}$ in Kadec's theorem is just perturbation of $Z$. For more general sampling sets, the work of Beurling [23, 24], Landau [74], and others [18, 58] provides a deep understanding of the one-dimensional theory of nonuniform sampling of bandlimited functions. Specifically, for the exact and stable reconstruction of a bandlimited function $f$ from its samples $\{f(x_j):x_j\in X\}$, it is sufficient that the Beurling density $$D(X) = \lim_{r\to\infty} \inf_{y\in R} \frac{\#X \cap (y+[0,r])}{r} \quad (1.2)$$

satisfies $D(X)>1$. Conversely, if $f$ is uniquely and stably determined by its samples on $X\subset\mathbb{R}$, then $D(X)\geq 1$ [74]. The marginal case $D(X)=1$ is very complicated and is treated in [79, 89, 94].

It should be emphasized that these results deal with stable reconstructions. This means that an inequality of the form $$\|f\|_p \leq C\left(\sum_{x_j\in X}|f(x_j)|^p\right)^{1/p}$$

holds for all bandlimited functions $f\in L^p\cap B_\Omega$. A sampling set for which the reconstruction is stable in this sense is called a (stable) set of sampling. This terminology is used to contrast a set of sampling with the weaker notion of a set of uniqueness. $X$ is a set of uniqueness for $B_\Omega$ if $f|_X=0$ implies that $f=0$. Whereas a set of sampling for $B_{[1/2, 1/2]}$ has a density $D\geq 1$, there are sets of uniqueness with arbitrarily small density. See [73, 25] for examples and characterizations of sets of uniqueness.

While the theorems of Paley and Wiener and Kadec about Riesz bases consisting of complex exponentials $e^{j2\pi x_k\xi}$ are equivalent to statements about sampling sets that are perturbations of $Z$, the results about arbitrary sets of sampling are connected to the more general notion of frames introduced by Duffin and Schaeffer [40]. The concept of frames generalizes the notion of orthogonal bases and Riesz bases in Hilbert spaces and of unconditional bases in some Banach spaces [2, 5, 6, 12, 14, 15, 20, 28, 29, 46, 66, 97].

Sampling in Shift-Invariant Spaces

The series (1.1) shows that the space of bandlimited functions $B_{[1/2, 1/2]}$ is identical with the space $$V^2(\text{sinc}) = \left\{\sum_{k\in Z} c_k \text{sinc}(x-k) : (c_k) \in l^2\right\}. \quad (1.3)$$

Since the sinc function has infinite support and slow decay, the space of bandlimited functions is often unsuitable for numerical implementations. For instance, the pointwise evaluation $$f \mapsto f(x_0) = \sum_{k\in Z} c_k \text{sinc}(x_0-k)$$

is a nonlocal operation, because, as a consequence of the long-range behavior of sinc, many coefficients $c_k$ will contribute to the value $f(x_0)$. In fact, all bandlimited functions have infinite support since they are analytic. Moreover, functions that are measured in applications tend to have frequency components that decay for high frequencies, but these functions are not bandlimited in the strict sense. Thus, it has been advantageous to use non-bandlimited models that retain some of the simplicity and structure of bandlimited models but are more amenable to numerical implementation and are more flexible for approximating real data [13, 63, 64, 86, 103, 104]. One such example are the shift-invariant spaces that are discussed in this specification.

A shift-invariant space is a space of functions on $\mathbb{R}^d$ of the form $$V(\phi_1, \ldots, \phi_r) = \left\{\sum_{i=1}^r \sum_{j\in Z^d} c_j^i \phi_i(x-j)\right\}.$$

Such spaces have been used in finite elements and approximation theory [34, 35, 67, 68, 69, 98] and for the construction of multiresolution approximations and wavelets [32, 33, 39, 53, 60, 70, 82, 83, 95, 98, 99, 100]. They have been extensively studied in recent years (see, for instance, [6, 19, 52, 67, 68, 69]).

Sampling in shift-invariant spaces that are not bandlimited is a suitable and realistic model for many applications, e.g., for taking into account real acquisition and reconstruction devices, for modeling signals with smoother spectrum than is the case with bandlimited functions, or for numerical implementation [9, 13, 22, 26, 85, 86, 103, 104, 107, 110, 115, 116]. These requirements can often be met by choosing "appropriate" functions $\phi_i$. This may mean that the functions $\phi_i$ have a shape corresponding to a particular "impulse response" of a device, or that they are compactly supported, or that they have a Fourier transform $|\hat{\phi}_i(\xi)|$ that decays smoothly to zero as $|\xi|\to\infty$.

Uniform Sampling in Shift-Invariant Spaces

Early results on sampling in shift-invariant spaces concentrated on the problem of uniform sampling [7, 9, 10, 11, 37, 64, 105, 108, 113, 116] or interlaced uniform sampling [110]. The problem of uniform sampling in shift-invariant spaces shares some similarities with Shannon's sampling theorem in that it requires only the Poisson summation formula and a few facts about Riesz bases [7, 9]. The connection between interpolation in spline spaces, filtering of signals, and Shannon's sampling theory was established in [11, 109]. These results imply that Shannon's sampling theory can be viewed as a limiting case of polynomial spline interpolation when the order of the spline tends to infinity [11, 109]. Furthermore, Shannon's sampling theory is a special case of interpolation in shift-invariant spaces [7, 9, 113, 116] and a limiting case for the interpolation in certain families of shift-invariant spaces $V(\phi'')$ that are obtained by a generator $\phi''=\phi^* \ldots * \phi$ consisting of the n-fold convolution of a single generator $\phi$ [9].

In applications, signals do not in general belong to a prescribed shift-invariant space. Thus, when using the bandlimited theory, the common practice in engineering is to force the function $f$ to become bandlimited before sampling. Mathematically, this corresponds to multiplication of the Fourier transform $\hat{f}$ of $f$ by a characteristic function $\chi_\Omega$. The new function $f_a$ with Fourier transform $\hat{f}=\hat{f}\chi_\Omega$ is then sampled and stored digitally for later processing or reconstruction. The multiplication by $\chi_\Omega$ before sampling is called prefiltering with an ideal filter and is used to reduce the errors in reconstructions called aliasing errors. It has been shown that the three steps of the traditional uniform sampling procedure, namely prefiltering, sampling, and postfiltering for reconstruction, are equivalent to finding the best $L^2$-approximation of a function in $L^2 \cap B_\Omega$ [9, 105]. This procedure generalizes to sampling in general shift-invariant spaces [7, 9, 10, 85, 105, 108]. In fact, the reconstruction from the samples of a function should be considered as an approximation in the shift-invariant space generated by the impulse response of the sampling device. This allows a reconstruction that optimally fits the available samples and can be done using fast algorithms [106, 107].

Nonuniform Sampling in Shift-Invariant Spaces

The problem of nonuniform sampling in general shift-invariant spaces is more recent [4, 5, 30, 66, 75, 76, 77, 102, 119]. The earliest results [31, 77] concentrate on perturbation of regular sampling in shaft-invariant spaces and are therefore similar in spirit to Kadec's result for bandlimited functions. For the $L^2$ case in dimension d=1, and under some restrictions on the shift-invariant spaces, several theorems on nonuniform sampling can be found in [76, 102]. Moreover, a lower bound on the maximal distance between two sampling points needed for reconstructing a function from its samples was given for the case of polynomial splines and other special cases of shift-invariant spaces in [76]. For the general multivariate case in $L^p$, the theory was developed in [4], and for the case of polynomial spline shift-invariant spaces, the maximal allowable gap between samples was obtained in [5]. For general shift-invariant spaces, a Beurling density $D \geqq 1$ is necessary for stable reconstruction [5]. As in the case of bandlimited functions, the theory of frames is central in nonuniform sampling of shift-invariant spaces, and there is an equivalence between a certain type of frame and the problem of sampling in shift-invariant spaces [5, 66, 75].

Among other things, one aim of the present invention is to provide a unified framework for uniform and nonuniform sampling in shift-invariant spaces. This is accomplished by bringing together wavelet theory, frame theory, reproducing kernel Hilbert spaces, approximation theory, amalgam spaces, and sampling. This combination simplifies some parts of the literature on sampling.

The description below contains several new results. In particular, all the well-known results are developed in weighted $L^p$-spaces. Extensions of frame theory and reproducing kernel Hilbert spaces to Banach spaces are discussed, and the connections between reproducing kernels in weighted $L^p$-spaces, Banach frames, and sampling are described.

The rest of this Example is organized as follows. Next section, section 2, introduces the relevant spaces for sampling theory and presents some of their properties. Weighted $L^p$-spaces and sequence spaces are defined. Wiener amalgam spaces are discussed and we also derive some convolution relations in the style of Young's inequalities. The weighted $L^p$-shift-invariant spaces are then introduced in, and some of their main properties are established. The sampling problem in weighted shift-invariant spaces is subsequently disclosed in section 3. Next, in section 4, some aspects of reproducing kernel Hilbert spaces and frame theory are reviewed. The discussion includes an extension of frame theory and reproducing kernel Hilbert spaces to Banach spaces. The connections between reproducing kernels in weighted $L^p$-spaces, Banach frames, and sampling are also discussed. Frame algorithms for the reconstruction of a function from its samples are discussed in section 5 and so are iterative reconstructions in section 6. In applications, a function $f$ does not belong to a particular prescribed space V, in general. Moreover, even if the assumption that a function $f$ belongs to a particular space V is valid, the samples of $f$ are not exact due to digital inaccuracy, or the samples are corrupted by noise when they are obtained by a real measuring device. For this reason, the results of the various reconstruction algorithms when the samples are corrupted by noise are presented in section 7 as well, which is an important issue in practical applications. Theorems and lemmas given in this disclosure can be and have been proved by the inventors. Interested reader can find detailed proof and related discussions in reference [f], which is hereby incorporated herein by reference in its entirety.

2. Relevant Spaces

Function Spaces

This section, among other things, provides the basic framework for treating nonuniform sampling in weighted shift-invariant spaces. The shift-invariant spaces under consideration are of the form $$V(\phi) = \left\{ \sum_{k \in Z^d} c_k \phi(\cdot - k) \right\} \quad (2.1)$$

where $c=(c_k)_{k \in Z^d}$ is taken from some sequence space and $\phi$ is the so-called generator of $V(\phi)$. Before it is possible to give a precise definition of shift-invariant spaces, one needs to study the convergence properties of the series $$\left\{ \sum_{k \in Z^d} c_k \phi(\cdot - k) \right\}.$$

In the context of the sampling problem the function s in $V(\phi)$ must also be continuous. In addition, one may want to control the growth or decay at infinity of the functions in $V(\phi)$. Thus the generator $\phi$ and the associated sequence space cannot be chosen arbitrarily. To settle these questions, we first discuss weighted $L^p$-spaces with specific classes of weight functions, and we then develop the main properties of amalgam spaces. Only then we give a rigorous definition of a shift-invariant space and derive its main properties in next section. Shift-invariant spaces figure prominently in other areas of applied mathematics, notably in wavelet theory and approximately theory [33, 34]. Our presentation will be adapted to the requirements of sampling theory.

Weighted $L^p_\nu$-Spaces

To model decay or growth of functions, we use weighted $L^p$-spaces [41]. A function $f$ belongs to $L^p_\nu(\mathbb{R}^d)$ with weight function $\nu$ if $\nu f$ belongs to $L^p(\mathbb{R}^d)$. Equipped with the norm $\|f\|_{L^p_v} = \|vf\|_{L^p}$, the space $L^p_v$ is a Banach space. If the weight function v grow rapidly as $|x| \to \infty$, then the functions in $L^p_v$ decay roughly at a corresponding rate. Conversely, if the weight function v decays rapidly, then the functions in $L^p_v$ may grow as $|x| \to \infty$.

In general, a weight function is just a nonnegative function v. We will use two special types of weight functions as examples. The weight functions denoted by X are always assumed to be continuous, symmetric, i.e., $\omega(x) = \omega(-x)$, positive, and submultiplicative:

$$0 < \omega(x+y) \leq \omega(x)\omega(y) \; \forall x, y \in \mathbb{R}^d \quad (2.2)$$

This submultiplicativity condition implies that $\omega(x) \geq \omega(0) \geq 1$ for all $x \in \mathbb{R}^d$. For a technical reason, we impose the growth condition $$\sum_{n=1}^{\infty} \frac{\log \omega(nk)}{n^2} < \infty \; \forall k \in \mathbb{Z}^d.$$

Although most of the results do not require this extra condition on $\omega$, we use it in Lemma 2.11. This condition, however, does not limit in any way the scope of the invention. For simplicity we refer to $\omega$ as a submultiplicative weight. A prototypical example is the Sobolev weight $\omega(x) = (1+|x|)^\alpha$, with $\alpha > 0$. When $\omega = 1$, we obtain the usual $L^p$-spaces.

In addition, a weight function v is called moderate with respect to the submultiplicative weight $\omega$ or simply $\omega$-moderate, if it is continuous, symmetric, and positive and satisfies $C \omega(-x)v(y) \geq v(x+y)$ for all $x, y \in \mathbb{R}^d$. For instance, the weights $v(x) = (1+|x|)^\beta$ are moderate with respect to $\omega(x) = (1+|x|)^\alpha$ if and only if $|\beta| \leq \alpha$. If v is $\omega$-moderate, then $C \omega(-x) v(x+y) \geq v(y) = v(x+y-x)$, and it follows that:

$$\frac{1}{v(x+y)} \leq C\omega(x) \frac{1}{v(y)}.$$

Thus, the weight $1/v$ is also $\omega$-moderate.

If v is $\omega$-moderate, then a simple computation shows that $$\|f(\cdot - y)\|_{L^p_v} \leq C\omega(y)\|f\|_{L^p_v}$$

and in particular, $\|f(\cdot -y)\|_{L^p_\omega} \leq \omega(y)\|f\|_{L^p_\omega}$. Conversely, if $L^p_v$ is translation-invariant, then $$\omega(x) = \sup_{\|f\|_{L^p_v} \leq 1} \|f(\cdot -x)\|_{L^p_v}$$

is submultiplicative and v is $\omega$-moderate. To see this, we note that $$\omega(x) = \sup_{\|f\|_{L^p_v} \leq 1} \|f(\cdot -x)\|_{L^p_v}$$

is the operator norm of the translation operator $f \to f(\cdot - x)$. Since operator norms are submultiplicative, it follows that $\omega(x)\omega(y) \geq \omega(x+y)$. Moreover, $$\int_{\mathbb{R}^d} |f(t-x)|^p v(t)^p dt = \int_{\mathbb{R}^d} |f(t)|^p v(t+x)^p dt \leq \omega(x)^p \int_{\mathbb{R}^d} |f(t)|^p v(t)^p dt$$

Thus, $\omega(x) v(y) \geq v(x+y)$, and therefore the weighted $L^p$-spaces with a moderate weight are exactly the translation-invariant spaces.

We also consider the weighted sequence spaces $l^p_v(\mathbb{Z}^d)$ with weight v: a sequence $\{(c_k): k \in \mathbb{Z}^d\}$ belongs to $l^p_v$ if $((cv)_k) = (c_k v_k)$ belongs to $l^p$ with norm $\|c\|_{l^p_v} = \|vc\|_{l^p}$, where $(v_k)$ is the restriction of v to $\mathbb{Z}^d$.

Wiener Amalgam Spaces

For the sampling problem we also need to control the local behavior of functions so that the sampling operation $f \to (f(x_j))_{j \in J}$ is at least well defined. This is done conveniently with the help of the Wiener amalgam spaces $W(L^p_v)$. These consist of functions that are "locally in $L^\infty$ and globally in $L^p_v$." To be precise, a measurable function $f$ belongs to $W(L^p_v)$, $1 \leq p < \infty$, if it satisfies $$\|f\|^p_{W(L^p_v)} = \sum_{k \in \mathbb{Z}^d} ess \, sup\{|f(x+k)|^p v(k)^p; x \in [0,1]^d\} < \infty \quad (2.3)$$

If $p = \infty$, a measurable function $f$ belongs to $W(L^\infty_v)$ if it satisfies $$\|f\|_{W(L^\infty_v)} = \sup_{k \in \mathbb{Z}^d} \{ess \, sup\{|f(x+k)|v(k); x \in [0,1]^d\}\} < \infty. \quad (2.4)$$

Note that $W(L^\infty_v)$ coincides with $L^\infty_v$.

Endowed with this norm, $W(L^p_v)$ becomes a Banach space [43, 45]. Moreover, it is translation invariant; i.e., if $f \in W(L^p_v)$, then $f(\cdot -y) \in W(L^p_v)$ and $$\|f(\cdot -y)\|_{W(L^p_v)} \leq C\omega(y)\|f\|_{W(L^p_v)}.$$

The subspace of continuous functions $W_0(L^p_v) = W(C, L^p_v) \subset W(L^p_v)$ is a closed subspace of $W(L^p_v)$ and thus also a Banach space [43, 45]. We have the following inclusions between the various spaces.

THEOREM 2.1. Let v be $\omega$-moderate and $1 \leq p \leq q \leq \infty$. Then the following inclusions hold:
(i) $W_0(L^p_v) \subset W_0(L^q_v)$ and $W(L^p_v) \subset W(L^q_v) \subset L^p_v$
(ii) $W_0(L^p_v) \subset W_0(L^p_v)$, $W(L^p_\omega) \subset W(L^p_v)$, and $L^p_\omega \subset L^p_v$ The following convolution relations in the style of Young's theorem [118] are useful.

THEOREM 2.2. Let v be $\omega$-moderate.
(i) If $f \in L^p_v$ and $g \in L^1_\omega$, then $f*g \in L^p_v$ and $\|f*g\|_{L^p_v} \leq C\|f\|_{L^p_v}\|g\|_{L^1_\omega}$
(ii) If $f \in L^p_v$ and $g \in W(L^1_\omega)$, then $f*g \in W(L^p_v)$ and $\|f*g\|_{W(L^p_v)} \leq C\|f\|_{L^p_v}\|g\|_{W(L^1_\omega)}$
(iii) If $c \in l^p_v$ and $d \in l^1_\omega$, then $c*d \in l^p_v$ and $\|c*d\|_{l^p_v} \leq C\|c\|_{l^p_v}\|d\|_{l^1_\omega}$ Remark 2.1. Amalgam spaces and their generalizations have been investigated by Feichtinger, and the results of Theorem 2.1 can be found in [42, 43, 45, 44]. The results and methods developed by Feichtinger can also be used to deduce Theorem 2.2. However, for the sake of completeness, in section 2.4 we present direct proofs of Theorems 2.1 and 2.2 that do not rely on the deep results of amalgam spaces Shift-Invariant Spaces Among other things, this section discusses shift-invariant spaces and their basic properties. Although some of the following observations are known in wavelet and approximately theory, they have received little attention in connection with sampling.

Given a so-called generator $\phi$, we consider shift-invariant spaces of the form $$V_v^p(\phi) = \left\{ \sum_{k \in Z^d} c_k \phi(\cdot - k) : c \in l_v^p \right\} \quad (2.5)$$

If $v=1$, we simply write $V^p(\phi)$. The weight function $v$ controls the decay or growth rate of the functions in $V_v^p(\phi)$. To some extent, the parameter p also controls the growth of the functions in $V_v^p(\phi)$ but more importantly, p controls the norm we wish to use for measuring the size of our functions. For some applications in image processing, the choice p=1 is appropriate [36]; p=2 corresponds to the energy norm, and p=∞ is used as a measure in some quality control applications. Moreover, the smoothness of a function and its appropriate value of p, $1 \leq p < \infty$, for a given class of signals or images can be estimated using wavelet decomposition techniques [36]. The determination of p and the signal smoothness are used for optimal compression and coding of signals and images.

For the spaces $V_v^p(\phi)$ to be well defined, some additional conditions on the generator $\phi$ must be imposed. For v=1 and p=2, the standard condition in wavelet theory is often stated in the Fourier domain as $$0 < m \leq \hat{a}_\phi(\xi) = \sum_{j \in Z^d} |\hat{\phi}(\xi + j)|^2 \leq M < \infty \text{ for almost every } \xi, \text{ for} \quad (2.6)$$

some constants m>0 and M>0 [80, 81]. This condition implies that $V^2(\phi)$ is a closed subspace of $L^2$ and that $\{\phi(\cdot - k) : k \in Z^d\}$ is a Riesz basis of $V^2(\phi)$, i.e., the image of an orthonormal basis under an invertible linear transformation [33].

The theory of Riesz bases asserts the existence of a dual basis. Specifically, for any Riesz basis for $V^2(\phi)$ of the form $\{\phi(\cdot - k) : k \in Z^d\}$, there exists a unique function $\tilde{\phi} \in V^2(\phi)$ such that $\{\tilde{\phi}(\cdot - k) : k \in Z^d\}$ is also a Riesz basis for $V^2(\phi)$ and such that $\tilde{\phi}$ satisfies the biorthogonality relation $$\langle \phi(\cdot), \tilde{\phi}(\cdot - k) \rangle = \delta(k)$$

Where $\delta(0)=1$ and $\delta(k)=0$ for $k \neq 0$. Since the dual generator $\tilde{\phi}$ belongs to $V^2(\phi)$, it can be expressed in the form $$\tilde{\phi}(\cdot) = \sum_{k \in Z^d} b_k \phi(\cdot - k). \quad (2.7)$$

The coefficients $(b_k)$ are determined explicitly by the Fourier series $$\sum_{k \in Z^d} b_k e^{2\pi i k \xi} = \left( \sum_{k \in Z^d} |\hat{\phi}(\xi + k)|^2 \right)^{-1};$$

i.e., $(b_k)$ is the inverse Fourier transform of $$\left( \sum_{k \in Z^d} |\hat{\phi}(\xi + k)|^2 \right)^{-1}$$

(see, for example, [8, 9]. Since $a_\phi(\xi)^{-1} \leq 1/m$ by (2.6), the sequence $(b_k)$ exists and belongs to $l^2(Z^d)$.

In order to handle general shift-invariant spaces $V_v^p(\phi)$ instead of $V^2(\phi)$, we need more information about the dual generator. The following result is one of the central results in this disclosure and is useful for the treatment of general shift-invariant spaces.

THEOREM 2.3. Assume that $\phi \in W(L_\omega^1)$ and that $\{\phi(\cdot - k) : k \in Z^d\}$ is a Riesz basis for $V^2(\phi)$. Then the dual generator $\tilde{\phi}$ is in $W(L_\omega^1)$.

As a corollary, we obtain the following theorem.

THEOREM 2.4. Assume that $\phi \in W(L_\omega^1)$ and that v is ω-moderate.

(i) The space $V_v^p(\phi)$ is a subspace (not necessarily closed) of $L_v^p$ and $W(L_v^p)$ for any p with $1 \leq p \leq \infty$.

(ii) If $\{\phi(\cdot - k) : k \in Z^d\}$ is a Riesz basis of $V^2(\phi)$, then there exist constants $m_p > 0$, $M_p > 0$ such that $$m_p \|c\|_{l_v^p} \leq \left\| \sum_{k \in Z^d} c_k \phi(\cdot - k) \right\|_{L_v^p} \leq M_p \|c\|_{l_v^p} \quad \forall c \in l_v^p(Z^d) \quad (2.8)$$

is satisfied for all $1 \leq p \leq \infty$ and all ω-moderate weights v. Consequently, $\{\phi(\cdot - k) : k \in Z^d\}$ is an unconditional basis for $V_v^p(\phi)$ for $1 \leq p \leq \infty$, and $V_v^p(\phi)$ is a closed subspace of $L_v^p$ and $W(L_v^p)$ for $1 \leq p \leq \infty$.

The theorem says that the inclusion in Theorem 2.4(i) and the norm equivalence (2.8) hold simultaneously for all p and all ω-moderate weights, provided that they hold for the Hilbert space $V^2(\phi)$. But in $V^2(\phi)$, the Riesz basis property (2.8) is much easier to check. In fact, it is equivalent to inequalities (2.6). In equalities (2.8) imply that $L_v^p$ and $V_v^p(\phi)$ are isomorphic Banach spaces and that the set $\{\phi(\cdot - k) : k \in Z^d\}$ is an unconditional basis of $V_v^p(\phi)$. In approximation theory we say that $\phi$ has stable integer translates and is a stable generator [67, 68, 69]. When v=1 the conclusion (2.8) of Theorem 2.4 is well known and can be found in [67, 68, 69].

As a corollary of Theorem 2.4, we obtain the following inclusions among shift-invariant spaces.

COROLLARY 2.5. Assume that $\phi \in W(L^1_\omega)$ and that $v$ is $\omega$-moderate. Then $$V^1_\omega(\phi) \subset V^p_\omega(\phi) \subset V^q_\omega(\phi) \text{ for } 1 \leq p \leq q \leq \infty$$

and $$V^q_\omega(\phi) \subset V^\infty_\omega(\phi) \text{ for } 1 \leq q \leq \infty.$$

3. The Sampling Problem in Weighted Shift-Invariant Spaces $V^p_v(\phi)$

For a reasonable formulation of the sampling problem in $V^p_v(\phi)$ the point evaluations $f \to f(x)$ must be well defined. Furthermore, a small variation in the sampling point should produce only a small variation in the sampling value. As a minimal requirement, we need the functions in $V^p_v(\phi)$ to be continuous, which is guaranteed by the following statement.

THEOREM 3.1. Assume that $\phi \in W_0(L^1_\omega)$, that $\phi$ satisfies (2.6), and that $v$ is $-\omega$-moderate.

(i) $V^p_v(\phi) \subset W_0(L^p_v)$ for all $p, 1 \leq p \leq \infty$
(ii) If $f \in V^p_v(\phi)$, then we have the norm equivalences $\|f\|_{L^p_v} \approx \|c\|_{l^p_v} \approx \|f\|_{W(L^p_v)}$
(iii) If $X = \{X_j : j \in J\}$ is such that in $f_{j,l} |x_j - x_l| > 0$, then $$\left( \sum_{x_k \in X} |f(x_k)|^p |v(x_k)|^p \right)^{\frac{1}{p}} \leq C_p \|f\|_{L^p_v} \quad \forall f \in V^p_v(\phi). \tag{3.1}$$

In particular, if $\phi$ is continuous and has compact support, then the conclusions (i)-(iii) hold.

A set $X = \{x_j : j \in J\}$ satisfying in $f_{j,l} |x_j - x_l| > 0$ is called separated.

Inequality (3.1) has two interpretations. It implies that the sampling operator $S_X : f \to f|_X$ is a bounded operator from $V^p_v(\phi)$ into the corresponding sequence space $$l^p_v(X) = \left\{ (c_j) : \left( \sum_{j \in J} |c_j|^p v(x_j)^p \right)^{\frac{1}{p}} < \infty \right\}$$

Equivalently, the weighted sampling operator $S_X : f v|_X$ is a bounded operator from $V^p_v(\phi)$ into $L^p$.

To recover a function $f \in V^p_v(\phi)$ from its samples, we need a converse of inequality (3.1). Following Landau [74], we say that $X$ is a set of sampling for $V^p_v(\phi)$ if $$c_p \|f\|_{L^p_v} \leq \left( \sum_{x_j \in X} |f(x_j)|^p |v(x_j)|^p \right)^{\frac{1}{p}} \leq C_p \|f\|_{L^p_v} \tag{3.2}$$

where $c_p$ and $C_p$ are positive constants independent of $f$.

The left-hand inequality implies that if $f(x_j) = 0$ for all $x_j \in X$, then $f = 0$. Thus $X$ is a set of uniqueness. Moreover, the sampling operator $S_X$ can be inverted on its range and $S_X^{-1}$ is a bounded operator from Range $(S_X) \subset l^p_v(X)$ to $V^p_v(\phi)$. Thus (3.2) says that a small change of a sampled value $f(x_j)$ causes only a small change of $f$. This implies that the sampling is stable or, equivalently, that the reconstruction of $f$ from its samples is continuous. As pointed out in section 1, every set of sampling is a set of uniqueness, but the converse is not true. For practical considerations and numerical implementations, only sets of sampling are of interest, because only these can lead to robust algorithms.

A solution to the sampling problem may include, among other things, the following two parts:

(a) Given a generator $\phi$, we need to find conditions on X, usually in the form of a density, such that the norm equivalence (3.2) holds. Then, at least in principle, $f \in V^p_v(\phi)$ is uniquely and stably determined by $f|_X$.

(b) We need to design reconstruction procedures that are useful and efficient in practical applications. The objective is to find efficient and fast numerical algorithms that recover $f$ from its samples $f|_X$, when (3.2) is satisfied.

Remark 3.1

(i) The hypothesis that X be separated is for convenience only and is not essential. For arbitrary sampling sets, we can use adaptive weights to compensate for the local variations of the sampling density [48, 49]. Let $V_j = \{x \in \mathbb{R}^d : |x - x_j| \leq |x - x_k| \text{ for all } k \approx j\}$ be the Voronoi region at $x_j$, and let $\gamma_j = \lambda(V_j)$ be the size of $V_j$. Then X is a set of sampling for $V^p_v(\phi)$ if $$c_p \|f\|_{L^p_v} \leq \left( \sum_{x_j \in X} |f(x_j)|^p \gamma_j |v(x_j)|^p \right)^{\frac{1}{p}} \leq C_p \|f\|_{L^p_v}$$

In numerical applications the adaptive weights $\gamma_j$ are used as a cheap device for preconditioning and for improving the ratio $C_p/c_p$, the condition number of the set of sampling [49, 101].

(ii) The assumption that the samples $\{f(x_j) : j \in J\}$ can be measured exactly is not realistic. A better assumption is that the sampled data is of the form $$g_{x_j} = \int_{\mathbb{R}^d} f(x) \psi_{x_j}(x) dx \tag{3.3}$$

where $\{\psi_{x_j} : x_j \in X\}$ is a set of functionals that act on the function $f$ to produce the data $\{g_{x_j} : x_j \in X\}$. The functionals $\{\psi_{x_j} : x_j \in X\}$ may reflect the characteristics of the sampling devices. For this case, the well-posedness condition (3.2) must be replaced by $$c_p \|f\|_{L^p} \leq \left( \sum_{x_j \in X} |g_{x_j}(f)|^p \right)^{\frac{1}{p}} \leq C_p \|f\|_{L^p} \tag{3.4}$$

where $g_{x_j}$ are defined by (3.3) and where $c_p$ and $C_p$ are positive constants independent of $f$ [1].

4. Reproducing Kernel Hilbert Spaces, Frames, and Nonuniform Sampling

As disclosed above, results of Paley and Wiener and Kadec relate Riesz bases consisting of complex exponentials to sampling sets that are perturbations of Z. More generally, the appropriate concept for arbitrary sets of sampling in shift-invariant spaces is the concept of frames discussed below.

Frame theory generalizes and encompasses the theory of Riesz bases and enables us to translate the sampling problem into a problem of functional analysis. The connection between frames and sets of sampling is established by means of reproducing kernel Hilbert spaces ("RKHSs"), discussed below. Frames are introduced in next section, and the relation between RKHSs frames, and sets of sampling is developed subsequently.

RKHSs

Theorem 3.1 (iii) holds for arbitrary separated sampling sets, so in particular Theorem 3.1 (iii) shows that all point evaluations $f \to f(x)$ are continuous linear functionals on $V^p_v(\phi)$ for all $x \in \mathbb{R}^d$. Since $V^p_v(\phi) \subset L^p_v$ and the dual space of $L^p_v$ is $L^{p'}_{1/v}$, where $1/p+1/p'=1$, there exists a function $K_x \in L^{p'}_v$ such that $$f(x) = \langle f, K_x \rangle = \int_{\mathbb{R}^d} f(t) \overline{K_x(t)} dt$$

for all $f \in V^p_v(\phi)$. In addition, it will be shown that $K_x \in V^p_{1/v}(\phi)$ In the case of a Hilbert space H of continuous functions on $\mathbb{R}^d$, such as $V^2(\phi)$, the following terminology is used. A Hilbert space is an RKHS [117] if, for any $x \in \mathbb{R}^d$, the pointwise evaluation $f \to f(x)$ is a bounded linear functional on H. The unique functions $K_x \to H$ satisfying $f(x) = \langle f, K_x \rangle$ are called the reproducing kernels of H.

With this terminology we have the following consequence of Theorem 3.1.

THEOREM 4.1. Let v be ω-moderate. If $\phi \in W_0(L^1_\omega)$, then the evaluations $f \to f(x)$ are continuous functionals, and there exist functions $K_x \in V^1_\omega(\phi)$ such that $f(x) = \langle f, K_x \rangle$. The kernel functions are given explicitly by $$K_x(y) = \sum_{k \in \mathbb{Z}^d} \overline{\phi(x-k)} \tilde{\phi}(y-k) \tag{4.1}$$

In particular, $V^2(\phi)$ is an RKHS.

The above theorem is a reformulation of Theorem 3.1. We only need to prove the formula for the reproducing kernel. Note that $K_x$ in (4.1) is well defined: since $\phi \in W_0(L^1_\omega)$, Theorem 2.3 combined with Theorem 3.1 (iii) implies that the sequence $\{\phi(x-k):k \in \mathbb{Z}^d\}$ belongs to $l^1_\omega$. Thus, by the definition of $V^1_\omega(\phi)$, we have $K_x \in V^1_\omega(\phi)$, and so $K_x \in V^p_v(\phi)$ for any p with $1 \leq p \leq \infty$ and any ω-moderate weight v. Furthermore, $K_x$ is clearly the reproducing kernel, because if $f(x) = \Sigma_k c_K \phi(x-k)$, then $$\langle f, K_x \rangle = \sum_{j,k} c_j \phi(x-k) \langle \phi(\cdot - j), \tilde{\phi}(\cdot -k) \rangle = \sum_k c_k \phi(x-k) = f(x)$$

Frames

In order to reconstruct a function $f \in V^p_v(\phi)$ from its samples $f(x_j)$, it is sufficient to solve the (infinite) system of equations $$\sum_{k \in \mathbb{Z}^d} c_k \phi(x_j - k) = f(x_j) \tag{4.2}$$

for the coefficients $(c_k)$. If we introduce the infinite matrix U with entries $$U_{jk} = \phi(x_j - k) \tag{4.3}$$

indexed by $X \times \mathbb{Z}^d$, then the relation between the coefficient sequence c and the samples is given by $$Uc = f|_X.$$

Theorem 3.1(ii) and (iii) imply that $f|_X \in l^p_v(X)$. Thus U maps $l^p_v(\mathbb{Z}^d)$ into $l^p_v(X)$.

Since $f(x) = \langle f, K_x \rangle$, the sampling inequality (3.2) implies that the set of reproducing kernels $\{K_{xj}, x_j \in X\}$ spans $V^{p'}_{1/v}$. This observation leads to the following abstract concepts.

A Hilbert frame (or simply a frame) $\{e_j : j \in J\}$ of a Hilbert space H is a collection of vectors in H indexed by a countable set J such that $$A\|f\|^2_H \leq \sum_j |\langle f, e_j \rangle|^2 \leq B\|f\|^2_H \tag{4.4}$$

for two constants A, B>0 independent of $f \in H$[40].

More generally, a Banach frame for a Banach space B is a collection of functionals $\{e_j : j \in J\} \subset B^*$ with the following properties [54].

(a) There exists an associated sequence space $B_d$ on the index set J, such that $$A\|f\|_B \leq \left\| (\langle f, e_j \rangle)_{j \in J} \right\|_{B_d} \leq B\|f\|_B$$

for two constants A,B>0 independent of $f \in B$.

(b) There exists a so-called reconstruction operator R from $B_d$ into B such that $$R\left( (\langle f, e_j \rangle)_{j \in J} \right) = f$$

Relations between RKHSs, Frames, and Nonuniform Sampling

The following theorem translates the different terminologies that arise in the context of sampling theory [2, 40, 74].

THEOREM 4.2 The following are equivalent:

(i) $X = \{x_j : j \in J\}$ is a set of sampling for $V^p_v(\phi)$.

(ii) For the matrix U in (4.3), there exist a, b>0 such that $$a\|c\|_{l^p_v} \leq \|Uc\|_{l^p_v(X)} \leq b\|c\|_{l^p_v} \; \forall \; c \in l^p_v$$

(iii) There exist positive constants a>0 and b>0 such that $$a\|f\|_{L^p_v} \leq \left( \sum_{x_j \in X} |f(x_j)|^p |v(x_j)|^p \right)^{1/p} \leq b\|f\|_{L^p_v} \; \forall \; f \in V^p_v(\phi)$$

(iv) For p=2, the set of reproducing kernels $\{K_{x_j}:x_j\epsilon X\}$ is a (Hilbert) frame for $V^2(\phi)$.

Remark 4.1

(i) The relation between RKHSs and uniform sampling of bandlimited functions was first reported by Yao [170] and used to derive interpolating series similar to (1.1). For the case of shift-invariant spaces, this connection was established in (9). Sampling for functions in RKHSs was studied in [84]. For the general case of nonuniform sampling in shift-invariant spaces, the connection was established in [5].

(ii) The relation between Hilbert frames and sampling of bandlimited functions is well known [14, 48]. Sampling in shift-invariant spaces is more recent, and the relation between frames and sampling in shift-invariant spaces (with p=2 and v=1) can be found in [5, 30, 75, 77, 102].

(iii) The relation between Hilbert frames and the weighted average sampling mentioned in Remark 3.1 can be found in [1]. This relation is obtained via kernels that generalize the RKHS.

5. Frame Algorithms for $L^p_\nu$-Spaces

Theorem 4.2 states that a separated set $X=\{x_j:j\epsilon J\}$ is a set of sampling for $V^2(\phi)$ if and only if the set of reproducing kernels $\{K_{x_j}:x_j\epsilon X\}$ is a frame for $V^2(\phi)$. It is well known from frame theory that there exists a dual frame $\{\tilde{K}_{x_j}:x_j\epsilon X\}$ that allows us to reconstruct the function $f\subset V^2(\phi)$ explicitly as $$f(x) = \sum_{j\in J} \langle f, K_{x_j}\rangle \tilde{K}_{x_j}(x) = \sum_{j\in J} f(x_j)\tilde{K}_{x_j}(x) \quad (5.1)$$

However, a dual frame $\{\tilde{K}_{x_j}:x_j\epsilon X\}$ is difficult to find in general, and this method for recovering a function $f\epsilon V^2(\phi)$ from its samples $\{f(x_j):x_j\epsilon X\}$ is often not practical.

Instead, the frame operator $$Tf(x) = \sum_{j\in J} \langle f, K_{x_j}\rangle K_{x_j}(x) = \sum_{j\in J} f(x_j)K_{x_j}(x) \quad (5.2)$$

can be inverted via an iterative that we now describe. The operator $$I - \frac{2}{A+B}T$$

is contractive, i.e., the operator norm on $L^2(\mathbb{R}^d)$ satisfies the estimate $$\left\|I - \frac{2}{A+B}T\right\|_{op} \le \frac{B-A}{A+B} < 1$$

where A, B are frame bounds for $\{K_{x_j}:x_j\epsilon X\}$. Thus, $$\frac{2}{A+B}T$$

can be inverted by the Neumann series $$\frac{A+B}{2}T^{-1} = \sum_{n=0}^{\infty} \left(I - \frac{2}{A+B}T\right)^n$$

This analysis gives the iterative frame reconstruction algorithm, which is made up of an initialization step $$f_1 = \sum_{j\in J} f(x_j)K_{x_j}$$

and iteration $$f_n = \frac{2}{A+B}f_1 + \left(I - \frac{2}{A+B}T\right)f_{n-1} \quad (5.3)$$

As $n\to\infty$, the iterative frame algorithm (5.3) converges to $f_\infty = T^{-1}f_1 = T^{-1}Tf = f$.

Remark 5.1

(i) The computation of T requires the computation of the reproducing frame functions $\{K_{x_j}:x_j\epsilon X\}$, which is a difficult task. Moreover, for each sampling set X we need to compute a new set of reproducing frame functions $\{K_{x_j}:x_j\epsilon X\}$.

(ii) Even if the frame functions $\{K_{x_j}:x_j\epsilon X\}$ are known, the performance of the frame algorithm depends sensitively on estimates for the frame bounds.

Since accurate and explicit frame bounds, let alone optimal ones, are hardly ever known for nonuniform sampling problems, the frame algorithm converges very slowly in general. For efficient numerical computations involving frames, the primitive iteration (5.3) should therefore be replaced almost always by acceleration methods, such as Chebyshev or conjugate gradient acceleration. In particular, conjugate gradient methods converge at the optimal rate, even without any knowledge of the frame bounds [49, 56].

(iii) The convergence of the frame algorithm is guaranteed only in $L^2$, even if the function belongs to other spaces $L^p_\nu$. It is a remarkable fact that in Hilbert space the norm equivalence (4.4) alone guarantees that the frame operator is invertible. In Banach spaces the situation is much more complicated and the existence of a reconstruction procedure must be postulated in the definition of a Banach frame. In the special case of sampling in shift-invariant spaces, the frame operator T is invertible on all $V^p_\nu(\phi)$ whenever T is invertible on $V^2(\phi)$ and $\phi$ possesses a suitable polynomial decay [57].

6. Iterative Reconstruction Algorithms

Since the iterative frame algorithm is often slow to converge and its convergence is not even guaranteed beyond $V^2(\phi)$, alternative reconstruction procedures have been designed [4, 76]. These procedures are also iterative and based on a Neumann series. New iterative reconstruction algorithms developed according to the present invention are disclosed and discussed below.

In one embodiment, as shown in FIG. 5, at step 503, samples $\{f(x_j):x_j\epsilon X\}$ are obtained for function $f$ of an object of interest. At step 505, the function $f$ is approximated from its samples $\{f(x_j):x_j\epsilon X\}$ using an interpolation or a quasi-interpolation $Q_X f$. For examples, $Q_X f$ could be a piecewise linear interpolation of the samples $f|_X$ or even an approximation by step functions, the so-called sample-and-hold interpolant.

At step 507, the approximation $Q_X f$ is then projected in the space $V^p_\nu(\phi)$ to obtain the first approximation $f_1=PQ_X f\epsilon V^p_\nu(\phi)$, which then can be fed back, at step 501, to sampling operator $S_x$ and produce an $f_1(X)$. The error $e=f-f_1$ between the functions $f$ and $f_1$ belongs to the space $V^p_\nu(\phi)$. Moreover, the values of e on the sampling set X can be calculated, at step 505, from $\{f(x_j):x_j\epsilon X\}$ and $(PQ_X f)(x_j)$. Then we repeat the interpolation projection procedure on e and obtain a correction $e_1$. The updated estimate is now, at step 509, $f_2=f_1+e_1$, which can then be fed back to step 501 for a new round of calculation. By repeating this procedure, we obtain a sequence $f_n=f_1+e_1+e_2+e_3+ \ldots +e_{n-1}$ that converges to the function $f$.

In order to prove convergence results for this type of algorithm, we need the sampling set to be dense enough. The appropriate definition for the sampling density of X is again due to Beurling.

DEFINITION 6.1. A set $X=\{x_j:j\epsilon J\}$ is $\epsilon_0$-dense in $\mathbb{R}^d$ if $$R^d = \bigcup_j B_\gamma(x_j) \ \forall \ \gamma > \gamma_0. \quad (6.1)$$

This definition implies that the distance of any sampling point to its nearest neighbor is at most $2\gamma_0$. Thus, strictly speaking, $\epsilon_0$ is the inverse of a density; i.e., if $\epsilon_0$ increases, the number of points per unit cube decreases. In fact, if a set X is $\epsilon_0$-dense, then its Beurling density defined by (1.2) satisfies $D(X)\geq\gamma_0^{-1}$. This last relation states that $\Delta_0$-density imposes more constraints on a sampling set X than the Beurling density D(X).

To create suitable quasi-interpolants, we proceed as follows: Let $\{\beta_j\}_{j\epsilon J}$ be a partition of unity such that
(1) $0<\beta_j\leq 1$ for all $j\epsilon J$;
(2) supp $\beta_j \subset B_\gamma(x_j)$; and
(3) $\Sigma_{j\epsilon J}\beta_j=1$.

A partition of unity that satisfies these conditions is sometimes called a bounded partition of unity. Then the operator $Q_X$ defined by $$Q_X f=\Sigma_{j\epsilon J}f(x_j)\beta_j$$

is a quasi-interpolant of the sampled values $f|_X$.

In this situation we have the following qualitative statement.

THEOREM 6.1. Let $\phi$ in $W_0(L^1_\omega)$ and let P be a bounded projection from $L^p_\nu$ onto $V^p_\nu(\phi)$. Then there exists a density $\gamma>0$ ($\gamma=\gamma(\nu, p, P)$) such that any $f\epsilon V^p_\nu(\phi)$ can be recovered from its samples $\{f(x_j):x_j\epsilon X\}$ on any $\gamma$-dense set $X=\{x_j:j\epsilon J\}$ by the iterative algorithm $$\begin{cases} f_1 = PQ_X f \\ f_{n+1} = PQ_X(f - f_n) + f_n \end{cases} \quad (6.2)$$

Then iterates $f_n$ converge to $f$ uniformly and in the $W(L^p_\nu)$- and $L^p_\nu$-norms. The convergence is geometric, that is, $$\|f-f_n\|_{L^p_\nu}\leq C\|f-f_n\|_{W(L^p_\nu)}\leq C\|f-f_1\|_{W_0 L^p_\nu}\alpha^n$$

For some $\alpha=\alpha(\gamma)<1$.

Figure 6:
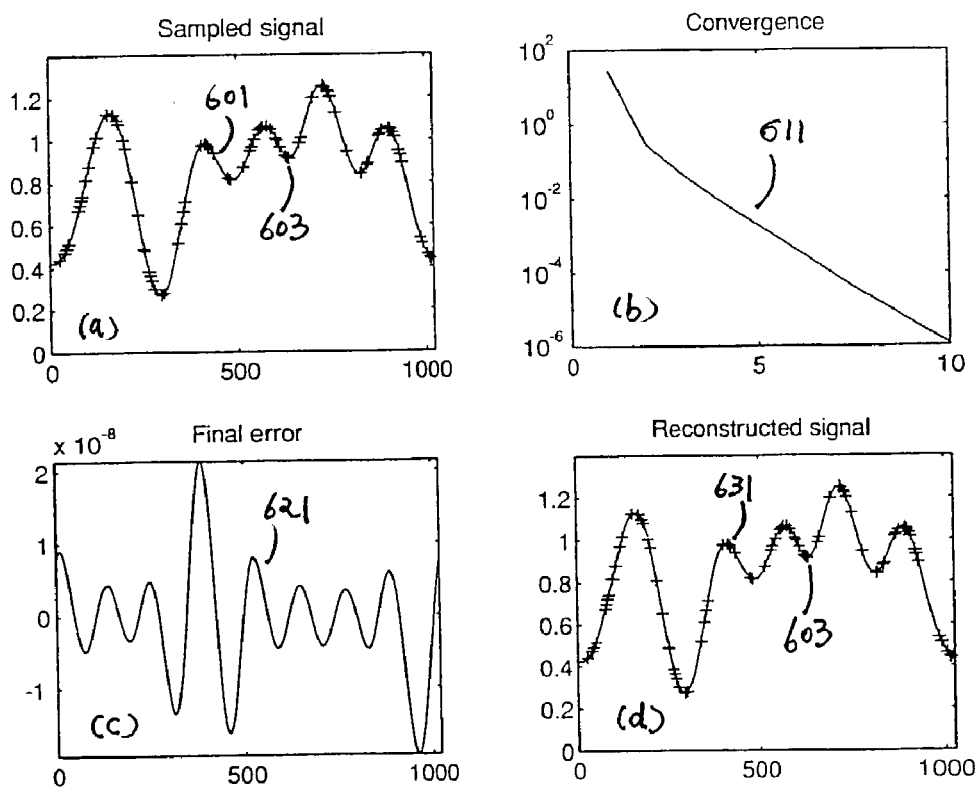
FIG. 6 schematically shows reconstruction of a function $f$ with $\|f\|_2 = 3.5$ using the iteration algorithm as set forth in FIG. 5 according to one embodiment of the present invention. (a).

The algorithm based on this iteration and as illustrated in FIG. 5 has been successfully utilized in practice. A reconstruction of a function $f$ with $\|f\|_2=3.5$ using the iteration algorithm as set forth in FIG. 5 according to one embodiment of the present invention is shown in FIG. 6. Referring now to FIG. 6(a), curve 601 represents function $f$ belonging to the shift-invariant space generated by the Gaussian function exp$(-x^2/\sigma^2)$, where $\sigma$ is about 0.81, and its sample values 603, $\{f(x_j), x_j\epsilon X\}$, marked by + (with density $\gamma$ about 0.8). As shown in FIG. 6(b), curve 611 represents error $\|f-f_n\|_{L^2}^2$ against the number of iterations, indicating good convergence of the reconstruction. As shown in FIG. 6(c), curve 621 represents final error $f-f_n$ after 10 iterations. And as shown in FIG. 6(d), curve 631 represents reconstructed function $f_{10}$ (continuous line) and original samples 603 $\{f(x_j), x_j\epsilon X\}$, showing great match between the two.

Additionally, a missing data reconstruction of an MRI image performed according to one embodiment of the present invention is shown in FIG. 7. Referring now to FIG. 7(a), original digital MRI image 701 is shown with 128×128 samples. As shown in FIG. 7(b), MRI image 703 is given with 50% randomly missing samples. As shown in FIG. 7(c), reconstruction image 711 with 50% randomly missing samples using the iterative reconstruction algorithm according to one embodiment of the present invention is given and shows great improvement(s) over image 703. The corresponding shift invariant space is generated by $\phi(x, y)=\beta^3(x)\times\beta^3(y)$, where $\beta^3=\chi_{[0,1]}*\chi_{[0,1]}*\chi_{[0,1]}*\chi_{[0,1]}$, and $\chi_{[0,1]}$ is the B-spline function of degree 3.

Remark 6.1. For $\nu=1$, a special case, Theorem 6.1 was proved in [4]. For a special case of the weighted average sampling mentioned in Remark 3.1, a modified iterative algorithm and a theorem similar to Theorem 6.1 can be found in [1].

Universal Projections in Weighted Shift-Invariant Spaces

Theorem 6.1 requires bounded projections from $L^p_\nu$ onto $V^p_\nu(\phi)$. In contrast to the situation in Hilbert space, the existence of bounded projections in Banach spaces is a difficult problem. In the context of nonuniform sampling in shift-invariant spaces, we would like the projections to satisfy additional requirements. In particular, we would like projectors that can be implemented with fast algorithms. Further, it would be useful to find a universal projection, i.e., a projection that works simultaneously for all $L^p_\nu$, $1\leq p\leq\infty$, and all weights v. In shift-invariant spaces such universal projections do indeed exist.

THEOREM 6.2. Assume $\phi\epsilon W_0(L^1_\omega)$. Then the operator $$P:f \to \sum_{k\in\mathbb{Z}^d} \langle f, \tilde{\phi}(\cdot -k)\rangle\phi(\cdot -k)$$

is a bounded projection from $L^p_\nu$ onto $V^p_\nu(\phi)$ for all p, $1\leq p\leq\infty$, and all $\omega$-moderate weights v.

Remark 6.2. The operator P can be implemented using convolutions and sampling. Thus the universal projector P can be implemented with fast "filtering" algorithms [3].

7. Data Reconstruction in Presence of Noise

In practical applications the given data are rarely the exact samples of a function $f \in V^p_\nu(\phi)$. In other words, we generally do not have "perfect" data for an object of interest that can be represented by a function $f$ but data with noise. We assume more generally that $f$ belongs to $W_0(L^p_\nu)$; then the sampling operator $f \to \mapsto \{f(x_j): x_j \in X\}$ still makes sense and yields a sequence in $l^p_\nu(X)$. Alternatively, we may assume that $f \in V^p_\nu(\phi)$, but that the sampled sequence is a noisy version of $\{f(x_j): x_j \in X\}$, e.g., that the sampling sequence has the form $\{f'_{x_j} = f(x_j) + \eta_j\} \in l^p_\nu(X)$. If a reconstruction algorithm is applied to noisy data, then the question arises whether the algorithm still converges, and if it does, to which limit it converges.

To see what is involved, we first consider sampling in the Hilbert space $V^2(\phi)$. Assume that $X = \{X_j : j \in J\}$ is a set of sampling for $V^2(\phi)$. Then the set of reproducing kernels $\{K_{x_j} : x_j \in X\}$ forms a frame for $V^2(\phi)$, and so $f \in V^2(\phi)$ can be reconstructed from the samples $f(x_j) = \langle f, K_{x_j}\rangle$ with the help of the dual frame $\{\tilde{K}_{x_j} : x_j \in X\} \subset V^2(\phi)$ in the form of the expansion $$f = \sum_{j \in J} \langle f, K_{x_j} \rangle \tilde{K}_{x_j} = \sum_{j \in J} f(x_j) \tilde{K}_{x_j} \tag{7.1}$$

If $f \notin V^2(\phi)$, but $f \in W_0(L^2)$, say, then $f(x_j) \neq \langle f, K_{x_j}\rangle$ in general. However, the coefficients $\langle f, K_{x_j}\rangle$ still make sense for $f \in L^2$ and the frame expansion (7.1) still converges. The following result describes the limit of this expansion when $f \notin V^2(\phi)$.

THEOREM 7.1. Assume that $X \subset \mathbb{R}^d$ is a set of sampling for $V^2(\phi)$ and let P be the orthogonal projection from $L^2$ onto $V^2(\phi)$. Then $$Pf = \sum_{j \in J} \langle f, K_{x_j}\rangle \tilde{K}_{x_j}$$

for all $f \in L^2$.

The previous theorem suggests a procedure for sampling: the function $f$ is first "prefiltered" with the reproducing kernel $K_x$ to obtain the function $f_a$ defined by $f(x) = \langle f, K_x\rangle$ for all $x \in \mathbb{R}^d$. Sampling $f_a$ on X then gives a sequence of inner products $f_a(x_j) = \langle f, K_{x_j}\rangle$. The reconstruction (7.1) off, is then the least square approximation off by a function $f_a \in V^2(\phi)$. In the case of bandlimited functions, we have $\phi(x) = \sin\pi x/(\pi x)$ and $Kx(t) = (\sin\pi t(t-x))/(\pi(t-x))$. Then the inner product $f_a(x) = \langle f, K_x\rangle = f * \phi(x)$ is just a convolution. The filtering operation corresponds to a restriction of the bandwidth to $[-\frac{1}{2}, \frac{1}{2}]$, because $(f*\phi)^\wedge = \hat{f} \cdot \chi_{[-1/2, 1/2]}$, and is usually called prefiltering to reduce aliasing.

In practical situations, any sampling sequence may be perturbed by noise. This perturbation can be modeled in several equivalent ways: (a) The function $f \in V^2(\phi)$ is sampled on X, and then noise $\eta_j \in l^2$ is added, resulting in a sequence $f'_j = f(x_j) + \eta_j$. (b) One can start with an arbitrary sequence $f'_j \in l^2(X)$. (c) One can sample a function $f \in W_0(L^2)$ which is not necessarily in $V^2(\phi)$.

In this situation, according to one embodiment of the present invention, we wish to know what happens if we run the frame algorithm with the input sequence $\{f'_j : j \in J\}$. If $\{f'_j : j \in J\} \in l^2(X)$, we can still initialize the iterative frame algorithm by $$g_1 = \sum_{j \in J} f'_j K_{x_j} \tag{7.2}$$

This corresponds exactly to the first step in the iterative frame algorithm (5.3). Then we set $$g_n = \frac{2}{A+B} g_1 + \left(I - \frac{2}{A+B}T\right) g_{n-1} \tag{7.3}$$

Since $\{K_{x_j}\}$ is a frame for $V^2(\phi)$ by assumption, this iterative algorithm still converges in $L^2$, and its limit is $$g_\infty = \lim_{n \to \infty} g_n = \sum_{j \in J} f'_j \tilde{K}_{x_j} \tag{7.4}$$

THEOREM 7.2. Let X be a set of sampling for $V^2(\phi)$. Then for any $\{f'_j : j \in J\} \in l^2(X)$, the modified frame algorithm (7.3) with the initialization (7.2) converges to $$g_\infty = \sum_{j \in \mathbb{Z}^d} f'_j \tilde{K}_{x_j} \in V^2(\phi).$$

We have that $$\sum_{j \in J} |f'_j - g_\infty(x_j)|^2 < \sum_{j \in J} |f'_j - g(x_j)|^2$$

For all $g \in V^2(\phi)$ with equality if and only if $g = g_\infty$. Thus $g_\infty$ fits the given data optimally in the least squares sense.

Next we investigate the iterative algorithm (6.2) in the case of noisy samples $\{f'_j : j \in J\} \in l^p_\nu(X)$. We use initialization $$f_1 = PQ_X f' = P\left(\sum_{j \in J} f'_j \beta_j\right) \tag{7.5}$$

and define the recursion as in (6.2) by $$f_n = f_1 + (I - PQ_X) f_{n-1} \tag{7.6}$$

The convergence of this algorithm is clarified in the following theorem (see FIG. 8).

THEOREM 7.3. Under the same assumptions as in Theorem 6.1, the algorithm (7.6) converges to a function $f_\infty \in V^p_\nu(\phi)$, which satisfies $PQ_X f_\infty = PQ_X \{f'_j\}$.

A reconstruction of a function $f$ with additive noise using the iteration algorithm as set forth in FIG. 5 and further disclosed above according to one embodiment of the present invention is shown in FIG. 8. Referring now to FIG. 8(a), curve 801 represents a function $f$ belonging to the shift-invariant space generated by the Gaussian function $\exp(-x^2/$ $\sigma^2$) with $\sigma\approx0.81$. As shown in FIG. 8(b), curve 811 represents the function $f$ with an additive white noise, where SNR$\approx$0 db). As shown in FIG. 8(c), curve or distribution 821 represents noisy signal sampled on a nonuniform grid with maximal gap 0.51. As shown in FIG. 8(d), curve 831 represents reconstructed function $f_{10}$ only after 10 iterations (continuous line) in comparison (and agreement) with original signal $f$ (dotted line) from curve 801.

Example 2

Fast Local Reconstruction Methods for Uniform and Nonuniform Data Sampling in Shift Invariant Spaces Approach Overview In one aspect, the present invention relates to a method for fast reconstruction of a function $f$ from its samples $f(x_j)$, where $f$ belongs to a shift invariant space $V(\phi)$ and $\phi$ is a generator. If the generator $\phi$ has compact support, then the reconstruction is local quite in contrast to methods based on band-limited functions. In one embodiment, it is shown that the matrix of the corresponding linear system of equations is a positive-definite banded matrix. This special structure makes possible the fast local reconstruction algorithm in $O(S^2J)$ operations, where J is the number of samples and S is the support length of the generator $\phi$. Further optimization can be achieved by means of data segmentation. Several numerical simulations according to the present invention are provided.

In another aspect, the present invention relates to a method for converting data for an object of interest, which is characterized by a functions, between a digital form and an analog form. In one embodiment, the method includes the steps of locally selecting a plurality of data sample points in the order of N, N being an integer, wherein the data sample points are in a first form of data type, performing a transformation in a shift-invariant space to the locally selected data sample points to obtain a new data set that is in a second form of data type different from the first form of data type, and reconstructing the object of interest $f$ from the new data set. In one embodiment, the first form of data type is one of the digital form and the analog form, and the second form of data type is one of the digital form and the analog form that is different from the first form of data type. In other words, the first form of data type can be in digital form, and the corresponding second form of data type is in analog form, and vice versa.

1. Introduction

As set forth above, shift-invariant spaces serve as a universal model for uniform and nonuniform sampling of functions. Normally, the objective of the so-called sampling problem is either to recover a signal (function) $f$ from its samples $\{f(x_j) \in Z\}$ or to approximate a data set $(x_j, y_j)$ by a suitable function $f$ satisfying $f(x_j) \neq Y_j$. Obviously this problem is ill-posed, and so a successful reconstruction requires some a priori information about the signal. Usually it is assumed that $f$ is contained in the span of integer translates of a given generator $\phi$. In technical terms, the original function $f$ has the form $$f(x) = \sum_{k \in Z^{c_k}} \varphi(x-k)$$

and belongs to the shift-invariant space $V(\phi)$.

Until recently the only choice for p was the cardinal sine function $$\varphi(x) = \frac{\sin\pi\alpha x}{\pi\alpha x},$$

since in this case $V(\phi)$ coincides with the band-limited functions of band-width $2\alpha$. Despite the existence of fast numerical methods [49], this model has some drawbacks because it is non-local, and the behavior of $f$ at a point x also depends on samples far away from x. For this reason, one works with truncated versions of the cardinal sine. This idea leads naturally to work in shift-invariant spaces with a generator p of compact support. The concept of shift-invariant spaces first arose in approximation theory and wavelet theory [33,34,68]. Its potential for the systematic treatment of sampling problems was recognized much later.

Among other things, one goal of this Example is the investigation of specific numerical issues of nonuniform sampling in shift-invariant spaces. Usually the reconstruction algorithms are based on general frame methods or they follow simple iterative schemes. Of course, these can be applied successfully in the context of shift-invariant spaces as well as set forth above. We adopt the philosophy that the optimal numerical algorithms always have to use the special structure of the problem. Hence general purpose algorithms have to be fine-tuned to achieve their optimal performance. Here we use the peculiar structure of shift-invariant spaces with compactly supported generator to solve the sampling problem.

Among other things, we want to reconstruct a function $f \in V(\phi)$ from a finite number of samples $f(x_j)$ taken from an interval $x_j \in [M_0, M_1]$. In our derivation of the special structure we use a frame theoretic argument and combine it with the fact that the generator $\phi$ has compact support. The resulting algorithm is local in the sense that the complete reconstruction of a function in $V(\phi)$ on the interval $[M_0, M_1]$ only requires samples from $[M_0, M_1]$ (quite in contrast to bandlimited functions). By comparing reconstructions in different spline spaces we find that, among other things, the algorithm can be used as an efficient denoising procedure for noisy samples.

The rest of the disclosure for Example 2 is organized as follows: In Section 2 we present the precise technical details of shift-invariant spaces, state the well-known equivalence of sampling problems with the construction of certain frames, and discuss some general reconstruction techniques associated to frames. In Section 3 we exploit the special structure of shift-invariant spaces to derive a local reconstruction algorithm of order O(J) and discuss the numerical issues involved. Section 4 explains the results of the numerical simulations and provides, as an example, a code for the main algorithm.

2. Relevant Concepts 2.1. Shift-Invariant Spaces, Frames, and Sampling

Let $\phi$ be a continuous function with compact support of size S so that supp $\phi \subseteq [-S, S]$. (1)

For convenience we assume that S is a positive integer and thus $\phi(\pm S)=0$. Then the shift-invariant space $V(\phi)$ is defined as $V(\phi)=\{f \in L^2(\mathbb{D}): f=\Sigma c_k \phi(x-k)$ for $(c_k) \in l^2(Z)\}$. (2)

To guarantee the stability of these representations, we assume that the generator $\phi$ is stable, which means that there exists a constant $C>0$ such that $$C^{-1}\|c\|_{l^2} \le \left\|\sum_{k \in Z} c_k \varphi(\cdot - k)\right\|_2 \le C\|c\|_{l^2} \qquad (3)$$

for all finite sequences $c=(c_k)_{k \in Z}$, or equivalently, the translates $\varphi(.-k), k \in Z$, form a Riesz basis for $V(\varphi)$. As a consequence, $V(\varphi)$ is a closed subspace of $L^2(R)$ and inherits the inner product $<.,.>$ of $L^2(R)$.

The sampling problem in $V(\varphi)$ may be interpreted as the following problem: Given a set of sampling points $X=\{x_j: j \in Z\}$ arranged in increasing order $x_j < x_{j+1}$ and a sequence of samples $\{f(x_j): j \in Z\}$, of a function $f \in V(\varphi)$, we would like to recover the original function $f$ in a stable and numerically efficient way. Here stability means that there exist (possibly unspecified) constants A, B>0 such that $$A\|f\|_2 \le \left(\sum_{j \in Z} |f(x_j)|^2\right)^{1/2} \le B\|f\|_2 \quad \forall f \in V(\varphi). \qquad (4)$$

A sampling set satisfying (4) is called a set of stable sampling.

Thus, for (4) to be valid, we need point evaluations in $V(\varphi)$ to be well-defined. This is guaranteed by the following lemma given in [5].

Lemma 1

If $\varphi$ is continuous and satisfies the condition $\Sigma_{k \in Z} \max_{x \in [0,1]} |f(x+k)| < \infty$, in particular, if $\varphi$ is continuous with compact support, then for all $x \in R$ there exists a function $K_x \in V(\varphi)$ such that $f(x) = <f, K_x>$ for $f \in V(\varphi)$. We say that $V(\varphi)$ is a reproducing kernel Hilbert space.

Explicit formulas for $K_x$ are known, see [5], but we do not need them here. Note that with the kernels $K_x$, the sampling inequality (4) can be formulated as $$A\|f\|_2 \le \left(\sum_{j \in Z} |\langle f, K_{x_j}\rangle|^2\right)^{1/2} \le B\|f\|_2,$$

which is equivalent to saying that the set $\{K_{x_j}: j \in Z\}$ is a frame for $V(\varphi)$.

Let U be the infinite matrix with entries $$U_{jk} = \varphi(x_j - k) \, j, k \in Z. \qquad (5)$$

Then the sampling problem in $V(\varphi)$ can be formulated in several distinct ways [120].

Lemma 2

If $\varphi$ satisfies the condition of Lemma 1, then the following are equivalent:

(i) $X=\{x_j: j \in Z\}$ is a set of sampling for $V(\varphi)$.
(ii) There exist A, B>0 such that $$A\|c\|_{l^2} \le \|Uc\|_{l^2} \le B\|c\|_{l^2} \, \forall c \in l^2(Z)$$

(iii) The set of reproducing kernels $\{K_{x_j}: j \in Z\}$ is a frame for $V(\varphi)$.

REMARK. It is difficult to characterize sets of sampling for $V(\varphi)$. If $\varphi$ is a B-spline of order N, i.e., $\varphi = X_{[0,1]} * \ldots * X_{[0,1]}$ (N+1 convolutions), then the main result of [120] implies that the maximum gap condition $\sup_{j \in Z}(x_{j+1} - x_j) = \delta < 1$ is sufficient for the conditions of Lemma 2 to hold.

2.2. General Purpose Reconstructions

Lemma 2 leads to some general reconstruction techniques that are always applicable.

A. Linear Algebra Solution

One could simply try to solve the (infinite) system of linear equations $$\sum_{k \in Z} c_k \varphi(x_j - k) = f(x_j) \quad \forall j \in Z, \qquad (6)$$

for the coefficients $(c_k)$, or in the notation of (5) with $f|x=(f(x_j))_{j \in Z}$ $$Uc = f|x \qquad (7)$$

B. The Normal Equations

Frequently it is better to consider the associated system of normal equations [124]

$$U^*Uc = U^*f|x \qquad (8)$$

This approach has the advantage that the matrix $T := U^*U$ is a positive operator on $l^2(z)$. Furthermore, if the input $y=(y_j)_{j \in Z}$ does not consist of a sequence of exact samples of $f \in V(\varphi)$, then the function $$f = \sum_{k \in Z} c_k \varphi(\cdot - k)$$

corresponding to the solution $c=(U^*U)^{-1}U^*y$ solves tile least squares problem $$\sum_{j \in Z} |y_j - f(x_j)|^2 = \min_{h \in V(\varphi)} \sum_{j \in Z} |y_j - h(x_j)|^2. \qquad (9)$$

C. Frame Approach

Lemma 2(iii) suggests to use versions of the frame algorithm to find a reconstruction of f. By (iii) the frame operator which is defined as $$Sf(x) = \sum_{j \in Z} \langle f, K_{x_j}\rangle K_{x_j}(x) = \sum_{j \in Z} f(x_j) K_{x_j}(x) \qquad (10)$$

is invertible and its inverse defines the dual frame $\tilde{K}_{x_j} = S^{-1} K_{x_j} \in Z$. Then the reconstruction is given by $$f(x) = \sum_{j \in J} \langle f, K_{x_j}\rangle \tilde{K}_{x_j} = \sum_{j \in J} f(x_j) \tilde{K}_{x_j}(x). \qquad (11)$$

We observe that the linear algebra solution (7) and the frame method are equivalent. By definition the vector of samples is given by $Uc=f|x$ fix. The sampled energy of $f \in V(\varphi)$ is $$\sum_{j \in Z} |f(x_j)|^2 = \langle f|x, f|x \rangle_{l^2} = \langle Uc, Uc \rangle_{l^2} = \langle U^*Uc, c \rangle_{l^2} \quad (12)$$

Thus X is a set of sampling if and only if $U^*U$ is invertible on $l^2(Z)$

D. Iterative Frame Methods

In nonuniform sampling problems it is usually difficult to calculate the entire dual frame, therefore one often resorts to iterative methods. Since the Richardson-Landweber iteration in the original paper of Duffin-chaeffer [40] is slow and requires good estimates of the frame bounds, we recommend the conjugate gradient acceleration of the frame algorithm for all problems without additional structure [56]. It converges optimally and does not require the estimate of auxiliary parameters.

3. Exploit the Structure of the Problem

So far we have discussed general purpose methods for the reconstruction of the function. These could be applied in any situation involving frames and do riot take into consideration the particular structure of the sampling problem in shift-invariant spaces.

3.1. A Localization Property

We now exploit the special structure of shift-invariant spaces. The following lemma is simple, but crucial. It is a consequence of the assumption that the generator of $V(\phi)$ has compact support.

Lemma 3

If supp $\phi \subseteq [-S, S]$, then $T = U^*U$ is a band matrix of (upper and lower) band-width 2S.

Proof. By definition the entries of $U^*U$ are $$(U^*U)_{kl} = \sum_{j \in Z} \overline{U_{jk}} U_{jl} = \sum_{j \in Z} \overline{\varphi(x_j - k)} \varphi(x_j - l).$$

Since $\phi$ has compact support, the sum is always locally finite and its convergence does not pose any problem. Since $\phi(x_j - k) = 0$ if $|x_j - k| \geq S$, we find that $(U^*U)_{kl}$ can be non-zero only if both $|x_j - k| < S$ and $|x_j - l| < S$. In other words, $(U^*U)_{kl} \neq 0$ implies that $$|k - l| \leq |k - x_j| + |x_j - l| < 2S.$$

This means that only $4S-1$ diagonals of $U^*U$ contain non-zero entries.

REMARKS. A. Banded matrices and the resulting numerical advantages occur in a number of related problems. For instance, in the interpolation of scattered data by radial functions with compact support, the interpolation matrix is banded, see [121] and the references there. Likewise, the calculation of the optimal smoothing spline on a finite set of arbitrary nodes requires the inversion of a banded matrix [125].

B. Lemma 3 combined with a result of Demko, Moss, and Smith [123] or of Jaffard [126] implies that the inverse matrix possesses exponential decay off the diagonal, i.e., there exist C, A>0 such that $$|(U^*U)_{kl}^{-1}| \leq Ce^{-A|k-l|} \quad \forall k, l \in Z.$$

To make our treatment more realistic, we take into account that in any real problem only a finite (albeit large) number of samples is given. It turns out that the model of shift-invariant spaces with compactly supported generator possesses excellent localization properties. These are quantified in the next lemma.

Lemma 4

The restriction of $f \in V(\phi)$ to the interval $[M_0, M_1]$ is determined completely by the coefficients $c_k$ for $k \in (M_0 - S, M_1 + S) \cap Z$.

Proof. Since $\phi(x-k) = 0$ for $|x-k| \geq S$ and $x \in [M_0, M_1]$, we obtain that $$M_0 - S - x - S < k < x + S \leq M_1 + S.$$

Consequently, as $S \in \mathbb{Z}$, we have $$f(x) = \sum_{k \in Z} c_k \varphi(x - k)$$
$$= \sum_{|x-k| < S} c_k \varphi(x - k)$$
$$= \sum_{k = M_0 - S + 1}^{M_1 + S - 1} c_k \varphi(x - k).$$

In other words, the exact reconstruction of $f \in V(\phi)$ on $[M_0, M_1]$ requires only the $M_1 - M_0 + 2S - 1$ unknown coefficients $c_k$ with $k \in (M_0 - S, M_1 + S) \cap Z$. By counting dimensions, we find that we need at least $M_1 - M_0 + 2S - 1$ samples in $[M_0, M_1]$ for the coefficients to be determined uniquely. Usually the length $M_1 - M_0$ is large compared to S, therefore the additional $2S - 1$ coefficients amount to a negligible oversampling.

Lemma 4 demonstrates an important theoretical and practical advantage of shift-invariant spaces with compactly supported generators. A function $f \in V(\phi)$ can be reconstructed exactly on an arbitrary interval solely from samples in that interval. In contrast, the restriction of a band-limited function to an interval is not uniquely determined by any finite number of samples in that interval, but can only be approximated by these samples. The localization property expressed in Lemma 4 is one of the main reasons to work with shift-invariant spaces with compactly supported generators as a sampling model!

Finally we remark that uniform sampling at critical density is not local and may even be unstable in this model. If $f \in V(\phi)$ is sampled at $\xi + k$, $k \in Z$, for some $\xi \in [0,1)$, then there exists an interpolating function $\psi_\xi$ of exponential decay, such that $$f(x) = \sum_{k \in Z} f(\xi + k) \psi_\xi(x - k) [64].$$

In this case the restriction of $f$ to $[M_0, M_1]$ is not determined exclusively by the $M_1 - M_0$ values $f(\xi + k)$ for $\xi + k \in [M_0, M_1]$. Moreover, if $\phi$ is continuous, then there always exists a $\xi \in [0, 1)$ such that the reconstruction $\{f(\xi + k)\} \to X \, f$ is unstable.

Jaussen's results in [64] indicate that a small amount of oversampling is an essential hypothesis to guarantee the locality and the stability of its reconstruction.

3.2. A Local Reconstruction Algorithm

In practice we perform the calculations with a truncated version of the matrices U and T. We now combine Lemmas 3 and 4 to provide an efficient numerical reconstruction algorithm according to one embodiment of the present invention.

Algorithm

Input. We assume that finitely many sampling points $x_1, \ldots, x_J \in [M_0, M_1]$ are given with associated sampling vector $y = (y_1, \ldots, y_J) \in \square^J$. Assume that $J \geq M_1 - M_0 + 2S - 1$ and that the truncated matrix z defined below is invertible.

Step 0. First we define and compute the truncated matrices $U = U^{M_0, M_1}$ and $T = T^{M_0, M_1} = U^*U$, given by their entries $$U_{jk} = \varphi(x_j - k) \qquad (13)$$

$$T_{kl} = \sum_{j=1}^{J} \overline{\varphi(x_j - k)} \varphi(x_j - l)$$

for $j = 1, \ldots, J$ and $k, l = M_0 - S + 1, \ldots, M + S - 1$.

Step 1. Compute $b = U^*y$, i.e., $$b_k = \sum_{j=1}^{J} \overline{\varphi(x_j - k)} y_j \quad \text{for } k = M_0 - S + 1, \ldots, M_1 + S - 1 \qquad (14)$$

Step 2. Solve the system of equations $$c = T^{-1}b. \qquad (15)$$

Step 3. Compute the restriction of $f$ to $[M_0, M_1]$ by $$f(x) = \sum_{k=M_0-S+1}^{M_1+S-1} c_k \varphi(x - k) \text{ for } x \in [M_0, M_1]. \qquad (16)$$

Then $f$ is the (unique) least square approximation of the given data vector y in the sense that $$\sum_{j=1}^{J} |y_j - f(x_j)|^2 = \min_{h \in V(\varphi)} \sum_{j=1}^{J} |y_j - h(x_j)|^2. \qquad (17)$$

If y arises as the sampled vector of an $f \, c \, V(\varphi)$, i.e., $yj = f(x_j)$, then this algorithm provides the exact reconstruction of f Proof. The least square property (17) is clear, since this is exactly the property of the solution of the system of normal equations $U^*U \, c = U^*y$. See [124] for details.

In the case of B-splines a sufficient condition on the sampling density can be extracted from the proofs of Thm. 2.1 and 2.2 of [120]. Assume that $x_{j+1} - x_j \leq \delta$, and that $$\delta \leq \frac{M_1 - M_0}{M_1 - M_0 2S - 1} < 1. \qquad (18)$$

Then $f$ is invertible. Condition (18) guarantees that there are at least $M_1 - M_0 + 2S - 1$ samples in $[M_0, M_1]$. Then the Schoenberg-Whitney theorem [127, p. 167] implies that T is invertible. See [120] for the detailed arguments.

3.3 Data Segmentation

In another embodiment of the present invention, a further optimization of the reconstruction procedure is possible by data segmentation. Instead of solving the large system of equations $$T_m^{0,m_1} = (U^{M_0, M_1})^* y,$$

with a band matrix of dimension $M_1 - M_0 + 2S - 1$, we will solve t systems of smaller size. For this purpose we partition the large interval [M0, M1] into t smaller intervals $[m_r, m_{r+1}]$, $r = 0, \ldots, t-1$ with $M_0 = m_0$ and $M_1 = m_t$.

Now we apply Algorithm 3.2 set forth above to each interval separately. More precisely, given the data $(x_j, y_j)$ where $x_j \in [m_r, m_{r+1}]$, we set tip the matrices $U^{m_r, m_{r+1}}$ and $T^{m_r, m_{r+1}}$ and solve t equations $$T^{m_r, m_{r+1}} c^{(r)} = (U^{m_r, m_{r+1}})^* y^{(r)} \qquad (19)$$

where the vector $y^{(r)}$ consists of those data $y_j$ for which $x_j \in [m_r, m_{r+1}]$ and the coefficient vector $c^{(r)} = (c_{m_r}^{-S+1}, \ldots, c_{m_{r+1}+S-1})$ Among other things, the segmentation technique has a number of practical advantages as follows:

A. The dimension of vectors and matrices can be reduced drastically. Using data segmentation, we solve t small systems of size $(M - M_0)/t + 2S - 1$ instead of the large system of size $M_1 - M_0 + 2S - 1$.

B. Parallel processing can be applied because non-adjacent intervals can be handled simultaneously.

C. The function can be reconstructed on specified subintervals at smaller cost. See discussions associated with FIG. 6, infra.

On the other hand, data segmentation may also come with some caveats:

A. The coefficients $c_k$ with indices $k \in [m_r - S + 1, m_{r+1} + S - 1]$ are computed at least twice because of overlap. Heuristically it has proved best to take averages of the multiply computed coefficients.

B. For a successful execution of the segmentation method it is necessary that each of the small matrices $T^{m_r, m_{r+1}}$ is invertible. Again by dimension counts we find that the number of data in the interval $[m_r, m_{r+1}]$ should exceed the number of variables, $$\#(X \cap [m_r, m_{r+1}]) \geq m_{r+1} - m_r + 2S - 1$$

Obviously this condition imposes an upper hound for the possible number of segmentations.

3.4. Implementation Issues

A. In Algorithm 3.2 as set forth above, the most expensive step is the calculation of the matrix U because it requires the point evaluations of $\varphi$. However, if the sampling points $x_j$ are given, then U and T can be computed in advance and stored. Thus Step 0 can be taken care of before solving the reconstruction problem.

We handle the pointwise evaluation of $\varphi$ by "quantizing" the generator. This means that for $\delta > 0$ sufficiently small we create of vector $\psi$ consisting of entries $$\varphi\left(\frac{1}{N}\right) \text{ for } l = -NS, \ldots, NS$$

such that $$\left|\varphi(x) - \varphi\left(\frac{l}{N}\right)\right| < \delta \quad \text{for } \left|x - \frac{l}{N}\right| < \frac{1}{2N}$$

Thus to build the matrix $U_{jk}=\phi(x_j-k)$ amount to selecting the appropriate entries of $\psi$. This approximation of U works remarkably well and fast in the numerical simulations.

B. For the solution of the banded system (15) a number of fast algorithms are available. Golub-van Loan [124] offers several efficient algorithms for this task; other options for the inversion of a banded matrix are mentioned in [125]. Since T is assumed to be positive definite, the band Cholesky algorithm seems to be a good choice that minimizes the operation count for Step 2. In one embodiment, MATLAB© is utilized to practice the present invention and it provides the commands SPARSE and CHOL to deal with this task.

C. Usually $f$ is reconstructed on a grid $$G = \left\{\frac{1}{N} : l = M_0 N, \ldots, M_1 N\right\}.$$

Then (16) amounts to a discrete convolution, and thus Step 3 can be performed quickly. Again, since $\phi$ has compact support, we can use the banded structure of the associated matrix to perform this step.

3.5. Operation Count

We estimate the number of multiplications for Algorithm 3.2. Recall that J is the number of samples, and $D=M_1-M_0+2S-1$ is the dimension of the problem.

(a) According to (14) each of the D entries of the vector b requires $\#\{j:|x_j-k|<S\}$ multiplications. Consequently Step 1 requires $$\sum_{k=M_0-S+1}^{M_1+S-1} \#\{j : |x_j - k| < S\} = \sum_{k=M_0-S+1}^{M_1+S-1} \sum_{j=1}^{J} X(k-S, k+S)(X_j)$$

$$= \sum_{j=1}^{J} \sum_{k=M_0-S+1}^{M_1+S-1} X(k-S, k+S)(X_j)$$

$$= \sum_{j=1}^{J} 2S = 2SJ$$

operations, because a point x is in at most 2S translates of the open interval (−S S).

(b) Likewise to calculate an entry of T requires $\#(\{j:|x_j-k|<S\}\cap\{j:|x_j-l|<S\})$ multiplications, see (13). As in (a) we estimate the number of operations to set up the matrix T by $$\sum_{k=M_0-S+1}^{M_1+S-1} \sum_{l=M_0-S+1}^{M_1+S-1} \#(\{j : |x_j - k| < S\} \cap \{j : |x_j - l| < S\}) =$$

$$\sum_{k=M_0-S+1}^{M_1+S-1} \sum_{l=M_0-S+1}^{M_1+S-1} \sum_{j=1}^{J} X(k-S, k+S)(x_j) X(l-S, l+S)(x_j) =$$

-continued $$\sum_{j=1}^{J} \left(\sum_{k=M_0-S+1}^{M_1+S-1} X(k-S, k+S)(x_j)\right) \left(\sum_{l=M_0-S+1}^{M_1+S-1} X(l-S, l+S)(x_j)\right)$$

$<J\cdot(2S)^2$.

(c) For the solution of the banded system T c=b by means of the band Cholesky algorithm we need at most $$D((2S)^2+16S+1)=(M_1-M_0+2S-1)((2S)^2+16S+1)\leq J(4S^2+16S+1)$$

operations (and no square roots), see [124, Ch. 4.3.6].

(d) To compute the reconstruction $f$ on a grid $$\left\{\frac{l}{N} : l = M_0 N, \ldots, M_1 N\right\}$$

we need to calculate $(M_1-M_0)$ N point evaluations of $f$ via (16). Since, each point evaluation requires at most 2S multiplications. Thus for the reconstruction on the grid we need at most $$(M_1-M_0)N\cdot 2S \leq J\cdot 2SN$$

multiplications.

Combining these estimates, we find that Algorithm 3.2 requires $$O(J(S^2+SN)) \quad (20)$$

operations. In other words, the cost of the algorithm according to this embodiment of the present invention is linear in the number of data and quadratic in the size of the generator.

4. Numerical Simulations

In one embodiment, several simulations performed according to the methods and algorithm(s) of the present invention. In our simulation we have used MATLAB. We used the shift-invariant spline spaces with the B-spline of order 3

$$\varphi = \frac{X[-1/2, 1/2]^* \ldots ^* X[-1/2, 1/2]}{4 \text{ times}}$$

as the generator of V($\phi$). Thus supp $\phi \subseteq [-2,2]$ and S=2. Referring now to FIG. 10, the shift-invariant spline spaces with the B-spline of order 3 with $\phi \subseteq [-2,2]$ and S=2 that can be utilized to practice the present invention is shown. Curve 1101 in FIG. 11 is shown as a plot of the operation count as a function of the number of sampling points. For this simulation, we have reconstructed examples of size 114, 226, 444, 667, 887, 1085, identified by the circles 1103 in FIG. 11, respectively, and used the MATLAB function FLOPS to count the number of operations.

Referring now to FIG. 12, a reconstruction of a function $f$ with additive noise according to one embodiment of the present invention with a signal on the interval [0,128] is shown, where $M_0=0$, and $M_1=128$. Since S=2, one needs at least $M_1-M_0+2S-1=131$ samples. The actual sampling set of FIG. 12 has 200 sample points as calculated and satisfies the maximum gap condition $\max_j(x_{j+1}-x_j)\approx 0.67<1$. More specifically, curve 1201 as shown in FIG. 12(a) represents original signal.

To make the example more realistic, we have added white noise to the sampled values of a given function $f \in V(\phi)$. Instead of missing the correct values $f(x_j)$ in the reconstruction algorithm, we use the noisy values $ferr(x_j) = f(x_j) + e_j$ so that $$ferr|x = f| + e.$$

The relative error between the original signal and the noisy signal is measured by $$err_{samp} = \frac{\|ferr|x - f|x\|_2}{\|f|x\|_2} = \left(\frac{\sum_{j=1}^{J} |e_j|^2}{\sum_{j=1}^{J} |f(x_j)|^2}\right)^{1/2}.$$

In our example $err_{samp} = 63.8\%$. Curve 1211 as shown in FIG. 12(*b*) represents original signal with noise.

Moreover, as shown in FIG. 12(*c*), curve 1221 represents noisy signal sampled on a nonuniform grid. Additionally, as shown in FIG. 12(*d*), curve 1231 represents reconstructed original signal after 10 iterations (continuous line) in comparison with original signal dotted line from curve 1201. The relative error $err_{rec}$ of the reconstruction measured at the sampling points with respect to the correct samples is now $$err_{rec} = \frac{\|f_{rec}|x - f|x\|_2}{\|f|x\|_2} = 18.5\%$$

The noise reduction is thus $$err_{samp} = 63.8\% \rightarrow err_{rec} = 18.5\%$$

Referring now to FIGS. 13A and 13B, the dependence of the reconstruction on the generator $\phi$ is investigated and shown, where the generator $\phi$ is a B-spline of order N, i.e. $\phi N = X_{[-1/2,1/2]} * \ldots * X_{[-1/2,1/2]}$ (N+1-fold convolution). The data set $(x_j, y_j)_{j<1, \ldots, J}$ is generated by sampling a function $f \in V(\phi_5)$ and then noise is added. Curve 1301 and 1303 in FIG. 13A(a) represent the original signal and the noisy sampled data, respectively. Then the optimal approximation of these data in the spline space $V(\phi_N)$, N=0, ..., 6, starting with an approximation by a step function $f_{rec} \in V(\phi_0)$ via an approximation by a piecewise linear function $f_{rec} \in V(\phi_1)$ and ending with a smooth approximation $f_{rec} \in V(\phi_6)$, are shown by curves 1311, 1321, 1331, 1341, 1351, 1361 and 1371 in FIG. 13A(b)-(d) and FIG. 13B(e)-(h), respectively.

In each case we have also plotted the original function $f$ (dotted line curve 1301) for comparison. In addition, the relative error $err_{samp}$ is indicated. The dependency of this error of N is a typical L-curve as it occurs in regularization procedures. In all our examples the best approximation is obtained in the correct space in which $f$ was originally generated. This observation is consistent with the extended literature on smoothing splines, e.g., [122, 125, 128]. One of the main differences between those methods and the algorithm of Section 3.2 of the present invention is in the underlying function space. The reconstruction algorithm 3.2 finds the best local reconstruction in the shift-invariant spline space $V(\phi)$, whereas the smoothing spline of [122] is based on the nodes $x_j$ and does not belong to a fixed function space.

Referring now to FIG. 14, the associated banded matrix T of the linear system according to one embodiment of the present invention is shown as curve (substantially a linear line/lines) 1401. In FIG. 14, white squares correspond to zero entries, dark squares signify large entries of T, the shading being proportional to the size. The banded structure is clearly visible.

Referring now to FIG. 15, the power of the method of data segmentation according to one embodiment of the present invention is shown. Instead of reconstructing the entire signal f, we have reconstructed only the restriction to two disjoint intervals, represented by curves 1501, 1503 respectively, in comparison with original data curve 1301. In the absence of noise the reconstruction is exact. Since $supp(\phi) \subset [-S, S]$, the calculation for the two intervals can be done locally and simultaneously. This property can be used for parallel processing.

5. An Exemplary Code

By way of example, the following is a code for fast local data reconstruction in shift invariant spaces according to one embodiment of the present invention as set forth above:

function $f\_rec$ = reconstruction(xp, xs, x_rec, t);

```
function f_rec = reconstruction(xp, xs, x_rec, t);
% xp        ... sampling positions
% xs        ... sampling values
% x_rec     ... positions, where the function should be reconstructed
% gen       ... generator with support supp(gen)=[-S,S]
% t         ... number of segmentation
step = round((max(x_rec)-min(x_rec))/t);
for k = min(x_rec):step:max(x_rec)
            xp_rel = {xp: k-S < xp < k + step + S}    % relevant sampling positions
                                                     % or the interval [k, k + step]
            xp_mm = min(xp.rel);
            xp_max = max(xprel);
            J = length(xp_rel);                       % number of sampling points
% calculation of the left side b:
            for j=1:J
                  mi=ceil (xp(j))−S;
                  ma=floor (xp(j) )+S;
                  for l = mi : ma
                        b(l−mi+1) = b(l−mi+1) + xs(j)*gen(xp(j)−l);
                  end
            end
end
```

```
-continued
% calculation of the matrix T:
        T=zeros(xp_max-xp_min+1+2*S,xp_max-xp_min+1+2*S);
        for j=1:J
                mi=ceil (xp(j))-S;
                ma=floor (xp(j) )+S;
                for k =mi : ma
                        for l=ma : ma
                                T(k-mi+1,l-mi+1) = T(k-mi+1,l-mi+1) + gen(xp(j)-
                                l)*gen(xp(j)-l);
                        end
                end
        end
%       calculation of the coefficients
        c_part = chol(T,b);        % solving the system T*c_part=b with a
                                   % banded Cholesky algorithm
        c(xp_min-S:xp_max+S) = c(xp_min-S:xp_max+S) + c_part;
        n(xp_min-S :xp_max+S) = n(xp_min-S:xp_max+S) + ones(xp_max-
xp_min+1+2*S);
                %n . . . normalization of coefficients because of overlapping
end
c = c ./ n;         %normalization of coefficients because of overlapping
% calculation of the reconstruction
for i = 1            :          length(x_rec)
        for j = floor(x_rec(i)-S)           :          ceil(x_rec(i)+S)          % |x_rec-j| <= S
                f_rec(x_rec(i)) = f_rec(x_rec(i)) + gen(x_rec(i)-j) * c(j);
        end
end
```

While this exemplary code is written in C language, it can be written in other languages such as Fortran, Pascal, C++, or the like so long as it can be executed by at least one computer such as Computer 8.

While there has been shown various embodiments of the present invention, it is to be understood that certain changes can be made in the form and arrangement of the elements of the system and steps of the methods to practice the present invention as would be known to one skilled in the art without departing from the underlying scope of the invention as is particularly set forth in the claims. Furthermore, the embodiments described above are only intended to illustrate the principles of the present invention and are not intended to limit the claims to the disclosed elements.

LIST OF REFERENCES

[1] A. ALDROUBI, *Non-Uniform Weighted Average Sampling and Exact Reconstruction in Shift-Invariant Spaces*, preprint, 2001.

[2] A. ALDROUBI, *Portraits of frames*, Proc. Amer. Math. Soc., 123 (1995), pp. 1661-1668.

[3] A. ALDROUBI, *Oblique projections in atomic spaces*, Proc. Amer. Math. Soc., 124 (1996), pp. 2051-2060.

[4] A. ALDROUBI AND H. FEIGHTINGER. *Exact iterative reconstruction algorithm for multivariate irregularly sampled functions in spline-like spaces*: The L~theory, Proc. Amer. Math. Soc., 126 (1998), pp. 2677-2686.

[5] A. ALDROUBI AND K. GRÖCHENIG, *Nonuniform sampling and reconstruction in shift variant space*, SIAM Rev. 43 (2001), No. 4, pp. 585-620.

[6] A. ALDROUBI. Q. SUN AND W. S. TANG, *p-frames and shift invariant spaces of LP*, J. Fourier Anal. Appl., 7 (2001), pp. 1-21.

[7] A. ALDROUBI AND M. UNSER. *Families of wavelet transforms in connection with Shannon's sampling theory and the Gabor transform, in Wavelets*: A Tutorial in Theory and Applications. C. K. Chul. ed., Academic Press. San Diego, Calif., 1992, pp. 509-528.

[8] A. ALDROUBI AND M. UNSER, *Families of multiresolution and wavelet spaces with optimal properties*, Numer. Funct. Anal. Optim., 14 (1993), pp. 417-446.

[9] A. ALDROUBI AND M. UNSER, *Sampling procedure in function spaces and asymptotic equivalence with Shannon's sampling theory*, Numer. Funct. Anal. Optim., 15 (1994), pp. 1-21.

[10] A. ALDROUBI. M. UNSER AND M. EDEN, *Asymptotic properties of least square spline filters and application to multi-scale decomposition of signals*, in Proceedings of the International Conference on Information Theory and Its Applications, Waikiki, Hi., 1990, pp. 271-274.

[11] A. ALDROUBI. M. UNSER AND M. EDEN, *Cardinal spline filters: Stability and convergence to the ideal sinc interpolator*, Signal Processing, 28 (1992), pp. 127-138.

[12] R. BALAN, *Equivalence relations and distances between Hilbert frames*, Proc. Amer. Math. Soc., 127 (1999), pp. 2353-2366.

[13] E. BELLER AND G. DE HAAN, *New algorithms for motion estimation on interlaced video*, in Proc. SPIE-Visual Communication and Image Processing, 3309 (1998), pp. 111-121.

[14] J. J. BENEDETTO, *Irregular sampling and frames*, in Wavelets: A Tutorial in Theory and Applications. C. K. Chui, ed., Academic Press. San Diego, Calif., 1992, pp. 445-507.

[15] J. J. BENEDETTO, *Frame decompositions, sampling, and uncertainty principle inequalities*, in Wavelets-Mathematics and Applications, J. J. Benedetto and M. W. Frazier, eds., CRC, Boca Raton, Fla., 1993, pp. 247-304.

[16] J. J. BENEDETTO AND P. J. S. G. FERREIRA, *Modern Sampling Theory*, Birkhäuser, Boston, 2000.

[17] J. J. BENEDETTO AND M. W. FRAZIER. ED., *Wavelets-Mathematics and Applications*, CRC, Boca Raton, Fla., 1993.

[18] J. J. BENEDETTO, C. HEIL. AND D. F. WALNUT, *Gabor systems and the Ealian-Low theorem*, in Gabor Analysis and Algorithms, H. G. Feichtinger and T. Strohmer, eds., Birkhäuser, Boston, 1998, pp. 85-122.

[19] J. J. BENEDETTO AND S. Li, *The theory of multiresolution frames and applications to filter banks*, Appl. Comput. Harmon. Anal., 5 (1998), pp. 389-427.

[20] J. J. BENEDETTO AND D. WALNUT, *Gabor frames of $L^2$ and related spaces*, in Wavelets-Mathematics and Applications, J. J. Benedetto and M W. Frazier, eds., CRC, Boca Raton, Fla., 1993, pp. 247-304.

[21] J. J. BENEDETTO AND H.-C. Wu, *Non-uniform sampling and spiral MRI reconstruction*, in Proc. SPIE-Wavelet Applications in Signal and Image Processing VIII, 4119 (2000), pp. 130-141.

[22] C. A. BERNSTEIN AND E. V. PATRICK, *Exact deconvolution for multiple convolution operators-an overview, plus performance characterizations for imaging sensors*, in Proceedings in Multidimensional Signal Processing, IEEE, Piscataway, N.J., 1990, pp. 723-734.

[23] A. BEURLING, *The Collected Works of Arne Beurling. Vol. 1, Complex Analysis*, L. Carleson, P. Malliavin, J. Neuberger, and J. Wermer, eds., Birkhäuser, Boston, 1989.

[24] A. BEURLING, *The Collected Works of Arne Beurling. Vol. 2, Harmonic Analysis*, L. Carleson, P. Malliavin, J. Neuberger, and J. Wermer, eds., Birkhäuser, Boston, 1989.

[25] A. BEURLING AND P. MALLIAVIN, *On the closure of characters and the zeros of entire functions*, Acta Math., 118 (1967), pp. 79-93.

[26] T. BLU AND M. UNSER, *Quantitative Fourier analysis of approximation techniques: Part I—interpolators and projectors*, IEEE Trans. Signal Process., 47 (1999), pp. 2783-2795.

[27] P. L. BUTZER, *A survey of the Whittaker-Shannon sampling theorem and some of its extensions*, J. Math. Res. Exposition, 3 (1983), pp. 185-212.

[28] P. G. CASAZZA AND O. CHRISTENSEN, *Frames containing a Riesx basis and preservation of this property under perturbations*, SIAM J. Math. Anal., 29 (1998), pp. 266-278.

[29] P. CASAZZA, D. RAN AND D. LARSON, *Frames for Banach spaces*, in The Functional and Harmonic Analysis of Wavelets and Frames, Contemp. Math. 247, AMS, Providence, R.I., 1999, pp. 149-182.

[30] W. CHEN, S. ITOH AND J. SHIKI, *Irregular sampling theorems for wavelet subspaces*, IEEE Trans. Inform. Theory, 44 (1998), pp. 1131-1142.

[31] O. CHRISTENSEN, *Moment problems for frames and applications to irregular sampling and Gabor frames*, Appl. Comput. Harmon. Anal., 3 (1996), pp. 82-86.

[32] C. K. CHUI, ED., *Wavelets: A Tutorial in Theory and Applications*, Academic Press, San Diego, Calif., 1992.

[33] I. DAUBEGHIES, *Ten Lectures on Wavelets*, SIAM, Philadelphia, 1992.

[34] C. DE BOOR, R. DEVORE AND A. RON, *The structure of finitely generated shift-invariant spaces in $L_2(R^d)$*, J. Funct. Anal., 119 (1994), pp. 37-78.

[35] C. DE BOOR AND R. DEVORE, *Partition of unity and approximation*, Proc. Amer. Math. Soc., 93 (1985), pp. 705-709.

[36] R. A. DEVORE, B. JAWERTH AND B. J. LUCIER, *Image compression through wavelet transform coding*, IEEE Trans. Inform. Theory, 38 (1992), pp. 719-746.

[37] I. DJOKOVIC AND P. P. VAIDYANATHAN, *Generalized sampling theorems in multiresolution subspaces*, IEEE Trans. Signal Process., 45 (1997), pp. 583-599.

[38] Y. DOMAR, *Harmonic analysis based on certain commutative Banach algebras*, Acta Math., 96 (1956), pp. 1-66.

[39] C. C. DONOVAN, J. S. GERONIMO AND D. P. HARDIN, *Intertwining multiresolution analyses and the construction of piecewise-polynomial wavelets*, SIAM J. Math. Anal., 27 (1996), pp. 1791-1815.

[40] R. J. DUFFIN AND A. C. SCHAEFFER, *A class of nonharmonic Fourier series*, Trans. Amer. Math. Soc., 72 (1952), pp. 341-3[66].

[41] H. G. FEICHTINGER, *Gewichtsfunktionen auf lokalkompakten Gruppen*, Sitzber. d. Österr. Akad. Wiss., 188 (1979), pp. 451-471.

[42] H. G. FEICHTINGER, *Banach convolution algebras of Wiener type*, in Functions, Series, Operators, Vols. I, H (Budapest, 1980), North-Holland, Amsterdam, 1983, pp. 509-524.

[43] H. G. FEICHTINGER, *Generalized amalgams, with applications to Fourier transform*, Canad. J. Math., 42 (1990), pp. 395-409.

[44] H. G. FEICHTINGER, *New results on regular and irregular sampling based on Wiener amalgams*, in Proc. Conf. Function Spaces, K. Jarosz, ed., Lecture Notes in Math. 136, Springer-Verlag, New York, 1991, pp. 107-121.

[45] H. G. FEICHTINGER, *Wiener amalgams over Euclidean spaces and some of their applications*, in Proc. Conf. Function Spaces. K. Jarosz, ed., Lecture Notes in Math. 136, Springer-Verlag, New York, 1991, pp. 123-137.

[46] H. G. FEICHTINGER AND K. GRÖCHENIG, *Banach spaces related to integrable group representations and their atomic decompositions*, I, J. Funct. Anal., 86 (1989), pp. 307-340.

[47] H. G. FEICHTINGER AND K. GRÖCHENIG, *Iterative reconstruction of multivariate band-limited functions from irregular sampling values*, SIAM J. Math. Anal., 23 (1992), pp. 244-261.

[48] H. G. FEICHTINGER AND K. GRÖCHENIG, *Theory and practice of irregular sampling*, in Wavelets-Mathematics and Applications. J. J. Benedetto and W. Frazier, eds., CRC, Boca Raton, Fla., 1993, pp. 305-363.

[49] H. G. FEICHTINGER. K. GRÖCHENIG, AND T. STROHMER, *Efficient numerical methods in non-uniform sampling theory*, Numer. Math., 69 (1995), pp. 423-440.

[50] H. G. FEICHTINGER AND T. STROHMER. EDS., *Gabor Analysis and Algorithms*, Birkhäuser, Boston, 1998.

[51] S. S. GOH AND I. G. H. ONG, *Reconstruction of band-limited signals from irregular samples*, Signal Process., 46 (1995), pp. 315-329.

[52] T. N. T. GOODMAN, S. L. LEE AND W. S. TANG, *Wavelet bases for a set of commuting unitary operators*, Adv. Comput. Math. 1 (1993), pp. 109-126.

[53] T. N. T. GOODMAN, S. L. LEE AND W. S. TANG, *Wavelet wandering subspaces*, Trans. Amer. Math. Soc., 338 (1993), pp. 639-654.

[54] K. GRÖCHENIG, *Describing functions: Atomic decompositions versus frames*, Monatsh. Math., 112 (1991), pp. 1-42.

[55] K. GRÖCHENIG, *Reconstruction algorithms in irregular sampling*, Math. Comp., 59 (1992), pp. 181-194.

[56] K. GRÖCHENIG, *Acceleration of the frame algorithm*, IEEE Trans. Signal Process., Special Issue on Wavelets and Signal Processing, 41 (1993), pp. 3331-3340.

[57] K. GRÖCHENIG, *Invertibility of the Frame Operator and Banach Frames*, preprint, 2001.

[58] K. GRÖCHENIG AND H. RAZAFINJATOVO, *On Landau's necessary density conditions for sampling and interpolation of band-limited functions*, J. London Math. Soc., 54 (1996), pp. 557-565.

[59] K. GRÖCHENIG AND T. STROHMER, *Numerical and theoretical aspects of non-uniform sampling of band-lim-*

[60] C. E. HEIL AND D. F. WALNUT, *Continuous and discrete wavelet transforms*, SIAM Rev., 31 (1989), pp. 628-666.

[61] J. R. HIGGINS, *Five short stories about the cardinal series*, Bull. Amer. Math. Soc., 121 (1985), pp. 45-89.

[62] J. R. HIGGINS, *Sampling theory for Paley-Wiener spaces in the Riesz basis settings*, Proc. Roy. Irish Acad. Sect., 2 (1994), pp. 219-235.

[63] H. S. Hou AND H. C. ANDREWS, *Cubic splines for image interpolation and digital filtering*, IEEE Trans. Acoust. Speech Signal Process. 26 (1978), pp. 508-517.

[64] A. J. E. M. JANSSEN, *The Zak transform and sampling theorems for wavelet subspaces*, IEEE Trans. Signal Process., 41 (1993), pp. 3360-3364.

[65] A. JERRI, *The Shannon sampling theorem-its various extensions and applications: A tutorial review*, Proc. IEEE, 65 (1977), pp. 1565-1596.

[66] K. JETTER AND J. STÖCKLER, *Topics in scattered data interpolation and non-uniform sampling*, in Surface Fitting and Multiresolution Methods, A. Le Mehautee, C. Rabut, and L. L. Schumaker, eds., Vanderbilt University Press, Nashville, Tenn., 1997, pp. 191-207.

[67] R.-Q. JIA, *Shift-invariant spaces and linear operator equations*, Israel Math. J., 103 (1998), pp. 259-288.

[68] R.-Q. JIA, *Stability of the shifts of a finite number of functions*, J. Approx. Theory, 95 (1998), pp. 194-202.

[69] R.-Q. JIA AND C. A. MICCHELLI, *On linear independence of integer translates of a finite number of functions*, Proc. Edinburgh Math. Soc., 36 (1992), pp. 69-85.

[70] P. JORGENSEN, *A geometric approach to the cascade approximation operator for wavelets*, Integral Equations Operator Theory, 35 (1999), pp. 125-171.

[71] M I. KADEG, *The exact value of the Paley-Wiener constant*, Soviet Math. Dokl., 5 (1964), pp. 559-561.

[72] H. P. KRAMER, *A generalized sampling theorem*, J. Math. Phys., 38 (1959), pp. 68-72.

[73] H. LANDAU, *A sparse regular sequence of exponentials closed on large sets*, Bull. Amer. Math. Soc., 70 (1964), pp. 566-569.

[74] H. LANDAU, *Necessary density conditions for sampling and interpolation of certain entire functions*, Acta Math., 117 (1967), pp. 37-52.

[75] S. Li, *Iterative Irregular Sampling and Useful Irregular Sampling Conditions*, preprint.

[76] Y. Liu, *Irregular sampling for spline wavelet subs paces*, IEEE Trans. Inform. Theory, 42 (1996), pp. 623-627.

[77] Y. Liu AND G. G. WALTER, *Irregular sampling in wavelet subs paces*, J. Fourier Anal. Appl., 2 (1996), pp. 181-189.

[78] Y. LYUBARSKII AND W. R. MADYCH, *The recovery of irregularly sampled band limited junctions via tempered splines*, J. Funct. Anal., 125 (1994), pp. 201-222.

[79] Y. LYUBARSKII AND K. SEIP, *Convergence and summability of Gabor expansions at the Nyqyuist density*, J. Fourier Anal. Appl., 5 (1999), pp. 127-157.

[80] S. MALLAT, *Multiresolution approximations and wavelet orthonormal bases of $L^2(R)$*, Trans. Amer. Math. Soc., 315 (1989), pp. 69-97.

[81] S. MALLAT, *A theory for multiresolutiori signal decomposition: The wavelet representation*, IEEE Trans. PAMI, 11 (1989), pp. 674-693.

[82] S. MALLAT, *A Wavelet Tour*, Academic Press, New York, 1996.

[83] Y. MEYER, *Ondelettes et Opérateurs*, Hermann, Paris, France, 1990.

[84] M. Z. NASHED AND G. G. WALTER, *General sampling theorems for functions in reproducing kernel Hilbert spaces*, Math. Control Signals Systems, 4 (1991), pp. 363-390.

[85] J. P. OAKLEY, M. J. CUNNINGHAM AND G. LITTLE, *A Fourier-domain formula for the least squares projection of a function onto a repetitive basis in N-dimensional space*, IEEE Trans. Acoust. Speech Signal Process., 38 (1990), pp. 114-120.

[86] J. L. OSTUNI, A. K. S. SANTHA AND, V. S. MATTAY, D. R. WEINBERGER, R. L. LEVIN AND J. A. FRANK, *Analysis of interpolation effects in the reslicing of functional MR-Images*, J. Computer Assisted Tomography, 21 (1997), pp. 803-810.

[87] R. E. A. C. PALEY AND N. WIENER, *Fourier transform in the complex domain*, in Amer. Math. Soc. Colloq. Publ., AMS, Providence, R.I., 1934.

[88] A. PAPOULIS, *Generalized sampling expansions*, Circuits Systems, 24 (1977), pp. 652-654.

[89] B. S. PAVLOV, *The basis property of a system of exponential.s and the condition of Muckenhoupt*, Dokl. Akad. Nauk SSSR, 247 (1979), pp. 37-40.

[90] D. POTTS AND C. STEIDL, *New Fourier reconstruction algorithms for computerized tomography*, in Proc. Wavelet Applications in Signal and Image Processing VIII, 4199 (2000), pp. 13-23.

[91] H. REITER, *Classical Harmonic Analysis and Locally Compact Groups*, Oxford Univ. Press, Oxford, UK, 1968.

[92] M. RAUTH AND T. STROHMER, *Smooth approximation of potential fields from noisy scattered data*, Geophysics, 63 (1998), pp. 85-94.

[93] K. SKIP, *An irregular sampling theorem for functions bandlemeted en a generalezed sense*, SIAM J. Appl. Math., 47 (1987), pp. 1112-1116.

[94] K. SKIP, *On the connection between exponential bases and certain related sequences in $L^2(-\pi, \pi)$*, J. Funct. Anal., 130 (1995), pp. 131-160.

[95] I. W. SELESNICK, *Interpolating multiwavelet and the sampling theorem*, IEEE Trans. Signal Process., 46 (1999), pp. 2898-2908.

[96] C. E. SHANNON, *Communications in the presence of noise*, Proc. IRE, 37 (1949), pp. 10-21.

[97] J. STÖCKLER, *Multivariate Affine Frames*, Shaker Verlag, Aachen, Germany, 1998.

[98] G. STRANG, *The finite element method and approximation theory*, in Proc. Sympos. Numerical Solution of Partial Differential Equations, Academic Press, New York, 11(1971), pp. 547-583.

[99] G. STRANG, *Wavelets and dilation equations: A brief introduction*, SIAM Rev., 31 (1989), pp. 614-627.

[100] G. STRANG AND T. NGUYEN, *Wavelets and Filter Banks*, Wellesley-Cambridge Press, Wellesley, Mass., 1996.

[101] T. STROHMER, *Numerical analysis of the non-uniform sampling problem*, J. Comput. Appi. Math., 122 (2000), pp. 297-316.

[102] W. SUN AND X. ZHOU, *On the stability of multivariate trigonometric systems*, J. Math. Anal. Appl., 235 (1999), pp. 159-167.

[103] P. THÉVENAZ, T. BLU, AND M. UNSER, *Image interpolation and resampling*, in Handbook of Medical Image Processing, Processing and Analysis, I. N. Bankman, ed., Academic Press, San Diego, Calif. 2000, pp. 393-420.

[104] C. THOMAS, *A comparison of motion-compensated interlace-to-progressive conversion methods*, Image Communication, 12 (1998), pp. 209-229.

[105] M. UNSER AND A. ALDROUBI, *Polynomial splines and wavelets-a signal processing perspective*, in Wavelets: A Tutorial in Theory and Applications, C. K. Chui, ed., Academic Press, San Diego, Calif., 1992, pp. 543-601.

[106] M. UNSER AND A. ALDROUBI, *Ceneralized sampling with application to the wavelet transform*, in Proceedings of the Conference on Information Sciences and Systems, The Johns Hopkins University Press, Baltimore, Md., 1993.

[107] M. UNSER AND A. ALDROUBI, *A general sampling theory for non-ideal acquisition devices*, IEEE Trans. Signal Process., 42 (1994), pp. 2915-2925.

[108] M. UNSER, A. ALDROUBI, AND M. EDEN, *A sampling theory for polynomial splines*, in Proceedings of the International Conference on Information Theory and Its Applications, Waikiki, Hi., 1990, pp. 279-282.

[109] M. UNSER, A. ALDROUBI, AND M. EDEN, *Polynomial spline signal approximations: Filter design and asymptotic equivalence with Shannon's sampling theorem*, IEEE Trans. Image Process., 38 (1992), pp. 95-103.

[110] M. UNSER AND J. ZERUBIA, *A generalized sampling theory without bandlimiting constraints*, Trans. Circuits and Systems-II: Analog and Digital Signal Processing, 45 (1998), pp. 959-969.

[111] R. VIO, T. STROHMER. AND W. WAMSTEKER. *On the reconstruction of irregularly sampled time series*. Publ. Astronom. Soc. Pac., 112 (2000), pp. 74-90.

[112] D. WALUNT, *Nonperiodic sampling of bandlimited functions on union of rectangular*, J. Fourier Anal. Appl., 2 (1996), pp. 436-451.

[113] G. G. WALTER, *A sampling theorem for wavelet subspaces*, IEEE Trans. Inform. Theory, 38 (1992), pp. 881-884.

[114] J. M. WHITTAKER, *Interpolatory Function Theory*, Cambridge University Press, London, 1935.

[115] X. G. XIA, J. S. CERONIMO, D. P. HARDIN AND B. W. SUTTER, *Design of prefilters for discrete multiwavelet transforms*, IEEE Trans. Signal Process., 44 (1996), pp. 25-35.

[116] X.G. XIA AND Z.Z. ZHANG, *On sampling theorem, wavelets, and wavelet transforms*, IEEE Trans. Signal Process., 41(1993), pp. 3524-3535.

[117] K. YAO, *Applications of reproducing kernel Hilbert spaces-bandlimited signal models*, Inform. and Control, 11 (1967), pp. 429-444.

[118] R. M. YOUNG, *An Introduction to Nonharmonic Fourier Series*, Academic Press, New York, 1980.

[119] X. ZHOU AND W. SUN, *On the sampling theorem for wavelet subspaces*, J. Fourier Anal. Appl., 5 (1999), pp. 347-354.

[120] A. ALDROUBI AND K. GROCHENIG, *Beurling-Landau-type theorems for non-uniform sampling in shift invariant spline spaces*, J. Fourier Anal. Appl. 6 (2000), pp. 93-103.

[121] M. D. BUHMANN, *Radial basis functions*, Acta numerica, (2000) Cambridge Univ. Press, Cambridge, pp. 1-38.

[122] P. CRAVEN AND GRACE WAHBA, *Smoothing noisy data with spline functions. Estimating the correct degree of smoothing by the method of generalized cross-validation*, Numer. Math. 31, (1978/79), pp. 377-403

[123] S. DEMKO, W. F. Moss AND P. W. SMITH, *Decay rates for inverses of band matrices*, Math. Comp. 43 (1984), pp. 491-499.

[124] G. H. GOLUB AND C. F. VAN LOAN, *Matrix computations*, third ed., Johns Hopkins Universtiy Press, Baltimore, Md. (1996)

[125] M. F. HUTCHINSON AND F. R. DEHOOG, *Smoothing noisy data with spline functions*, Numer. Math., 47 (1985), pp. 99-106

[126] S. JAFFARD, *Propriétés des matrices "bien localisées" près de leur diagonale et quelques applications*, Ann. Inst. H. Poincaré Anal. Non Liéaire, 7, (1990), pp. 461-476

[127] L. L. SCHUMAKER, *Spline functions: basic theory*, John Wiley & Sons Inc., New York, 1981, Pure and Applied Mathematics, A Wiley-Interscience Publication.

[128] G. WAHBA, *Spline models for observational data*, Society for Industrial and Applied Mathematics SIAM, Philadelphia, Pa. (1990)

What is claimed is:

1. A method for recovering information about an object of interest $f$ from a data set $\{f(x_j)\}$ obtained from nonuniform data sample points $x_j \in X$, j being an indexing number, X representing the set of points where the object of interest $f$ is sampled, comprising the steps of:
   a. selecting data $f(x_j)$ from the data set $\{f(x_j)\}$;
   b. constructing an approximation operator $Q_X$;
   c. applying the approximation operator $Q_X$ to the data $f(x_j)$ to obtain an approximation $Q_X f(x_j)$;
   d. constructing a projection operator P;
   e. applying the projection operator P to the approximation $Q_X f(x_j)$ to obtain a first approximations $f_1 = P\ Q_X f(x_j)$;
   f. obtaining an error $e = f(x_j) - f_1$;
   g. applying the projection operator P to the error e to obtain a first approximation of error $e_1 = P\ e$;
   h. obtaining a second approximations $f_2 = f_1 + e_1$;
   i. returning to step (e) until a sequence $f_n = f_1 + e_1 + e_2 + e_3 + AAA + e_{n-1}$ is obtained, wherein function $f_n$ converges to the object of interest $f$; and
   j. outputting the obtained sequence $f_n$, wherein the outputting step comprises at least one step of:
      (A) displaying the obtained sequence $f_n$ in a display with a GUI;
      (B) storing the obtained sequence $f_n$ in the computer readable medium, a memory device, or a network device;
      (C) transmitting the obtained sequence $f_n$ over network to a network device; and
      (D) printing the obtained sequence $f_n$ in a printer.

2. The method of claim 1, wherein the approximation operator $Q_X$ comprises an interpolation operator.

3. The method of claim 2, wherein the interpolation operator provides piecewise linear interpolation.

4. The method of claim 2, wherein the approximation operator $Q_X$ comprises a quasi-interpolation operator.

5. The method of claim 4, wherein the quasi-interpolation operator provides step-wise approximation.

6. The method of claim 1, wherein the projection operator P comprises a bounded projection.

7. The method of claim 1, wherein the projection operator P comprises a universal projection.

8. The method of claim 1, wherein the data set $\{f(x_j)\}$ comprises a plurality of digital data related to sound.

9. The method of claim 1, wherein the data set $\{f(x_j)\}$ comprises a plurality of digital data related to at least one image.

10. The method of claim 9, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

11. The method of claim 1, wherein the data set $\{f(x_j)\}$ comprises a plurality of biological data.

12. The method of claim 11, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

13. The method of claim 1, wherein the data set $\{f(x_j)\}$ comprises a plurality of data from at least one measurement of the object of the interest.

14. The method of claim 13, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

15. The method of claim 1, wherein the data set $\{f(x_j)\}$ comprises a plurality of data related to time dependent signals.

16. A system for recovering information about an object of interest $f$ from a data set $\{f(x_j)\}$ obtained from nonuniform data sample points $x_j \in X$, j being an indexing number, X representing the set of points where the object of interest $f$ is sampled, comprising:

(i). an input device for receiving the information in the data set $\{f(x_j)\}$; and (ii). a processor communicating to the input device and performing the steps of:
 a. selecting data $ff(x_j)$ from the data set $\{f(x_j)\}$;
 b. constructing an approximation operator $Q_X$;
 c. applying the approximation operator $Q_X$ to the data $f(x_j)$ to obtain an approximation $Q_X f(x_j)$;
 d. constructing a projection operator P;
 e. applying the projection operator P to the approximation $Q_X f(x_j)$ to obtain a first approximation $f_1 = PQ_X f(x_j)$;
 f. obtaining an error $e = f(x_j) - f_1$;
 g. applying the projection operator P to the error e to obtain a first approximation of error $e_1 = P e$;
 h. obtaining a second approximation $f_2 = f_1 + e_1$;
 i. returning to step (e) until a sequence $f_n = f_1 + e_1 + e_2 + e_3 + AAA + e_{n-1}$ is obtained, wherein function $f_n$ converges to the object of interest $f$; and
 j. outputting the obtained sequence $f_n$, wherein the outputting step comprises at least one step of;
  (A) displaying the obtained sequence $f_n$ in a display with a graphic-user interface (GUI);
  (B) storing the obtained sequence $f_n$ in the computer readable medium, a memory device, or a network device;
  (C) transmitting the obtained sequence $f_n$ over network to a network device; and
  (D) printing the obtained sequence $f_n$ in a printer.

17. The system of claim 16, wherein the approximation operator $Q_X$ comprises an interpolation operator.

18. The system of claim 17, wherein the interpolation operator provides piecewise linear interpolation.

19. The system of claim 17, wherein the approximation operator $Q_X$ comprises a quasi-interpolation operator.

20. The system of claim 19, wherein the quasi-interpolation operator provides step-wise approximation.

21. The system of claim 16, wherein the projection operator P comprises a bounded projection.

22. The system of claim 16, wherein the projection operator P comprises a universal projection.

23. The system of claim 16, wherein the processor comprises a microprocessor.

24. The system of claim 16, wherein the input device comprises at least one device selected from the group of a processor interface, a GUI, a scanner, a CD-ROM, a diskette, a computer coupled to a network, and a networking device.

25. The system of claim 16, further comprising an output device coupled to the processor for receiving the obtained sequence.

26. The system of claim 25, wherein the output device comprises at least one device selected from the group of a GUI, a printer, a CD-ROM, a diskette, a memory device, a computer coupled to a network, and a networking device.

27. The system of claim 16, wherein the data set $\{f(x_j)\}$ comprises a plurality of digital data related to sound.

28. The system of claim 16, wherein the data set $\{f(x_j)\}$ comprises a plurality of digital data related to at least one image.

29. The system of claim 28, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

30. The system of claim 16, wherein the data set $\{f(x_j)\}$ comprises a plurality of biological data.

31. The system of claim 30, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

32. The system of claim 16, wherein the data set $\{f(x_j)\}$ comprises a plurality of data from at least one measurement of the object of the interest.

33. The system of claim 32, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

34. The system of claim 16, wherein the data set $\{f(x_j)\}$ comprises a plurality of data related to time dependent signals.

35. A method for recovering information about an object of interest $f$ from a data set $\{f(x_j)\}$ obtained from nonuniform data sample points $x_j \in X$, j being an indexing number, X representing the set of points where the object of interest $f$ is sampled in presence of noise, comprising:

a. selecting data $f_j'$ from the data set $\{f_j' = f(x_j) + \eta_j\}$, wherein $\eta_j$ represents a corresponding noise component;
 b. constructing an initialization function $f'$ as the summation of function $f_j': f' = 3_{Q,j} f_j' \beta_j$, wherein $\beta_j$ represents the jth component of a partition of unity;
 c. constructing an approximation operator $Q_X$;
 d. applying the approximation operator $Q_X$ to the function $f'$ to obtain an approximation $Q_X f'$;

e. constructing a projection operator P;
f. applying the projection operator P to the approximation $Q_X f'$ to obtain a first approximation $f_1 = P\, Q_X f'$;
g. obtaining an error $e = f - f_1$;
h. applying the projection operator P to the error e to obtain a first approximation of error $e_1 = P\, e$;
i. obtaining a second approximation $f_2 = f_1 + e_1$;
j. returning to step (f) until a sequence $f_n = f_1 + e_1 + e_2 + e_3 + AAA + e_{n-1}$ is obtained, wherein function $f_n$ converges to a function $f$ that adequately describes the object of interest $f$; and
k. outputting the obtained sequence $f_n$, wherein the outputting step comprises at least one step of:
   (A) displaying the obtained sequence $f_n$ in a display with a graphic-user interface (GUI);
   (B) storing the obtained sequence $f_n$ in the computer readable medium, a memory device, or a network device;
   (C) transmitting the obtained sequence $f_n$ over network to a network device; and
   (D) printing the obtained sequence $f_n$ in a printer.

36. The method of claim 35, wherein the approximation operator $Q_X$ comprises an interpolation operator.

37. The method of claim 36, wherein the interpolation operator provides piecewise linear interpolation.

38. The method of claim 35, wherein the approximation operator $Q_X$ comprises a quasi-interpolation operator.

39. The method of claim 38, wherein the quasi-interpolation operator provides step-wise approximation.

40. The method of claim 35, wherein the projection operator P comprises a bounded projection.

41. The method of claim 35, wherein the projection operator P comprises a universal projection.

42. The method of claim 35, wherein the function $f_\infty$ satisfies the relationship of $P\, Q_X f_\infty = P\, Q_X \{f_j'\}$.

43. The method of claim 35, wherein the data set $\{f(x_j)\}$ comprises a plurality of digital data related to sound.

44. The method of claim 35, wherein the data set $\{f(x_j)\}$ comprises a plurality of digital data related to at least one image.

45. The method of claim 44, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

46. The method of claim 35, wherein the data set $\{f(x_j)\}$ comprises a plurality of biological data.

47. The method of claim 46, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

48. The method of claim 35, wherein the data set $\{f(x_j)\}$ comprises a plurality of data from at least one measurement of the object of the interest.

49. The method of claim 48, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

50. The method of claim 35, wherein the data set $\{f(x_j)\}$ comprises a plurality of data related to time dependent signals.

51. A system for recovering information about an object of interest $f$ from a data set $\{f(x_j)\}$ obtained from nonuniform data sample points $x_j \in X$, j being an indexing number, X representing the set of points where the object of interest $f$ is sampled in presence of noise, comprising:
(i). an input device for receiving the information in the data set $\{f(x_j)\}$; and
(ii). a processor communicating to the input device and performing the steps of:
   a. selecting data $f_j'$ from the data set $\{f_j' = f(x_j) + \eta_j\}$, wherein $\eta_j$ represents a corresponding noise component;
   b. constructing an initialization function $f'$ as the summation of function $f_j': f' = \Sigma_{j \in J} f_j' \beta_j$, wherein $\beta_j$ represents the jth component of a partition of unity;
   c. constructing an approximation operator $Q_X$;
   d. applying the approximation operator $Q_X$ to the function $f'$ to obtain an approximation $Q_X f'$;
   e. constructing a projection operator P;
   f. applying the projection operator P to the approximation $Q_X f'$ to obtain a first approximation $f_1 = P\, Q_X f'$;
   g. obtaining an error $e = f - f_1$;
   h. applying the projection operator P to the error e to obtain a first approximation of error $e_1 = P\, e$;
   i. obtaining a second approximation $f_2 = f_1 + e_1$;
   j. returning to step (f) until a sequence $f_n = f_1 + e_1 + e_2 + e_3 + AAA + e_{n-1}$ is obtained, wherein function $f_n$ converges to a function $f_\infty$ that adequately describes the object of interest $f$; and
   k. outputting the obtained sequence $f_n$, wherein the outputting step comprises at least one step of:
      (A) displaying the obtained sequence $f_n$ in a display with a graphic-user interface (GUI);
      (B) storing the obtained sequence $f_n$ in the computer readable medium, a memory device, or a network device;
      (C) transmitting the obtained sequence $f_n$ over network to a network device; and
      (D) printing the obtained sequence $f_n$ in a printer.

52. The system of claim 51, wherein the approximation operator $Q_X$ comprises an interpolation operator.

53. The system of claim 52, wherein the interpolation operator provides piecewise linear interpolation.

54. The system of claim 51, wherein the approximation operator $Q_X$ comprises a quasi-interpolation operator.

55. The system of claim 54, wherein the quasi-interpolation operator provides step-wise approximation.

56. The system of claim 51, wherein the projection operator P comprises a bounded projection.

57. The system of claim 51, wherein the projection operator P comprises a universal projection.

58. The system of claim 51, wherein the function $f_\infty$ satisfies the relationship of $P Q_X f_\infty = P Q_X \{f_j'\}$.

59. The system of claim 51, wherein the processor comprises a microprocessor.

60. The system of claim 51, wherein the input device comprises at least one device selected from the group of a processor interface, a GUI, a scanner, a CD-ROM, a diskette, a computer coupled to a network, and a networking device.

61. The system of claim 51, further comprising an output device coupled to the processor for receiving the obtained sequence $f_n$.

62. The system of claim 61, wherein the output device comprises at least one device selected from the group of a GUI, a printer, a CD-ROM, a diskette, a memory device, a computer coupled to a network, and a networking device.

63. The system of claim 51, wherein the data set $\{f_j'=f(x_j)+\eta_j\}$ comprises a plurality of digital data related to sound.

64. The system of claim 51, wherein the data set $\{f_j'=f(x_j)+\eta_j\}$ comprises a plurality of digital data related to at least one image.

65. The system of claim 64, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

66. The system of claim 51, wherein the data set $\{f_j'=f(x_j)+\eta_j\}$ comprises a plurality of biological data.

67. The system of claim 66, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

68. The system of claim 51, wherein the data set $\{f_j'=f(x_j)+\eta_j\}$ comprises a plurality of data from at least one measurement of the object of the interest.

69. The system of claim 68, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

70. The system of claim 51, wherein the data set $\{f_j'=f(x_j)+\eta_j\}$ comprises a plurality of data related to time dependent signals.

71. A method for recovering information about an object of interest $f$ from a data set of averages $\{<f, \psi_{x_j}>\}$ obtained from nonuniform data sample points $x_j \in X$, $j$ being an indexing number, $X$ representing the set of points where the object of interest $f$ is sampled, comprising the steps of:

a. selecting data $<f, \psi_{x_j}>$ from the data set $\{<f, \psi_{x_j}>\}$;
 b. constructing a quasi-reconstruction operator $A_X$ for obtaining a quasi-reconstruction $A_X f$ wherein $A_X f = 3_{j \in J} <f, \psi_{x_j}> \beta_j$, wherein $\beta_j$ represents the jth component of a partition of unity, and $\{\psi_{x_k} : x_j \in X\}$ is a set of functionals that act on $f$;
 c. constructing a projection operator P;
 d. applying the projection operator P to the quasi-reconstruction $A_X f$ to obtain a first approximation $f_1 = PA_X f$;
 e. obtaining an error $e = f - f_1$;
 f. applying the projection operator P and the quasi-reconstruction operator $A_X$ to the error e to obtain a first approximation of error $e_1 = P A_X e$;
 g. obtaining a second approximation $f_2 = f_1 + e_1$;
 h. returning to step (e) until a sequence $f_n = f_1 + e_1 + e_2 + e_3 + AAA + e_{n-1} = P A_X(f - f_{n-1}) + f_{n-1}$ is obtained, wherein function $f_n$ converges to the object of interest $f$; and
 i. outputting the obtained sequence $f_n$, wherein the outputting step comprises at least one step of:
  (A) displaying the obtained sequence $f_n$ in a display with a graphic-user interface (GUI);
  (B) storing the obtained sequence $f_n$ in the computer readable medium, a memory device, or a network device;
  (C) transmitting the obtained sequence $f_n$ over network to a network device; and
  (D) printing the obtained sequence $f_n$ in a printer.

72. The method of claim 71, wherein the data set of averages $\{<f, \psi_{x_j}>\}$ comprises a plurality of digital data related to sound.

73. The method of claim 71, wherein the data set of averages $\{<f, \psi_{x_j}>\}$ comprises a plurality of digital data related to at least one image.

74. The method of claim 73, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

75. The method of claim 71, wherein the data set of averages $\{<f, \psi_{x_j}>\}$ comprises a plurality of biological data.

76. The method of claim 75, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

77. The method of claim 71, wherein the data set of averages $\{<f, \psi_{x_j}>\}$ comprises a plurality of data from at least one measurement of the object of the interest.

78. The method of claim 77, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

79. The method of claim 71, wherein the data set of averages $\{<f, \psi_{x_j}>\}$ omprises a plurality of data related to time dependent signals.

80. A system for recovering information about an object of interest $f$ from a data set of averages $\{<f, \psi_{x_j}>\}$ obtained from nonuniform data sample points $x_j \in X$, $j$ being an indexing number, $X$ representing the set of points where the object of interest $f$ is sampled, comprising:

(i). an input device for receiving the information in the data set of averages $\{<f, \psi_{x_j}>\}$; and
 (ii). a processor communicating to the input device and performing the steps of:
  a. selecting data $<f, \psi_{x_j}>$ from the data set $\{<f, \psi_{x_j}>\}$;
  b. constructing a quasi-reconstruction operator $A_X$ for obtaining a quasi-reconstruction $A_X f$ wherein $A_X f = 3_{j \in J} <f, \psi_{x_j}> \beta_j$, wherein $\beta_j$ represents the jth component of a partition of unity, and $\{\psi_{x_j} : x_j \in X\}$ is a set of functionals that act on $f$;
  c. constructing a projection operator P;
  d. applying the projection operator P to the quasi-reconstruction $A_X f$ to obtain a first approximation $f_1 = PA_X f$;
  e. obtaining an error $e = f - f_1$;
  f. applying the projection operator P and the quasi-reconstruction operator $A_X$ to the error e to obtain a first approximation of error $e_1 = P A_X e$;
  g. obtaining a second approximation $f_2 = f_1 + e_1$;
  h. returning to step (e) until a sequence $f_n = f_1 + e_1 + e_2 + e_3 + AAA + e_{n-1} = P A_X(f - f_{n-1}) + f_{n-1}$ is obtained, wherein function $f_n$ converges to the object of interest $f$; and i. outputting the obtained sequence $f_n$, wherein the outputting step comprises at least one step of:
   (A) displaying the obtained sequence $f_n$ in a display with a graphic-user interface (GUI);
   (B) storing the obtained sequence $f_n$ in the computer readable medium, a memory device, or a network device;
   (C) transmitting the obtained sequence $f_n$ over network to a network device; and
   (D) printing the obtained sequence $f_n$ in a printer.

81. The system of claim 80, wherein the processor comprises a microprocessor.

82. The system of claim 80, wherein the input device comprises at least one device selected from the group of a processor interface, a GUI, a scanner, a CD-ROM, a diskette, a computer coupled to a network, and a networking device.

83. The system of claim 80, further comprising an output device coupled to the processor for receiving the obtained sequence $f_n$.

84. The system of claim 83, wherein the output device comprises at least one device selected from the group of a GUI, a printer, a CD-ROM, a diskette, a memory device, a computer coupled to a network, and a networking device.

85. The system of claim 80, wherein the data set of averages $\{<f, \psi_{x_j}>\}$ comprises a plurality of digital data related to sound.

86. The system of claim 80, wherein the data set of averages $\{<f, \psi_{x_j}>\}$ comprises a plurality of digital data related to at least one image.

87. The system of claim 86, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

88. The system of claim 80, wherein the data set of averages $\{<f, \psi_{x_j}>\}$ comprises a plurality of biological data.

89. The system of claim 88, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

90. The system of claim 80, wherein the data set of averages $\{<f, \psi_{x_j}>\}$ comprises a plurality of data from at least one measurement of the object of the interest.

91. The system of claim 90, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

92. The system of claim 80, wherein the data set of averages $\{<f, \psi_{x_j}>\}$ comprises a plurality of data related to time dependent signals.

93. A method for recovering information about an object of interest $f$ from a data set of averages $\{<f, \psi_{x_j}>\}$ obtained from nonuniform data sample points $x_j \in X$, j being an indexing number, X representing the set of points where the object of interest $f$ is sampled in presence of noise, comprising:

a. selecting data $f_j'$ from the data set $\{f_j'=<f,\psi_{x_j}>+\eta_j\}$, wherein $\eta_j$ represents a corresponding noise component;

b. constructing an initialization function $f'$ as the summation of function $f_j': f'=\Sigma_{j \in J} f_j' \beta_j$, wherein $\beta_j$ represents the jth component of a partition of unity;

c. constructing a quasi-interpolant operator $Q_X$;

d. applying the quasi-interpolant operator $Q_X$ to the function $f'$ to obtain an approximation $Q_X f'$;

e. constructing a projection operator P;

f. applying the projection operator P to the approximation $Q_X f'$ to obtain a first approximation $f_1 = P Q_X f'$;

g. obtaining an error $e = f - f_1$;

h. constructing a quasi-reconstruction operator $A_X$ for obtaining a quasi-reconstruction $A_X f$, wherein $A_X f = \Sigma_{j \in J} <f, \psi_{x_j}> \beta_j$, and $\{\psi_{x_j}: x_j \in X\}$ is a set of functionals that act on $f$;

i. applying the projection operator P and the quasi-reconstruction operator $A_X$ to the error e to obtain a first approximation of error $e_1 = P A_X e$;

j. obtaining a second approximation $f_2 = f_1 + e_1$;

k. returning to step (g) until a sequence $f_n = f_1 + e_1 + e_2 + e_3 + AAA + e_{n-1} = f_1 + (I - P A_X) f_{n-1}$ is obtained, wherein I is an unit operator and function $f_n$ converges to a function $f$ that adequately describes the object of interest $f$; and l. outputting the obtained sequence $f_n$, wherein the outputting step comprises at least one step of:
   (A) displaying the obtained sequence $f_n$ in a display with a graphic-user interface (GUI);
   (B) storing the obtained sequence $f_n$ in the computer readable medium, a memory device, or a network device;
   (C) transmitting the obtained sequence $f_n$ over network to a network device; and
   (D) printing the obtained sequence $f_n$ in a printer.

94. The method of claim 93, wherein the data set $\{f_j'=<f, \psi_{x_j}>+\eta_j\}$ comprises a plurality of digital data related to sound.

95. The method of claim 93, wherein the data set $\{f_j'=<f, \psi_{x_j}>+\eta_j\}$ comprises a plurality of digital data related to at least one image.

96. The method of claim 95, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

97. The method of claim 93, wherein the data set $\{f_j'=<f, \psi_{x_j}>+\eta_j\}$ comprises a plurality of biological data.

98. The method of claim 97, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

99. The method of claim 93, wherein the data set $\{f_j'=<f, \psi_{x_j}>+\eta_j\}$ comprises a plurality of data from at least one measurement of the object of the interest.

100. The method of claim 99, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

101. The method of claim 93, wherein the data set $\{f_j'=<f, \psi_{x_j}>+\eta_j\}$ comprises a plurality of data related to time dependent signals.

102. A system for recovering information about an object of interest $f$ from a data set of averages $\{<f,\psi_{x_j}>\}$ obtained from nonuniform data sample points $x_j \in X$, j being an indexing number, X representing the set of points where the object of interest $f$ is sampled in presence of noise, comprising:
   (i). an input device for receiving the information in the data set $\{f(x_j)\}$; and
   (ii). a processor communicating to the input device and performing the steps of:
      a. selecting data $f_j'$ from the data set $\{f_j'=<f,\psi_{x_j}>+\eta_j\}$, wherein $\eta_j$ represents a corresponding noise component;
      b. constructing an initialization function $f'$ as the summation of function $f_j': f'=3_{j\partial j}f_j'\beta_j$, wherein $\beta_j$ represents the jth component of a partition of unity;
      c. constructing a quasi-interpolant operator $Q_X$;
      d. applying the quasi-interpolant operator $Q_X$ to the function $f'$ to obtain an an approximation $Q_X f'$;
      e. constructing a projection operator P;
      f. applying the projection operator P to the approximation $Q_X f'$ to obtain a first approximation $f_1 = P Q_X f'$;
      g. obtaining an error $e=f-f_1$;
      h. constructing a quasi-reconstruction operator $A_X$ for obtaining a quasi-reconstruction $A_X f$ wherein $A_X f = 3_{j\partial j} <f,\psi_{x_j}>\beta_j$, and $\{\psi_{x_j}: x_j \in X\}$ is a set of functionals that act on $f(x_j)$;
      i. applying the projection operator P and the quasi-reconstruction operator $A_X$ to the error e to obtain a first approximation of error $e_1 = PA_X e$;
      j. obtaining a second approximation $f_2=f_1+e_1$;
      k. returning to step (h) until a sequence $f_n = f_1 + e_1 + e_2 + e_3 + AAA + e_{n-1} = f_1 + (I-PA_X)f_{n-1}$ is obtained, wherein I is an unit operator and function $f_n$ converges to a function $f_\infty$ that adequately describes the object of interest $f$; and
      l. outputting the obtained sequence $f_n$, wherein the outputting step comprises at least one step of:
         (A) displaying the obtained sequence $f_n$ in a display with a graphic-user interface (GUI);
         (B) storing the obtained sequence $f_n$ in the computer readable medium, a memory device, or a network device;
         (C) transmitting the obtained sequence $f_n$ over network to a network device; and
         (D) printing the obtained sequence $f_n$ in a printer.

103. The system of claim 102, wherein the processor comprises a microprocessor.

104. The system of claim 102, wherein the input device comprises at least one device selected from the group of a processor interface, a GUI, a scanner, a CD-ROM, a diskette, a computer coupled to a network, and a networking device.

105. The system of claim 102, further comprising an output device coupled to the processor for receiving the obtained sequence $f_n$.

106. The system of claim 105, wherein the output device comprises at least one device selected from the group of a GUI, a printer, a CD-ROM, a diskette, a memory device, a computer coupled to a network, and a networking device.

107. The system of claim 102, wherein the data set $\{f_j'=<f,\psi_{x_j}>+\eta_j\}$ comprises a plurality of digital data related to sound.

108. The system of claim 102, wherein the data set $\{f_j'=<f,\psi_{x_j}>+\eta_j\}$ comprises a plurality of digital data related to at least one image.

109. The system of claim 108, wherein the at least one image is one of a plurality of magnetic resonance image, a plurality of computerized tomography images, a plurality of optical image, a plurality of ultra sound images, a plurality of electronic images that are transmittable over a network, a plurality of satellite images, a plurality of three-dimensional images, a plurality of spectral images, a plurality of n-dimensional images with n being an integer greater than 1, or any combination of them.

110. The system of claim 102, wherein the data set $\{f_j'=<f,\psi_{x_j}>+\eta_j\}$ comprises a plurality of biological data.

111. The system of claim 110, wherein the plurality of biological data contain a plurality of data from the group of a plurality of biological data related to genes, a plurality of biological data related to proteins, a plurality of biological data related to cells, a plurality of biological data related to bacteria, or a plurality of biological data related to tissues.

112. The system of claim 102, wherein the data set $\{f_j'=<f,\psi_{x_j}>+\eta_j\}$ comprises a plurality of data from at least one measurement of the object of the interest.

113. The system of claim 112, wherein the at least one measurement is one of at least one astronomical measurement, at least one seismic measurement, at least one marine measurement, at least one geophysical measurement, at least one atmospheric measurement, at least one engineering measurement, at least one physical measurement, or at least one chemical measurement.

114. The system of claim 102, wherein the data set $\{f_j'=<f,\psi_{x_j}>+\eta_j\}$ comprises a plurality of data related to time dependent signals.

* * * * *

UNITED STATES PATENT AND TRADEMARK OFFICE
CERTIFICATE OF CORRECTION

| | |
|---|---|
| PATENT NO. | : 7,496,619 B2 |
| APPLICATION NO. | : 10/458475 |
| DATED | : February 24, 2009 |
| INVENTOR(S) | : Akram Aldroubi et al. |

It is certified that error appears in the above-identified patent and that said Letters Patent is hereby corrected as shown below:

Column 1, Line 13 to 16: "The present invention was made with Government support through a grant awarded by National Science Foundation. The United State government may have certain rights to this invention pursuant to the grant." should read --The present invention was made with Government support under a contract No. NSF DMS 0103104 awarded by National Institutes of Health. The United States Government has certain rights to this invention pursuant to the grant.--

Claim 1, column 54, line 46, after "in a printer" insert --if needed--;

Claim 16, column 55, line 61, after "in a printer" insert --if needed--;

Claim 35, column 57, line 21, after "in a printer" insert --if needed--;

Claim 51, column 58, line 42, after "in a printer" insert --if needed--;

Claim 71, column 60, line 3, after "in a printer" insert --if needed--;

Claim 80, column 61, line 10, after "in a printer" insert --if needed--;

Claim 93, column 62, line 32, after "in a printer" insert --if needed--; and

Claim 102, column 63, line 45, after "in a printer" insert --if needed--.

Signed and Sealed this

Fifth Day of January, 2010

David J. Kappos
*Director of the United States Patent and Trademark Office*